United States Patent
Ahn et al.

(10) Patent No.: US 10,840,127 B2
(45) Date of Patent: Nov. 17, 2020

(54) INTEGRATED CIRCUIT (IC) DEVICE

(71) Applicant: Samsung Electronics Co., Ltd., Suwon-si (KR)

(72) Inventors: Jun-hyeok Ahn, Hwaseong-si (KR); Myeong-dong Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/444,737

(22) Filed: Jun. 18, 2019

(65) Prior Publication Data

US 2020/0194302 A1   Jun. 18, 2020

(30) Foreign Application Priority Data

Dec. 12, 2018 (KR) .................. 10-2018-0160350

(51) Int. Cl.
    *H01L 21/762*    (2006.01)
    *H01L 21/768*    (2006.01)
    *H01L 27/108*    (2006.01)

(52) U.S. Cl.
    CPC .... *H01L 21/76243* (2013.01); *H01L 21/7687* (2013.01); *H01L 21/76224* (2013.01); *H01L 27/10885* (2013.01); *H01L 27/10891* (2013.01)

(58) Field of Classification Search
    CPC ....... H01L 21/762243; H01L 21/76224; H01L 21/7687; H01L 27/10885
    See application file for complete search history.

(56) References Cited

U.S. PATENT DOCUMENTS

| | | | |
|---|---|---|---|
| 9,006,078 B2 | 4/2015 | Kim | |
| 9,390,961 B2 | 7/2016 | Lee et al. | |
| 9,704,871 B2 | 7/2017 | Wu et al. | |
| 9,865,602 B2 | 1/2018 | Kwon et al. | |
| 2017/0005099 A1 | 1/2017 | Lee et al. | |
| 2018/0012894 A1* | 1/2018 | Kim | H01L 27/10814 |
| 2020/0020697 A1* | 1/2020 | Kim | H01L 27/10876 |

FOREIGN PATENT DOCUMENTS

| | | |
|---|---|---|
| JP | 2016009801 A | 1/2016 |
| KR | 20140086648 A | 7/2014 |
| KR | 20140124176 A | 10/2014 |
| KR | 20170005231 A | 1/2017 |

* cited by examiner

*Primary Examiner* — Marc Anthony Armand
(74) *Attorney, Agent, or Firm* — Muir Patent Law, PLLC

(57) ABSTRACT

An integrated circuit (IC) device including a line structure including a conductive line formed on a substrate and a lower insulation capping pattern; an insulation spacer covering a sidewall of the line structure; a conductive plug spaced apart from the conductive line in a first horizontal direction; a lower insulation fence spaced apart from the conductive line in the first horizontal direction, the lower insulation fence having a sidewall that contacts the conductive plug; and an upper insulation fence including a first portion covering the lower insulation capping pattern and a second portion covering the lower insulation fence, wherein a width of the second portion in a second horizontal direction perpendicular to the first horizontal direction is different from a width of the lower insulation fence in the second horizontal direction.

19 Claims, 44 Drawing Sheets

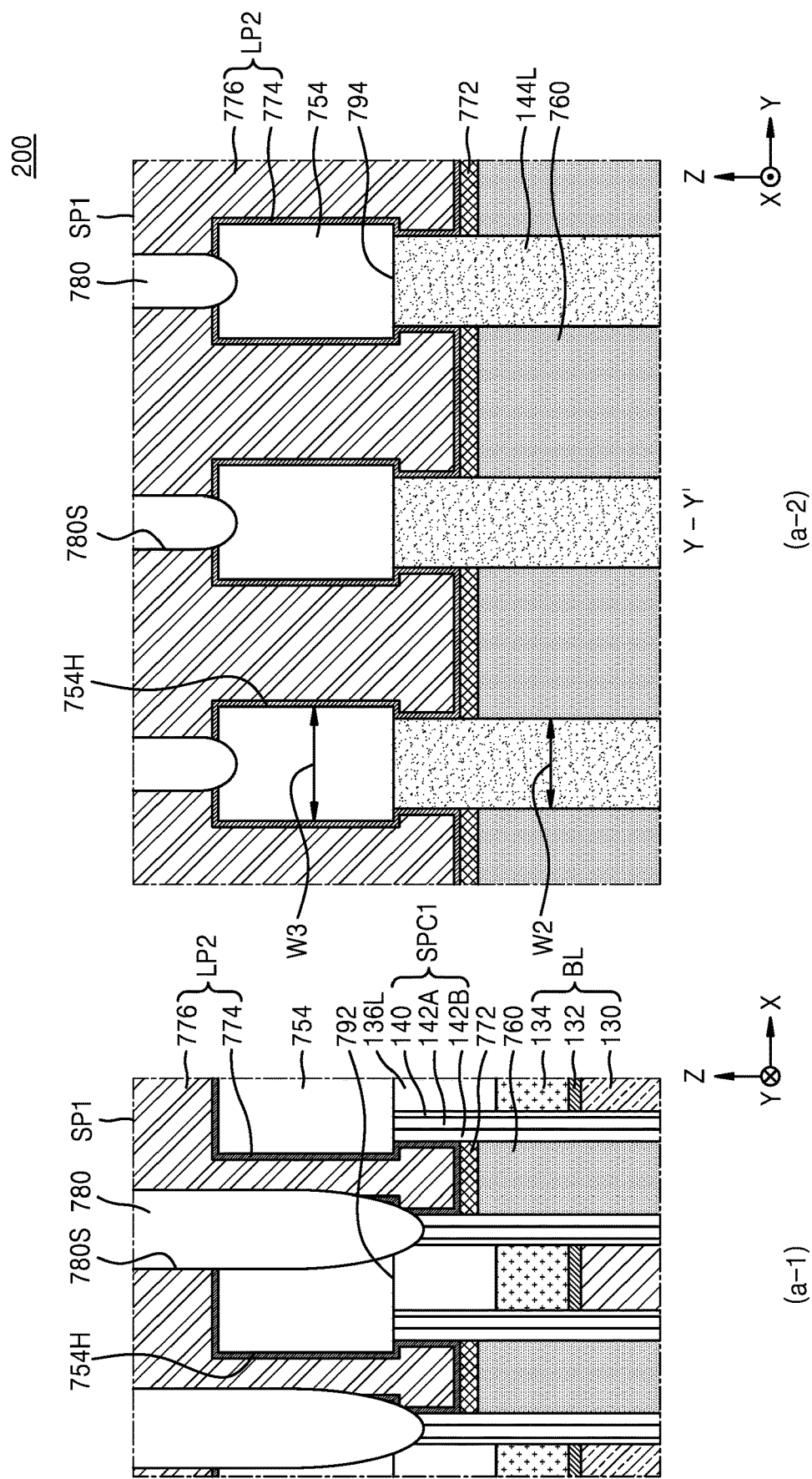

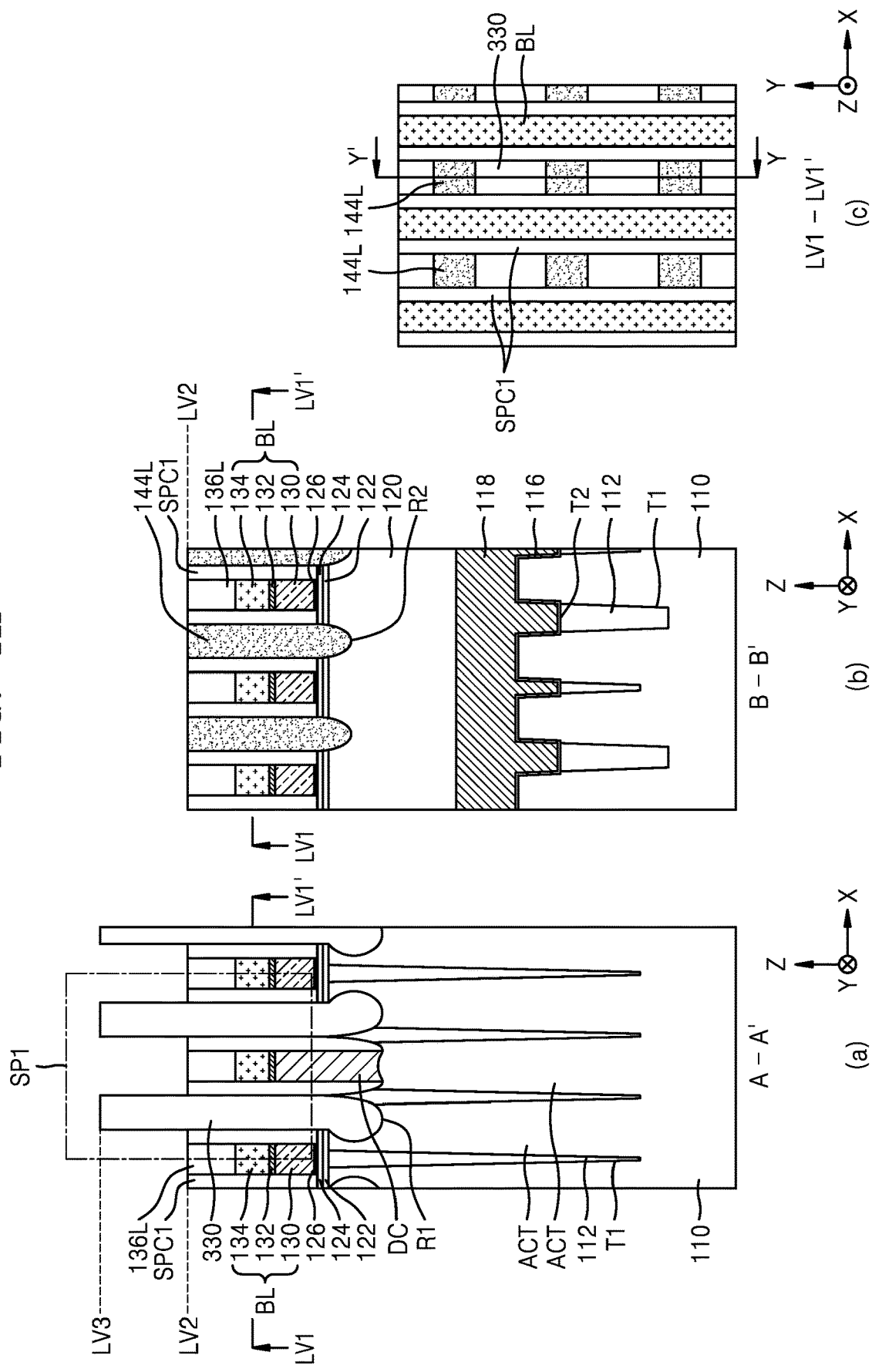

FIG. 6H
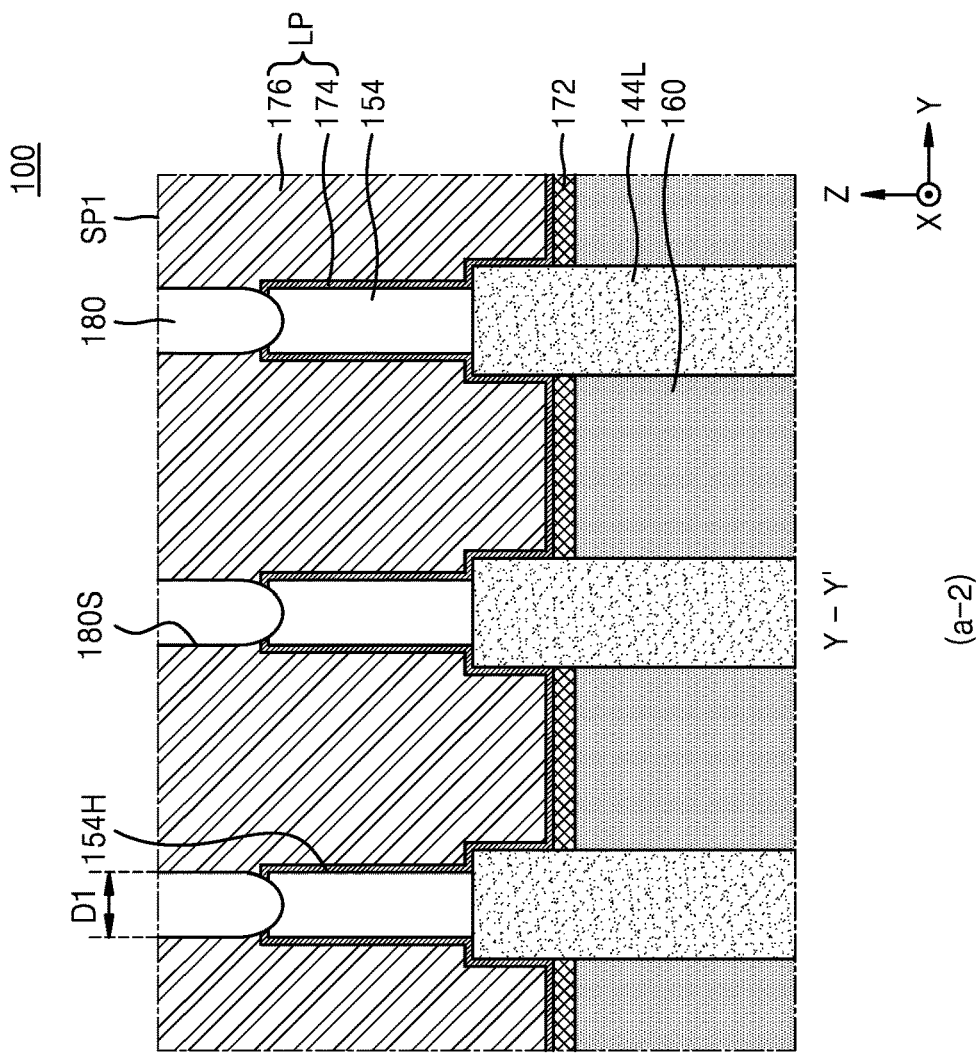
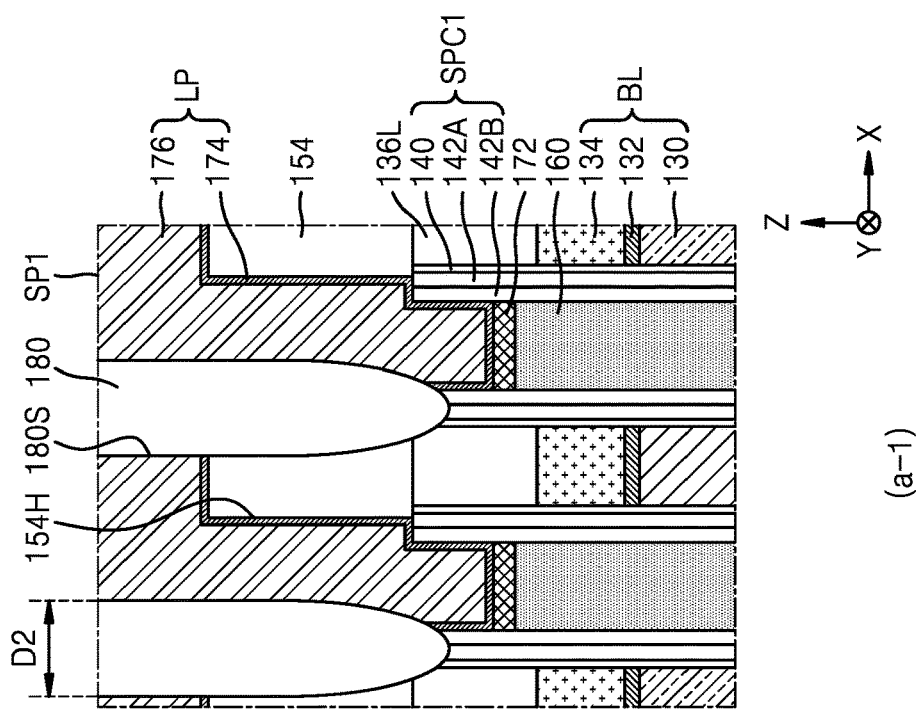

FIG. 7A
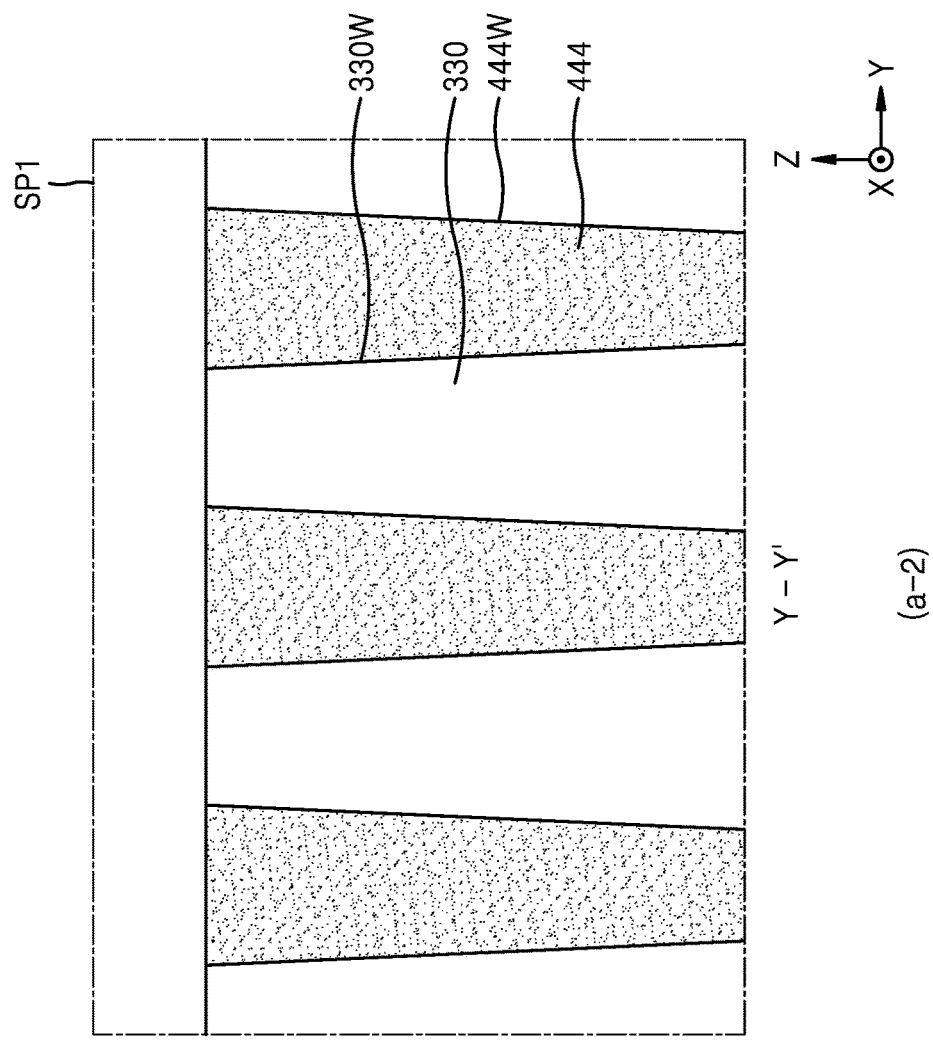
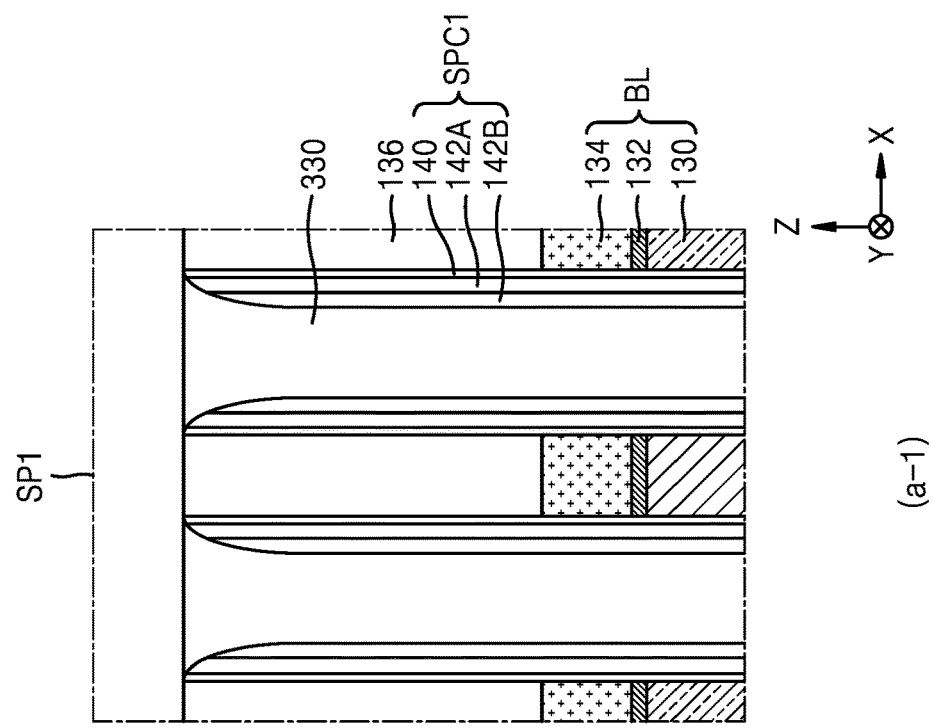

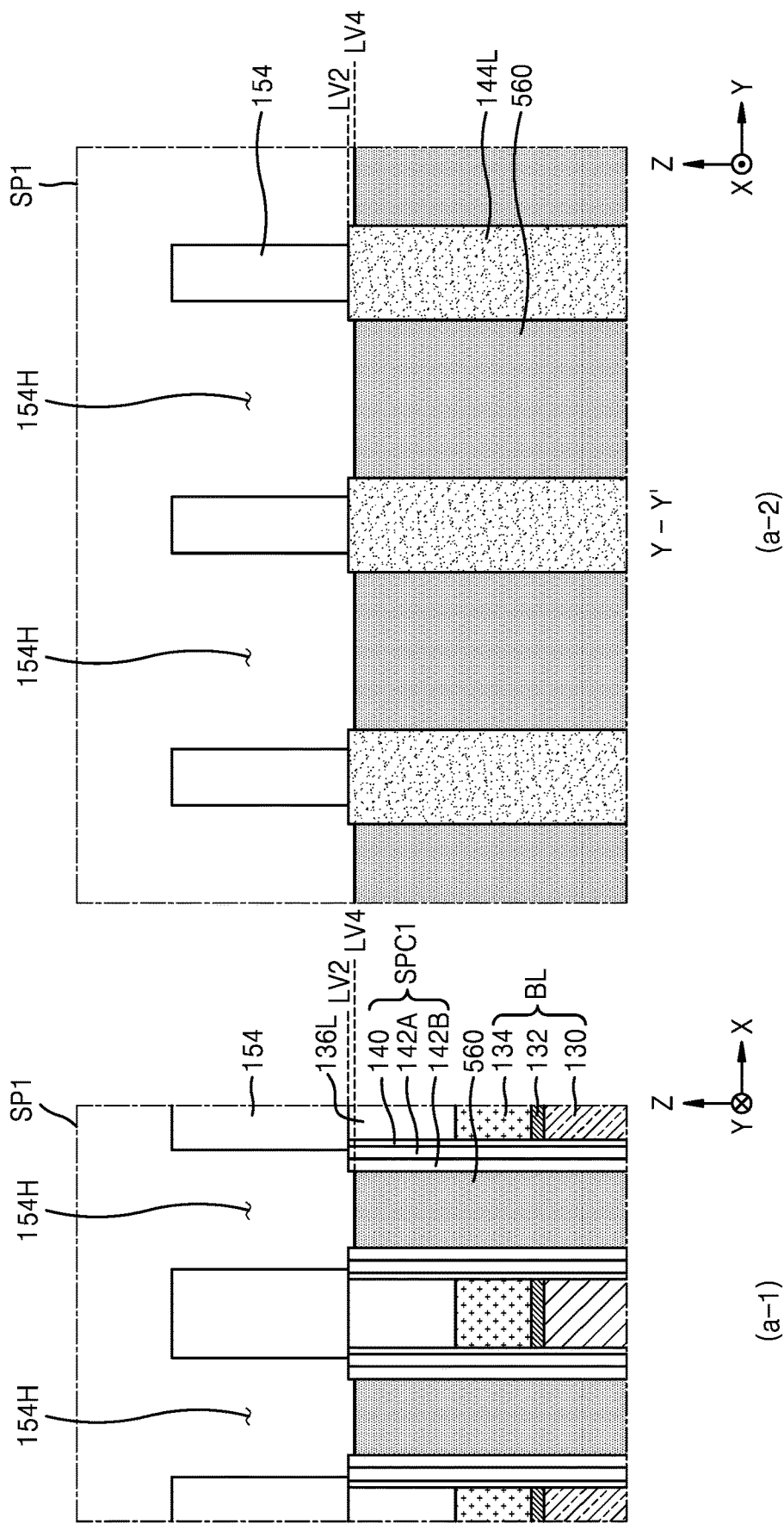

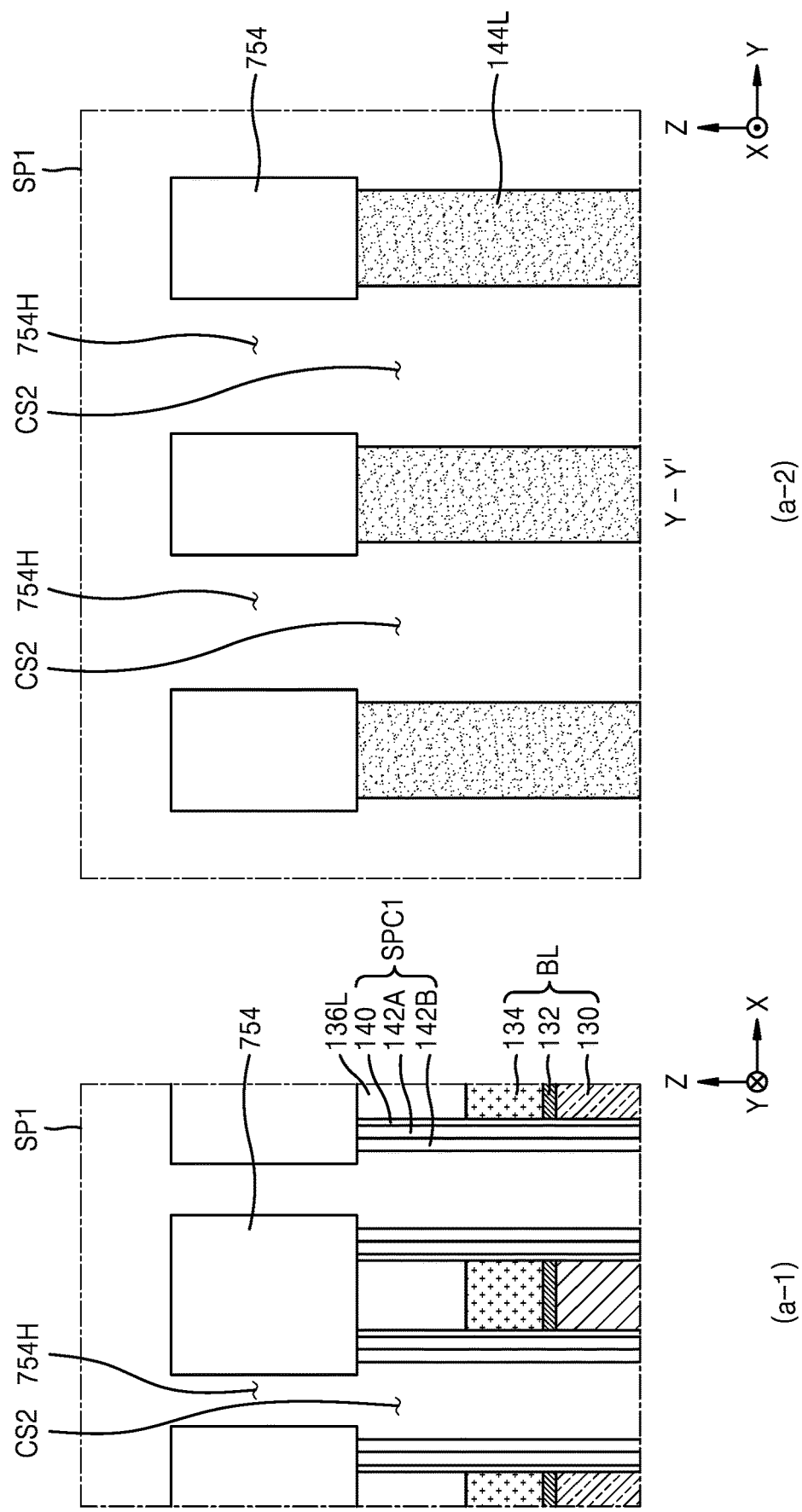

FIG. 10E
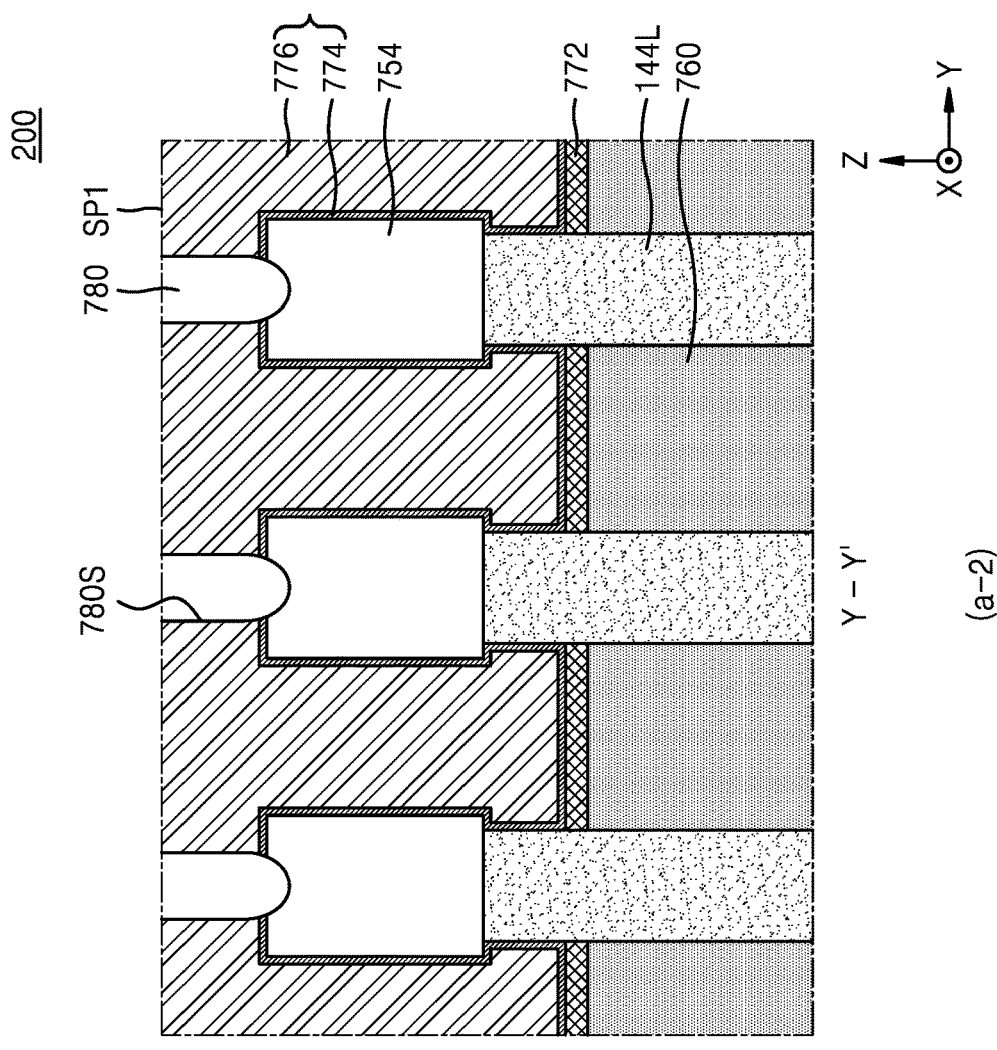
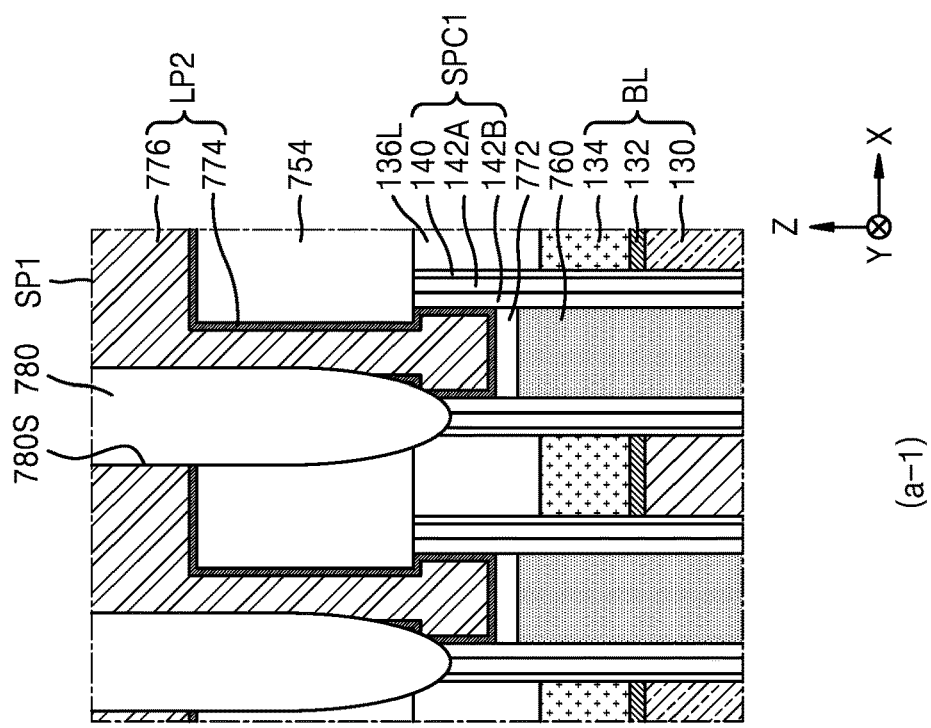

INTEGRATED CIRCUIT (IC) DEVICE

CROSS-REFERENCE TO RELATED APPLICATION

This application claims the benefit of Korean Patent Application No. 10-2018-0160350, filed on Dec. 12, 2018, in the Korean Intellectual Property Office, the disclosure of which is incorporated herein in its entirety by reference.

BACKGROUND

The inventive concept relates to integrated circuit (IC) devices, and more particularly, to an IC device including a plurality of conductive patterns that are adjacent to each other.

Recently, as integrated circuit devices have been rapidly down-scaled, intervals between a plurality of wiring lines are reduced. Thus, since an area occupied by a plurality of contact plugs arranged between the plurality of wiring lines is gradually reduced, it is difficult to ensure that an integrated circuit device includes a sufficient contact area. Therefore, there is a need to develop an integrated circuit device having a structure which may prevent the occurrence of an unwanted short circuit between conductive patterns arranged with high density within a limited area and also may ensure a sufficient contact area.

SUMMARY

The inventive concept provides an integrated circuit (IC) device having a structure which may improve reliability by ensuring a sufficient insulation distance capable of preventing the occurrence of a short circuit between a plurality of conductive patterns formed within a limited area in an IC device having a smaller unit cell size due to down-scaling of the IC device and also ensuring a sufficient contact area of the plurality of conductive patterns.

According to an aspect, the disclosure is directed to an integrated circuit (IC) device comprising: a line structure comprising a conductive line formed on a substrate and a lower insulation capping pattern that covers the conductive line; an insulation spacer covering a sidewall of the line structure; a conductive plug spaced apart from the conductive line in a first horizontal direction with the insulation spacer between the conductive plug and the conductive line; a lower insulation fence spaced apart from the conductive line in the first horizontal direction with the insulation spacer between the lower insulation fence and the conductive line, the lower insulation fence having a sidewall that contacts the conductive plug; and an upper insulation fence comprising a first portion covering an upper surface of the lower insulation capping pattern and a second portion covering an upper surface of the lower insulation fence, wherein a width of the second portion in a second horizontal direction perpendicular to the first horizontal direction is different from a width of the lower insulation fence in the second horizontal direction.

According to an aspect, the disclosure is directed to an integrated circuit (IC) device comprising: a pair of line structures comprising a pair of conductive lines extending parallel to each other on a substrate and being adjacent to each other in a first horizontal direction and a pair of lower insulation capping patterns covering the pair of conductive lines; a plurality of conductive plugs interposed between the pair of line structures; a plurality of lower insulation fences alternating with the plurality of conductive plugs between the pair of conductive lines such that one lower insulation fence is between two adjacent conductive plugs; and an upper insulation fence having a mesh structure that contacts an upper surface of each of the pair of lower insulation capping patterns and an upper surface of each of the plurality of lower insulation fences.

According to an aspect, the disclosure is directed to an integrated circuit (IC) device comprising: a plurality of conductive lines extending parallel to each other on a substrate; plurality of lower insulation capping patterns covering the plurality of conductive lines; a plurality of conductive plugs interposed between the plurality of conductive lines such that one conductive plug is between two adjacent conductive lines; a plurality of conductive landing pads formed on the plurality of conductive plugs; a plurality of lower insulation fences interposed between the plurality of conductive lines such that one lower insulation fence is between two adjacent conductive lines, the plurality of lower insulation fences comprising sidewalls that contact respective sidewalls of the plurality of conductive plugs; and an upper insulation fence having a mesh structure that covers the plurality of lower insulation capping patterns and the plurality of lower insulation fences, and comprising a plurality of holes through which the plurality of conductive landing pads penetrate.

BRIEF DESCRIPTION OF THE DRAWINGS

Embodiments of the inventive concept will be more clearly understood from the following detailed description taken in conjunction with the accompanying drawings in which:

FIG. 3 is a cross-sectional view for explaining an IC device, according to other example embodiments of the inventive concept;

FIGS. 6A through 6H are cross-sectional views of enlargements of some regions of FIGS. 4J through 4Q, respectively;

FIGS. 7A through 7D are cross-sectional views for explaining a method of manufacturing an IC device, according to other example embodiments of the inventive concept;

FIGS. 8 and 9 are cross-sectional views for explaining methods of manufacturing IC devices, according to other example embodiments of the inventive concept, respectively; and FIGS. 10A through 10E are cross-sectional views for explaining a method of manufacturing an IC device, according to other example embodiments of the inventive concept.

DETAILED DESCRIPTION OF THE EMBODIMENTS

Figure 1:
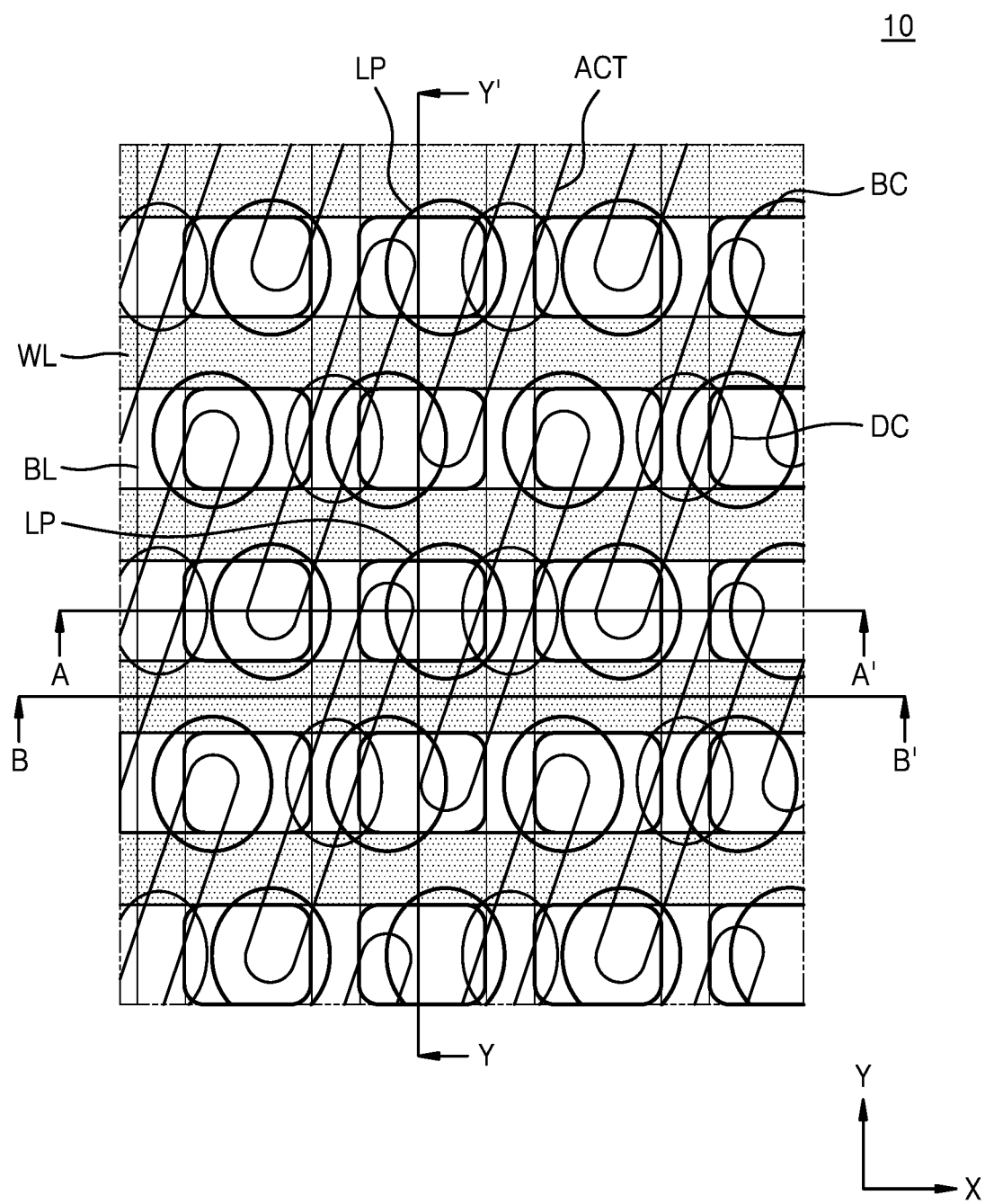
FIG. 1 is a schematic planar layout for explaining main components of a memory cell array region of an integrated circuit (IC) device, according to some example embodiments of the inventive concept.

Hereinafter, the inventive concept will be described more fully with reference to the accompanying drawings, in which exemplary embodiments of the inventive concept are shown. Like reference numerals in the drawings denote like elements, and thus their description will be omitted.

FIG. 1 is a schematic planar layout for explaining main components of a memory cell array region of an integrated circuit (IC) device 10, according to some example embodiments of the inventive concept.

Referring to FIG. 1, in the IC device 10, a plurality of active regions ACT may be arranged to extend lengthwise in an oblique direction with respect to an X direction and a Y direction on a plane. A plurality of word lines WL may extend lengthwise in parallel to each other in the X direction across the plurality of active regions ACT.

On the plurality of word lines WL, a plurality of bit lines BL may extend lengthwise in parallel to each other in the Y direction intersecting with the X direction. The plurality of bit lines BL may be connected to the plurality of active regions ACT via direct contacts DC. An item, layer, or portion of an item or layer described as extending "lengthwise" in a particular direction has a length in the particular direction and a width perpendicular to that direction, where the length is greater than the width.

A plurality of buried contacts BC may be formed between two bit lines BL adjacent to each other among the plurality of bit lines BL. A plurality of conductive landing pads LP may be formed on the plurality of buried contacts BC. The plurality of buried contacts BC and the plurality of conductive landing pads LP may connect bottom electrodes (not shown) of capacitors formed over the plurality of bit lines BL to the active regions ACT. Each of the plurality of conductive landing pads LP may be arranged to at least partially overlap a buried contact BC.

Figure 2A:
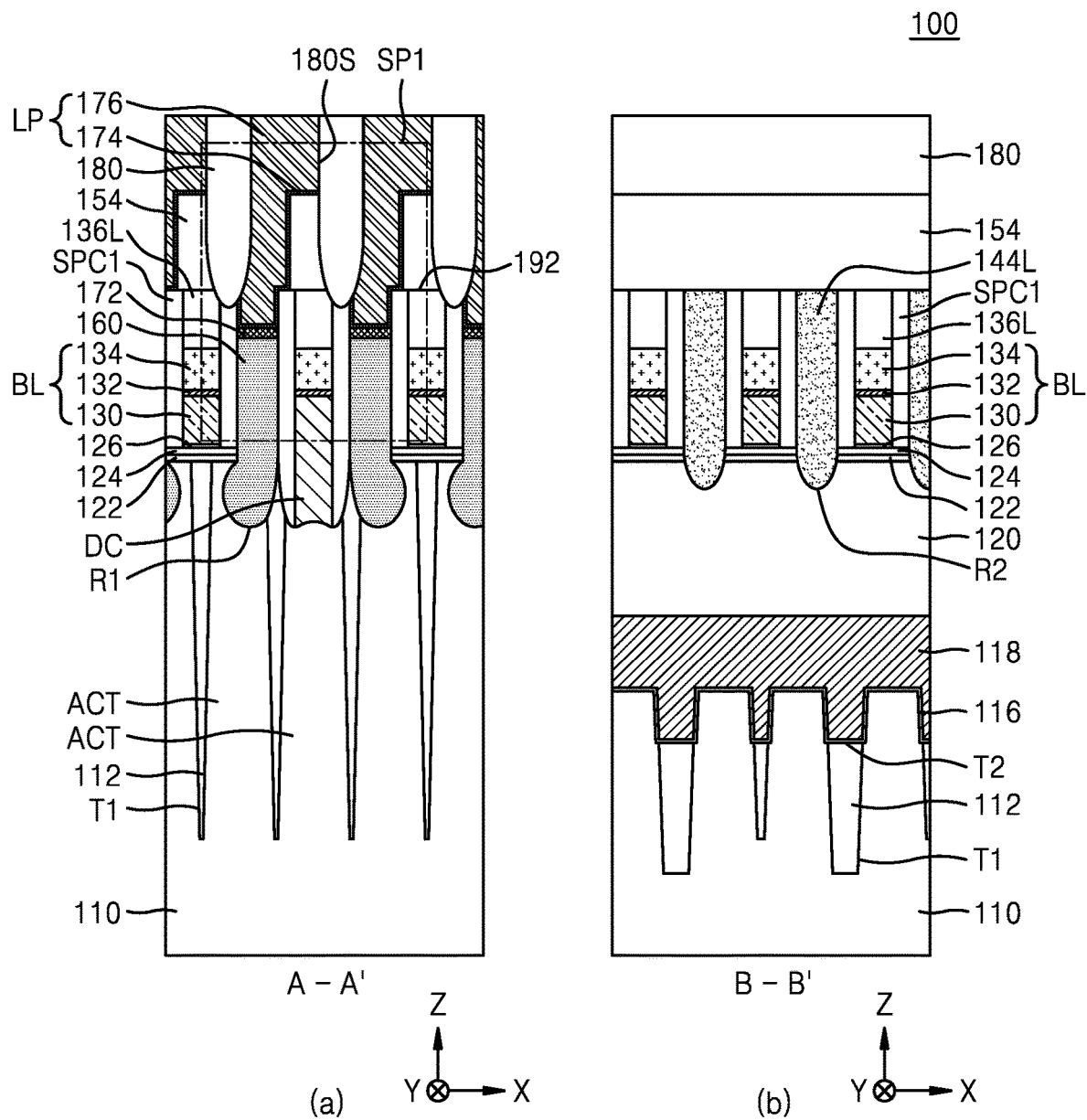
FIG. 2A is a cross-sectional view for explaining an IC device according to example embodiments of the inventive concept.
Figure 2B:
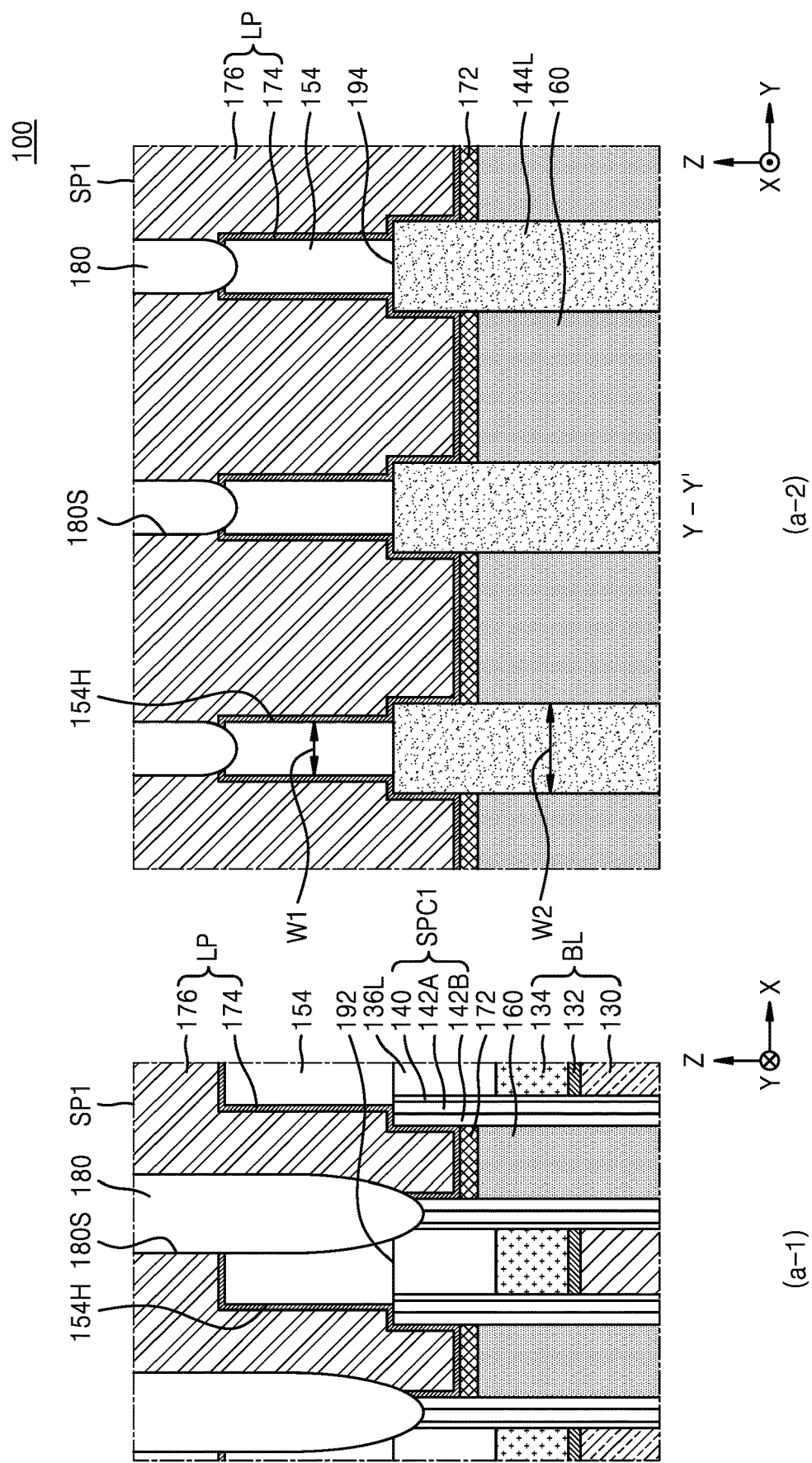
FIG. 2B is a cross-sectional view of an enlargement of some regions of FIG. 2A.

FIG. 2A is a cross-sectional view for explaining an IC device, according to example embodiments of the inventive concept, and FIG. 2B is a cross-sectional view of an enlargement of some regions of FIG. 2A. In FIG. 2A, (a) is a cross-sectional view of some components of a portion corresponding to the cross-section taken along line A-A' of FIG. 1, and (b) is a cross-sectional view of some components of a portion corresponding to the cross-section taken along line B-B' of FIG. 1. In FIG. 2B, (a-1) is a magnified cross-sectional view of a dashed-dotted line region SP1 in FIG. 2A, and (a-2) is a magnified cross-sectional view of some components of a portion in a Y direction of the dashed-dotted line region SP1 in FIG. 2A, for example, a portion corresponding to the cross-section taken along line Y-Y' of FIG. 1.

An IC device 100 shown in FIGS. 2A and 2B may constitute a portion of the IC device 10 shown in FIG. 1. The IC device 100 includes a substrate 110 in which a plurality of active regions ACT are defined by an isolation layer 112. The isolation layer 112 is formed within an isolation trench T1 formed in the substrate 110.

According to some example embodiments, the substrate 110 may include silicon, for example, single-crystalline silicon, polycrystalline silicon, or amorphous silicon. According to some other example embodiments, the substrate 110 may include at least one selected from among Ge, SiGe, SiC, GaAs, InAs, and InP. According to some example embodiments, the substrate 110 may include a conductive region, for example, an impurity-doped well or an impurity-doped structure.

A plurality of word line trenches T2 each extending lengthwise in a first horizontal direction (X direction) are formed in the substrate 110, and a plurality of gate dielectric layers 116, a plurality of word lines 118, and a buried insulation layer 120 are formed within the plurality of word line trenches T2. The plurality of word lines 118 may correspond to the plurality of word lines WL of FIG. 1.

A first insulation layer 122, a second insulation layer 124, and a third insulation layer 126 are formed on the substrate 110 in this stated order. A width of the third insulation layer 126 in the X direction may be less than a width of each of the first insulation layer 122 and the second insulation layer 124 in the X direction. Each of the first, second, and third gate insulation layers 122, 124, and 126 may include an oxide layer, a nitride layer, or a combination thereof. For example, the first insulation layer 122 and the third insulation layer 126 may each include a silicon oxide layer, and the second insulation layer 124 may include a silicon nitride layer.

A plurality of direct contacts DC may be arranged on respective portions of the plurality of active regions ACT, respectively. A plurality of line structures may each extend in a second horizontal direction (Y direction) on the third insulation layer 126 and on the plurality of direct contacts DC. Each of the plurality of line structures may include a bit line BL, and a lower insulation capping pattern 136L covering the bit line BL. A plurality of conductive plugs 160 and a plurality of lower insulation fences 144L may be aligned in the Y direction between a pair of bit lines BL adjacent to each other from among the plurality of bit lines BL. The plurality of conductive plugs 160 may fill a plurality of first recess spaces R1 formed in the substrate 110 and may each extend in a vertical direction between the pair of bit lines BL adjacent to each other. The plurality of lower insulation fences 144L may fill a plurality of second recess spaces R2 formed in an upper surface of the buried insulation layer 120 and may alternate with the plurality of conductive plugs 160 such that one lower insulation fence 144L is between two adjacent conductive plugs 160. Both sidewalls of each of the plurality of conductive plugs 160 in the Y direction may contact lower insulation fences 144L. The plurality of conductive plugs 160 aligned in the Y direction may be insulated from each other by the plurality of lower insulation fences 144L. The plurality of conductive plugs 160 may constitute the plurality of buried contacts BC of FIG. 1. Sidewalls of the lower insulation fences 144L may be substantially vertical. For example, sidewalls of the lower insulation fences 144L may be substantially perpendicular with respect to a top surface of the substrate 110. Terms such as "same," "equal," "planar," "coplanar," "vertical," or "horizontal," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

A metal silicide layer 172 and a conductive landing pad LP may be formed in this stated order on a conductive plug 160 between two adjacent line structures from among the plurality of line structures each including the bit line BL and the lower insulation capping pattern 136L. For example, a bottom surface of the metal silicide layer 172 may contact a top surface of the conductive plug 160, and a top surface of the metal silicide layer 172 may contact a bottom surface of the conductive landing pad LP. The conductive plug 160, the metal silicide layer 172, and the conductive landing pad LP may constitute a contact structure extending in a column shape in the vertical direction (Z direction).

The plurality of bit lines BL may be connected to the active regions ACT via the direct contacts DC. One direct contact DC and a pair of conductive plugs 160 facing each other with the direct contact DC therebetween may be connected to different active regions ACT from among the plurality of active regions ACT. In some embodiments, a bottom surface of each direct contact DC may have a convex shape with respect to the substrate 110. According to some embodiments, the direct contacts DC may include Si, Ge, W, WN, Co, Ni, Al, Mo, Ru, Ti, TiN, Ta, TaN, Cu, or a combination thereof. According to some other example embodiments, each direct contact DC may include an epitaxial silicon layer.

Each of the plurality of bit lines BL may include a lower conductive layer 130, an intermediate conductive layer 132, and an upper conductive layer 134 formed on the substrate 110 in this stated order. For example, the lower conductive layer 130 may be formed on the third insulation layer 126, the intermediate conductive layer 132 may be formed on the lower conductive layer 130, and the upper conductive layer 134 may be formed on the intermediate conductive layer 132. An upper surface of the lower conductive layer 130 and an upper surface of the direct contact DC may extend on the same horizontal plane. Although each of the plurality of bit lines BL has a three-layered structure including the lower conductive layer 130, the intermediate conductive layer 132, and the upper conductive layer 134 in FIG. 2A, the inventive concept is not limited thereto. For example, each of the plurality of bit lines BL may be formed as a single layer, a double layer, or a stack of a plurality of layers, such as four or more layers. The lower conductive layer 130 may include conductive polysilicon. Each of the intermediate conductive layer 132 and the upper conductive layer 134 may include TiN, TiSiN, tungsten (W), W silicide, or a combination thereof. For example, the intermediate conductive layer 132 may include TiN and/or TiSiN, and the upper conductive layer 134 may be tungsten (W). The lower insulation capping pattern 136L may be a silicon nitride layer.

The plurality of conductive plugs 160 may each have a column shape extending in the vertical direction (Z direction) in spaces between bit lines BL on the substrate 110. A lower surface of each of the plurality of conductive plugs 160 may contact an active region ACT. A portion of each of the plurality of conductive plugs 160 may be on a lower level than an upper surface of the substrate 110 so as to be buried within the substrate 110. The term "level" or "horizontal level" used herein refers to a distance in a vertical direction (Z direction or -Z direction) from the upper surface of the substrate 110. The plurality of contact plugs 160 may each include an impurity-doped semiconductor material, metal, conductive metal nitride, or a combination thereof.

Both sidewalls of the plurality of bit lines BL, both sidewalls of the plurality of lower insulation capping patterns 136L, and both sidewalls of the plurality of direct contacts DC may be covered by a plurality of insulation spacers SPC1. For example, the insulation spacers SPC1 may contact both sidewalls of the plurality of bit lines BL, both sidewalls of the plurality of insulation capping patterns 136, and both sidewalls of the plurality of direct contacts DC. Each of the plurality of insulation spacers SPC1 may extend in the Y direction such as to be parallel to the plurality of bit lines BL. Top surfaces of the insulation spacers SPC1 may be at the same vertical level as top surfaces of the plurality of lower insulation capping patterns 136L. Each of the plurality of insulation spacers SPC1 may be an oxide layer, an air spacer, or a combination thereof.

The term "air" used herein means a space including atmospheric air, or other gases that may exist during a manufacturing process.

The plurality of conductive plugs 160 may be spaced apart from the bit lines BL in the X direction with the insulation spacers SPC1 therebetween, and the plurality of lower insulation fences 144L may also be spaced apart from the bit lines BL in the X direction with the insulation spacers SPC1 therebetween.

According to some embodiments, as shown in (a-1) of FIG. 2B, each of the plurality of insulation spacers SPC1 may include an insulation liner 140, a first insulation spacer 142A, and a second insulation spacer 142B that cover a sidewall of each bit line BL in this stated order. In some embodiments, the insulation liner 140 may contact entire sidewalls of the plurality of bit lines BL and entire sidewalls of the plurality of insulation capping patterns 136. The first insulation spacer 142A may be formed on the insulation liner 140, and the second insulation spacer 142B may be formed on the first insulation spacer 142A. The insulation liner 140, the first insulation spacer 142A, and the second insulation spacer 142B may extend in parallel to the bit line BL between the bit line BL and the plurality of conductive plugs 160. The insulation liner 140 may be a silicon nitride layer. The first insulation spacer 142A may be a silicon oxide layer or an air spacer. The second insulation spacer 142B may be a silicon nitride layer.

An upper insulation fence 154 may extend along a plane (for example, an X-Y plane) to cover upper surfaces of the plurality of lower insulation capping patterns 136L, upper surfaces of the plurality of insulation spacers SPC1, and upper surfaces of the plurality of lower insulation fences 144L. The upper insulation fence 154 may have a mesh structure that contacts the upper surfaces of the plurality of lower insulation capping patterns 136L, the upper surfaces of the plurality of insulation spacers SPC1, and the upper surfaces of the plurality of lower insulation fences 144L. The upper insulation fence 154 includes a plurality of holes 154H. The plurality of holes 154H may be formed at locations respectively corresponding to the plurality of conductive plugs 160. Sidewalls of the upper insulation fence 154 may be substantially vertical. For example, sidewalls of the upper insulation fence 154 may be substantially perpendicular with respect to a top surface of the substrate 110.

In the horizontal direction (for example, the X direction or the Y direction), a width of each of the plurality of holes 154H formed in the upper insulation fence 154 may be greater than that of each conductive plug 160. For example, the width in the Y direction of each of the plurality of holes 154H formed in the upper insulation fence 154 may be greater than that of each of the plurality of conductive plugs 160.

Each of the plurality of conductive landing pads LP includes a first portion between two lower insulation fences 144L adjacent to each other from among the plurality of lower insulation fences 144L, and a second portion that penetrates through one of the plurality of holes 154H, and a width of the second portion in the Y direction may be greater than that of the first portion in the Y direction. The width in the Y direction each of the second portions may be greater than that of each conductive plug 160.

A lower surface of the upper insulation fence 154 may include portions that contact the upper surfaces of the plurality of lower insulation fences 144L, and portions that contact the upper surfaces of the plurality of lower insulation capping patterns 136L. The lower surface of the upper insulation fence 154 may also include portions that contact the upper surfaces of the plurality of insulation spacers SPC1. For example, portions of the lower surface of the upper insulation fence 154 may contact upper surfaces of the insulation liner 140 and portions of the upper surfaces of the first insulation spacer 142A.

Each of the plurality of metal silicide layers 172 may be interposed between each conductive plug 160 and each conductive landing pad LP, and may be spaced apart from bit lines BL with insulation spacers SPC1 between the metal silicide layers 172 and the bit lines BL. First side surfaces of the metal silicide layer 172 may contact side surfaces of the lower insulation fences 144L, and second side surfaces of the metal silicide layer 172 may contact side surfaces of the insulation spacers SPC1. According to some embodiments, each metal silicide layer 172 may include cobalt silicide, nickel silicide, or manganese silicide.

Each of the plurality of conductive landing pads LP may be connected to each conductive plug 160 via each metal silicide layer 172. The plurality of conductive landing pads LP may each extend from a space between the plurality of lower insulation capping patterns 136L to an upper space of the upper insulation fence 154 via the plurality of holes 154H formed in the upper insulation fence 154 so as to cover the upper surface of the upper insulation fence 154. Each of the plurality of conductive landing pads LP may include a portion that is surrounded by the upper insulation fence 154, and a portion that covers the upper surface of the upper insulation fence 154. Portions of the plurality of conductive landing pads LP that cover the upper surface of the upper insulation fence 154 may overlap respective portions of the bit lines BL and a portion of the upper insulation fence 154 in the vertical direction.

The metal silicide layers 172 and the conductive landing pads LP may be arranged to vertically overlap the conductive plugs 160. The plurality of conductive landing pads LP may contact the metal silicide layers 172, respectively, and may penetrate through the holes 154H of the upper insulation fence 154 and each extend in the vertical direction (Z direction). Each of the plurality of conductive landing pads LP may include a conductive barrier layer 174 and a conductive layer 176. The conductive barrier layer 174 may include Ti, TiN, or a combination thereof. The conductive layer 176 may include metal, metal nitride, conductive polysilicon, or a combination thereof. For example, the conductive layer 176 may include W.

A plurality of first interfaces 192 between the plurality of lower insulation capping patterns 136L and the upper insulation fence 154, and a plurality of second interfaces 194 between the plurality of lower insulation fences 144L and the upper insulation fence 154 may each extend on substantially the same horizontal level.

The level of the upper surface of each of the plurality of conductive plugs 160 may be lower than the level of each of the plurality of first interfaces 192 and may also be lower than the level of each of the plurality of second interfaces 194. However, the inventive concept is not limited to this. According to some example embodiments, the IC device 100 may include a plurality of conductive plugs 560 of FIG. 8 instead of the plurality of conductive plugs 160. An upper surface of each of the plurality of conductive plugs 560 may be at the same or similar level as or to the level of each first interface 192 or may be lower than the level of each first interface 192. According to some other embodiments, the IC device 100 may include a plurality of conductive plugs 660 of FIG. 9 instead of the plurality of conductive plugs 160. An upper surface of each of the plurality of conductive plugs 660 may be higher than the level of each first interface 192.

According to the upper surface levels of the plurality of conductive plugs 160, 560, and 660, levels of the metal silicide layers 172 that cover the upper surfaces of the plurality of conductive plugs 160, 560, and 660 may vary.

The plurality of lower insulation fences 144L may each have a column shape extending in the vertical direction (Z direction) on the substrate 110. Each of the plurality of lower insulation fences 144L may have sidewalls that contact conductive plugs 160. Although a case where both sidewalls of each of the plurality of lower insulation fences 144L in the Y direction each extend in the vertical direction (Z direction) is illustrated in (a-2) of FIG. 2B, the inventive concept is not limited thereto. For example, the IC device 100 may include, instead of the plurality of lower insulation fences 144L, a plurality of lower insulation fences 444L each including inclined sidewalls 444SW at both sides in the Y direction, the inclined sidewalls 444SW inclined from the vertical direction (Z direction), as illustrated in (a-2) of FIG. 7D.

The upper insulation fence 154 may be formed of a material having the same or similar etch selectivity as or to a material included in the plurality of lower insulation fences 144L. For example, the upper insulation fence 154 may be silicon nitride, SiCN, SiBN, or a combination thereof.

A width in the X direction of a portion of the upper insulation fence 154 that covers the upper surface of each lower insulation capping pattern 136L may be different from that of the lower insulation capping pattern 136L. A sidewall of the upper insulation fence 154 that faces each conductive landing pad LP may not be aligned with a sidewall of each lower insulation capping pattern 136L that faces the conductive landing pad LP, in a straight line. For example, as illustrated in (a) of FIG. 2A and (a-1) of FIG. 2B, the sidewall of the upper insulation fence 154 that faces each conductive landing pad LP may protrude toward the conductive landing pad LP, namely, in the X direction, farther than the sidewall of each lower insulation capping pattern 136L that faces the conductive landing pad LP.

The lower surface of the upper insulation fence 154 may contact the upper surfaces of the plurality of insulation spacers SPC1, the upper surfaces of the plurality of lower insulation capping patterns 136L, and the upper surfaces of the plurality of lower insulation fences 144L. Uppermost portion levels of the plurality of insulation spacers SPC1 may not be higher than a lower surface level of the upper insulation fence 154.

A width in the Y direction of a portion of the upper insulation fence 154 that covers the upper surface of each lower insulation fence 144L may be different from that of the lower insulation fence 144L. The sidewall of each upper insulation fence 154 and the sidewall of each lower insulation fence 144L may not be aligned with each other in a straight line in the vertical direction. For example, as illustrated in (a-2) of FIG. 2B, a width W1 in the Y direction of the portion of the upper insulation fence 154 that covers the upper surface of each lower insulation fence 144L may be less than a width W2 in the Y direction of the lower insulation fence 144L. Both sidewalls in the Y direction of each lower insulation fence 144L may protrude in the Y direction farther than both sidewalls in the Y direction of the upper insulation fence 154.

According to some example embodiments, the upper insulation fence 154 may be formed of the same material as a material of at least one of the plurality of lower insulation capping patterns 136L and the plurality of lower insulation fences 144L. According to some other example embodiments, the upper insulation fence 154 may be formed of a different material from the material of at least one of the plurality of lower insulation capping patterns 136L and the plurality of lower insulation fences 144L. For example, the upper insulation fence 154, the plurality of lower insulation capping patterns 136L and the plurality of lower insulation fences 144L may each be silicon nitride, SiCN, SiBN, or a combination thereof. According to some embodiments, the plurality of lower insulation fences 144L and the upper insulation fence 154 may be formed of the same material. According to some other example embodiments, the plurality of lower insulation fences 144L and the upper insulation fence 154 may be formed of materials different from each other. For example, the upper insulation fence 154, the plurality of lower insulation capping patterns 136L, and the plurality of lower insulation fences 144L may each be formed of silicon nitride. As another example, the plurality of lower insulation capping patterns 136L and the plurality of lower insulation fences 144L may each be silicon nitride, and the upper insulation fence 154 may be SiCN, SiBN, or a combination thereof.

As illustrated in FIG. 1, the plurality of conductive landing pads LP may be in the shape of a plurality of island-type patterns in a plan view. The plurality of conductive landing pads LP may be electrically insulated from each other by an insulation layer 180 that fills insulation spaces 180S around the plurality of conductive landing pads LP. The insulation layer 180 may include a silicon nitride layer, a silicon oxide layer, or a combination thereof.

According to some embodiments, an interval between two conductive landing pads LP adjacent to each other in the Y direction from among the plurality of conductive landing pads LP may be less than that between two conductive landing pads LP adjacent to each other in the X direction from among the plurality of conductive landing pads LP. Accordingly, a depth (see (a-2) of FIG. 2B) of an insulation space 180S between the two conductive landing pads LP adjacent to each other in the Y direction may be less than a depth (see (a) of FIG. 2A) of an insulation space 180S between the two conductive landing pads LP adjacent to each other in the X direction. Accordingly, a lower surface level of the insulation layer 180 that fills the insulation spaces 180S may vary according to locations on the substrate 110. As illustrated in FIG. 2B, a level of a lower surface of a portion of the insulation layer 180 that vertically overlaps each lower insulation fence 144L may be higher than that of a lower surface of a portion of the insulation layer 180 that vertically overlaps each lower insulation capping pattern 136L.

As illustrated in (a-2) of FIG. 2B, a portion of the upper insulation fence 154 may be interposed between the lower insulation fence 144L and the insulation layer 180, and a portion of the lower insulation fence 144L, a portion of the upper insulation fence 154, and a portion of the insulation layer 180 may be arranged to vertically overlap each other. The upper surface of the upper insulation fence 154 may include portions that contact the plurality of conductive landing pads LP and portions that contact the insulation layer 180.

The IC device 100 described above with reference to FIGS. 2A and 2B includes the upper insulation fence 154 having a mesh structure formed on the plurality of lower insulation capping patterns 136L and the plurality of lower insulation fences 144L. The upper insulation fence 154 having a mesh structure may have an integrated structure formed of a single layer. Because the upper insulation fence 154 has a smaller width than the plurality of lower insulation fences 144L in the horizontal direction (e.g., the Y direction) and a plurality of holes 154H having a greater width in the horizontal direction than the plurality of contact spaces CS (see FIG. 4O) are formed in the upper insulation fence 154, a cross-sectional area in the horizontal direction of the plurality of conductive landing pads LP each extending through the plurality of holes 154H may be increased. Accordingly, contact resistance of the plurality of conductive landing pads LP may be reduced, and thus reliability may improve.

FIG. 3 is a cross-sectional view of an IC device according to other example embodiments of the inventive concept. In (a-1) and (a-2) of FIG. 3, some components of portions corresponding to the cross-sections illustrated in (a-1) and (a-2) of FIG. 2B are illustrated. The same reference characters and numerals in FIG. 3 as those in FIGS. 1 through 2B denote the same elements, and thus their description will be omitted herein.

An IC device 200 shown in FIG. 3 may constitute a portion of the IC device 10 shown in FIG. 1. The IC device 200 has mostly the same structure as the IC device 100 of FIGS. 2A and 2B. However, the IC device 200 includes an upper insulation fence 754. The upper insulation fence 754 has a mesh structure that extends along a plane (for example, an X-Y plane) to cover the upper surfaces of the plurality of lower insulation capping patterns 136L, the upper surfaces of the plurality of insulation spacers SPC1, and the upper surfaces of the plurality of lower insulation fences 144L. The upper insulation fence 754 includes a plurality of holes 754H. In the horizontal direction (e.g., the Y direction), a width of each of the plurality of holes 754H formed in the upper insulation fence 754 may be less than that of each of the plurality of conductive plugs 760.

A width W3 in the Y direction of a portion of the upper insulation fence 754 that covers the upper surface of each lower insulation fence 144L may be greater than a width W2 in the Y direction of the lower insulation fence 144L. Both sidewalls in the Y direction of the upper insulation fence 754 may protrude in the Y direction farther than both sidewalls in the Y direction of each lower insulation fence 144L.

In the X direction, a width of the upper insulation fence 754 may be greater than that of each lower insulation capping pattern 136L. A sidewall of the upper insulation fence 754 that faces each conductive landing pad LP2 may not be aligned with a sidewall of each lower insulation capping pattern 136L that faces the conductive landing pad LP2, in a straight line. For example, as illustrated in (a-1) of FIG. 3, the sidewall of the upper insulation fence 754 that faces the conductive landing pad LP2 may protrude toward the conductive landing pad LP2, namely, in the X direction, farther than the sidewall of the lower insulation capping pattern 136L that faces the conductive landing pad LP2. A width in the X direction of a portion of the upper insulation fence 754 that covers the upper surface of each lower insulation capping pattern 136L may be greater than that of the lower insulation capping pattern 136L.

Each of the plurality of conductive landing pads LP2 may be connected to each conductive plug 760 via each metal silicide layer 772. The plurality of conductive landing pads LP2 may each extend from a space between the plurality of lower insulation capping patterns 136L to an upper space of the upper insulation fence 754 through the plurality of holes 754H formed in the upper insulation fence 754 so as to cover the upper surface of the upper insulation fence 754. Each of the plurality of conductive landing pads LP2 may include a conductive barrier layer 774 and a conductive layer 776. Detailed structures of the conductive barrier layer 774 and the conductive layer 776 are the same as those of the conductive barrier layer 174 and the conductive layer 176, respectively described above with reference to FIGS. 2A and 2B.

As illustrated in (a-2) of FIG. 3, a portion of the upper insulation fence 754 may be interposed between lower insulation fence 144L and an insulation layer 780, and a portion of the lower insulation fence 144L, a portion of the upper insulation fence 754, and a portion of the insulation layer 780 may be arranged to vertically overlap each other.

A plurality of first interfaces 792 between the plurality of lower insulation capping patterns 136L and the upper insulation fence 754, and a plurality of second interfaces 794 between the plurality of lower insulation fences 144L and the upper insulation fence 754 may each extend on substantially the same horizontal level. The level of the upper surface of each of the plurality of conductive plugs 760 may be lower than the level of each of the plurality of first interfaces 792 and may also be lower than the level of each of the plurality of second interfaces 794.

According to some example embodiments, an interval between two conductive landing pads LP2 adjacent to each other in the Y direction from among the plurality of conductive landing pads LP2 may be less than that between two conductive landing pads LP2 adjacent to each other in the X direction from among the plurality of conductive landing pads LP2. Accordingly, a depth (see (a-2) of FIG. 3) of an insulation space 780S between the two conductive landing pads LP2 adjacent to each other in the Y direction may be less than a depth (see (a-1) of FIG. 3) of an insulation space 780S between the two conductive landing pads LP2 adjacent to each other in the X direction.

Detailed structures of the upper insulation fence 754, the plurality of conductive plugs 760, the plurality of metal silicide layers 772, and the insulation layer 780 are mostly the same as those of the upper insulation fence 154, the plurality of conductive plugs 160, the plurality of metal silicide layers 172, and the insulation layer 180, respectively described above with reference to FIGS. 2A and 2B.

The IC device 200 described above with reference to FIG. 3 includes the upper insulation fence 754 having a mesh structure formed on the plurality of lower insulation capping patterns 136L and the plurality of lower insulation fences 144L. The upper insulation fence 754 may have a greater width than the plurality of lower insulation fences 144L in the horizontal direction. Accordingly, when the plurality of conductive landing pads LP2 occupying a relatively large area are formed within a limited area due to high integration of IC devices, even when a distance between the plurality of conductive landing pads LP2 decreases, a sufficient insulation distance is secured between the plurality of conductive landing pads LP2 by the upper insulation fence 754, and thus an unwanted short-circuit may be prevented. Accordingly, the reliability of the IC device 200 may improve.

Figure 4A:
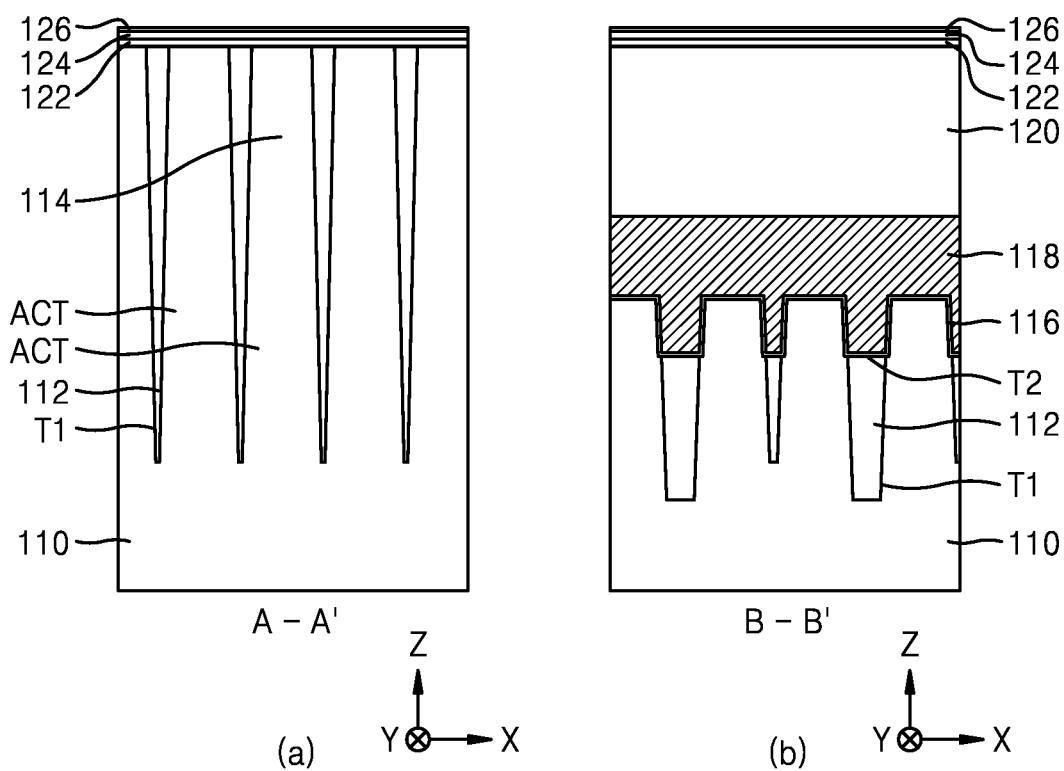
FIGS. 4A through 4Q are cross-sectional views for explaining a method of manufacturing an IC device, according to example embodiments of the inventive concept.
Figure 4B:
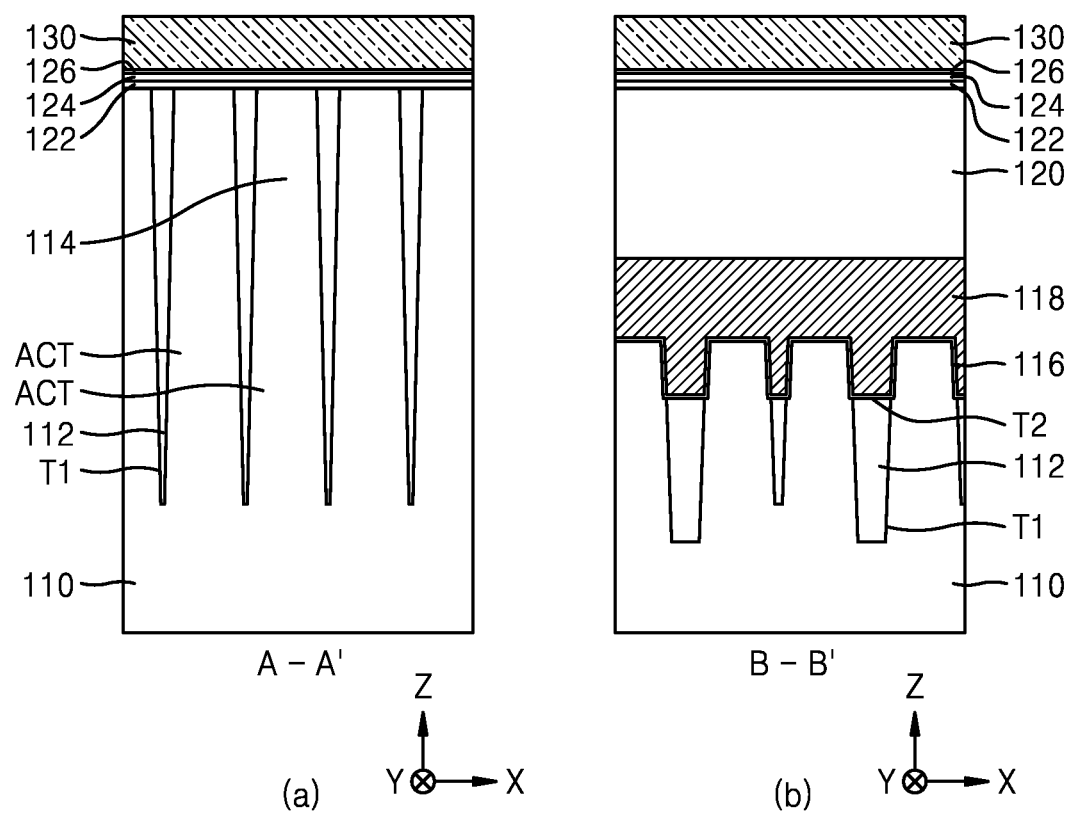
Figure 4C:
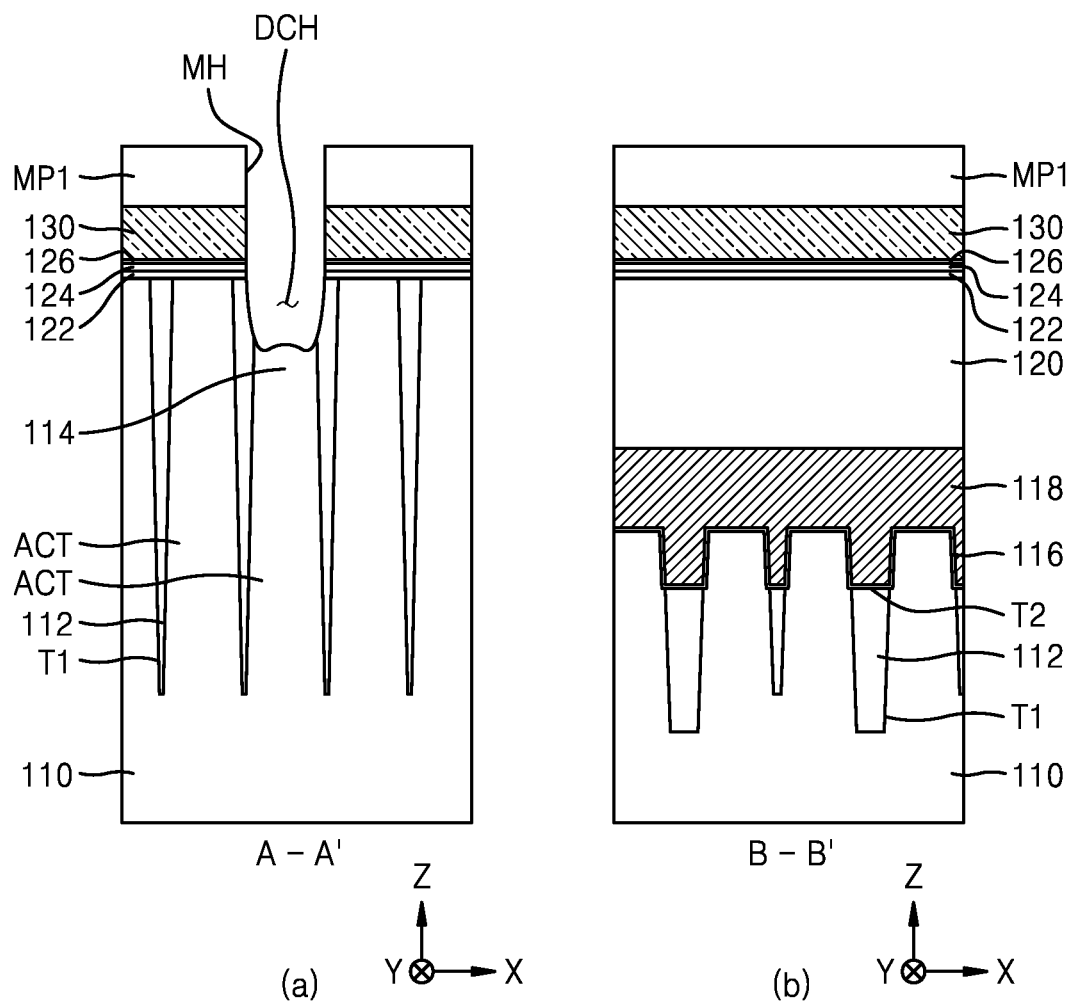
Figure 4D:
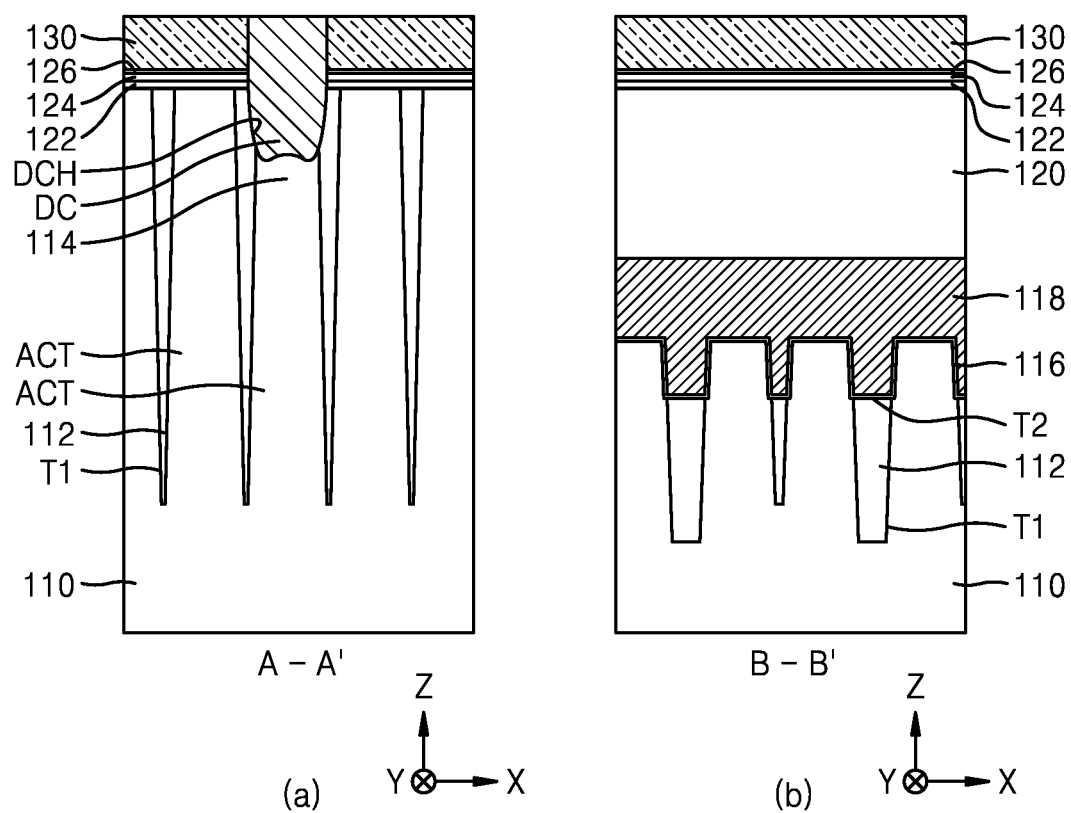
Figure 4E:
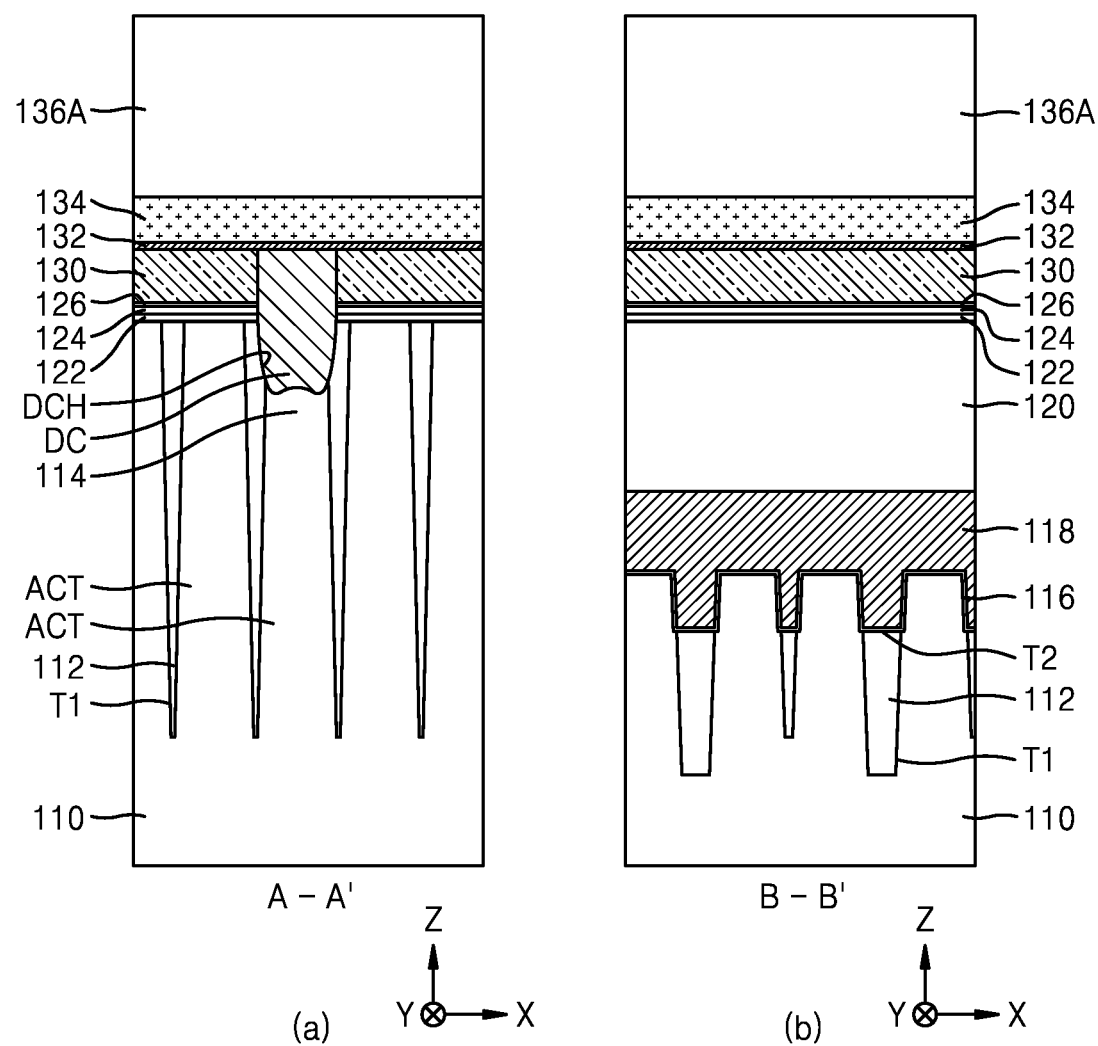
Figure 4F:
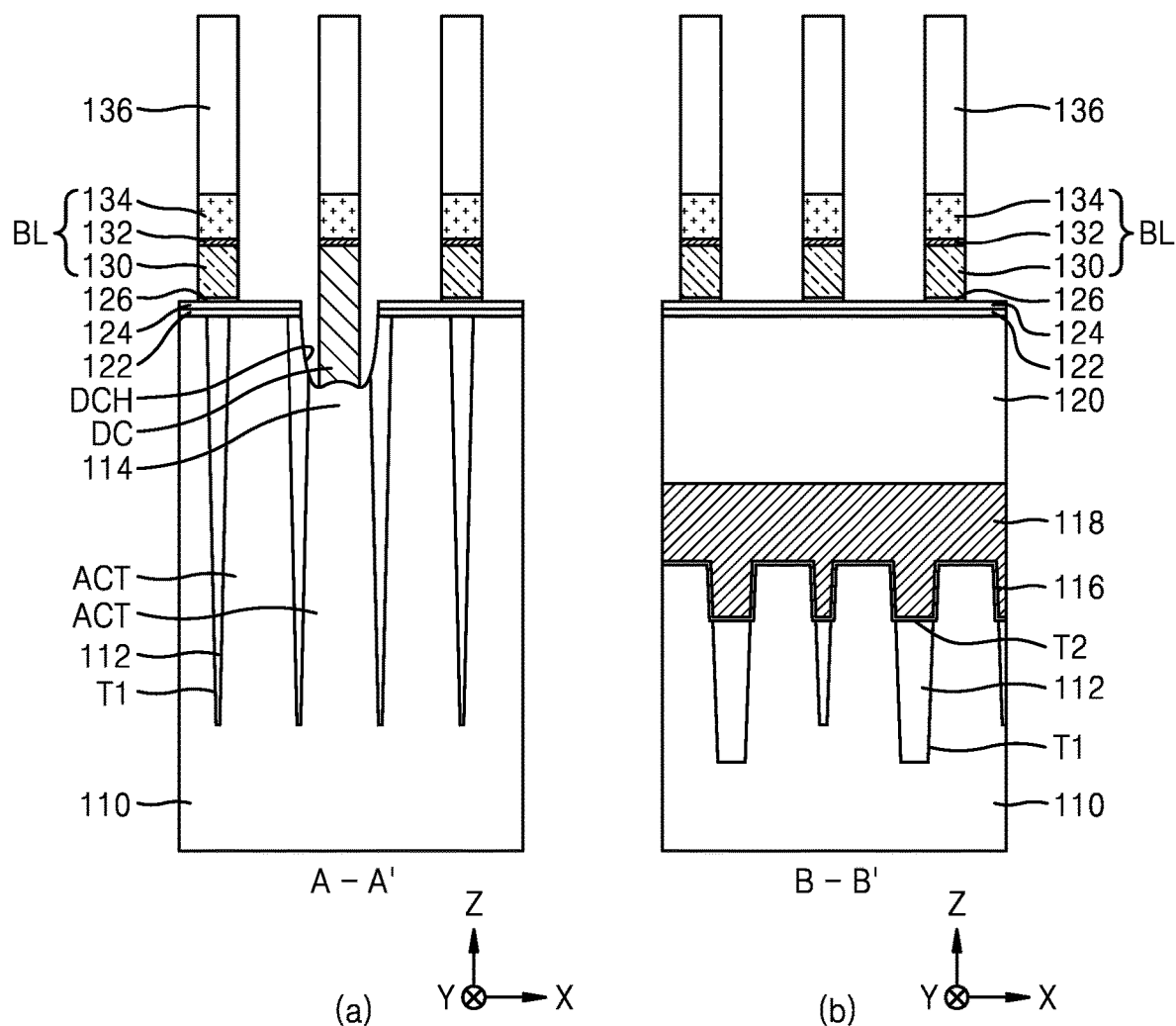
Figure 4G:
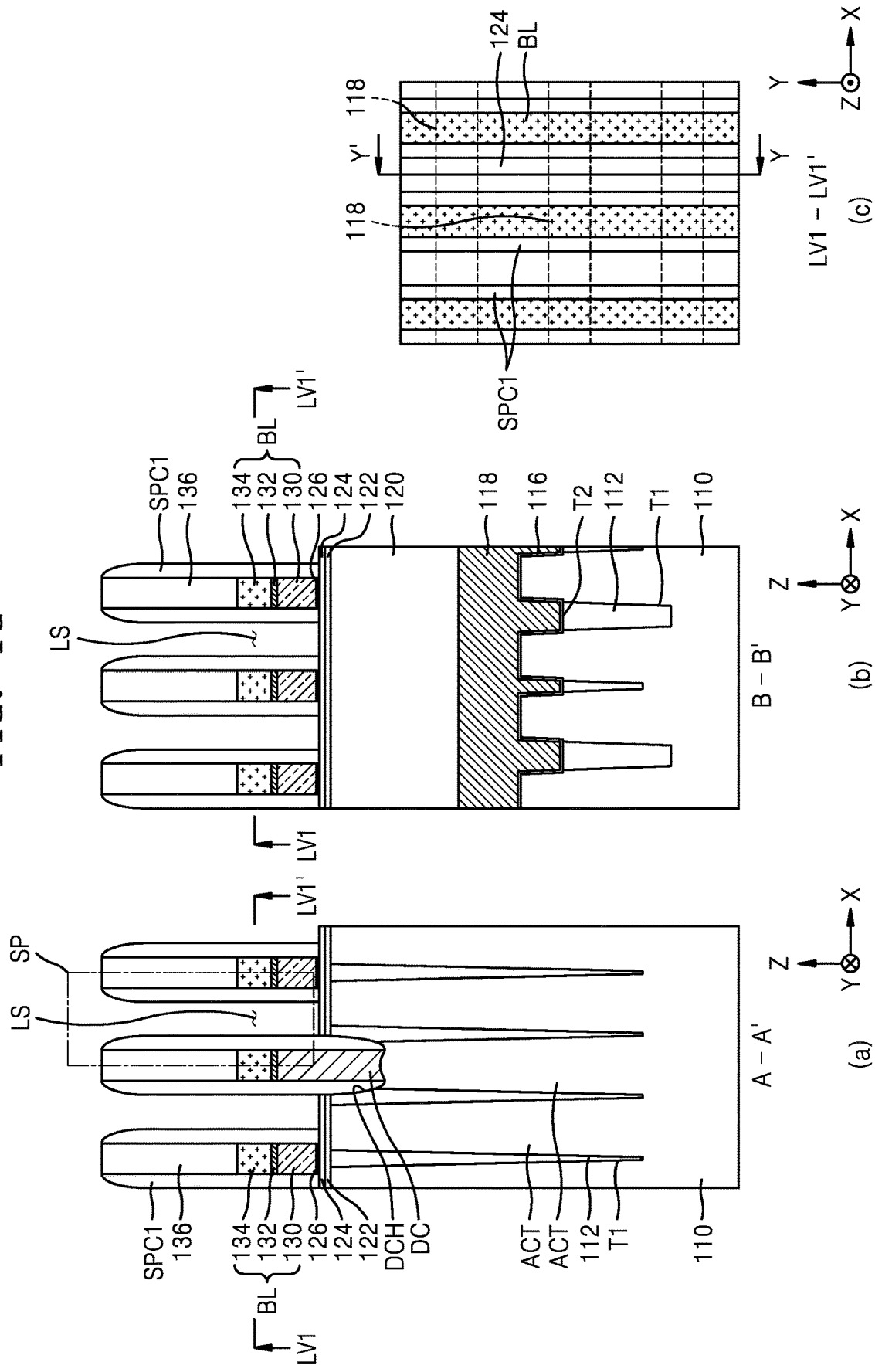
Figure 4H:
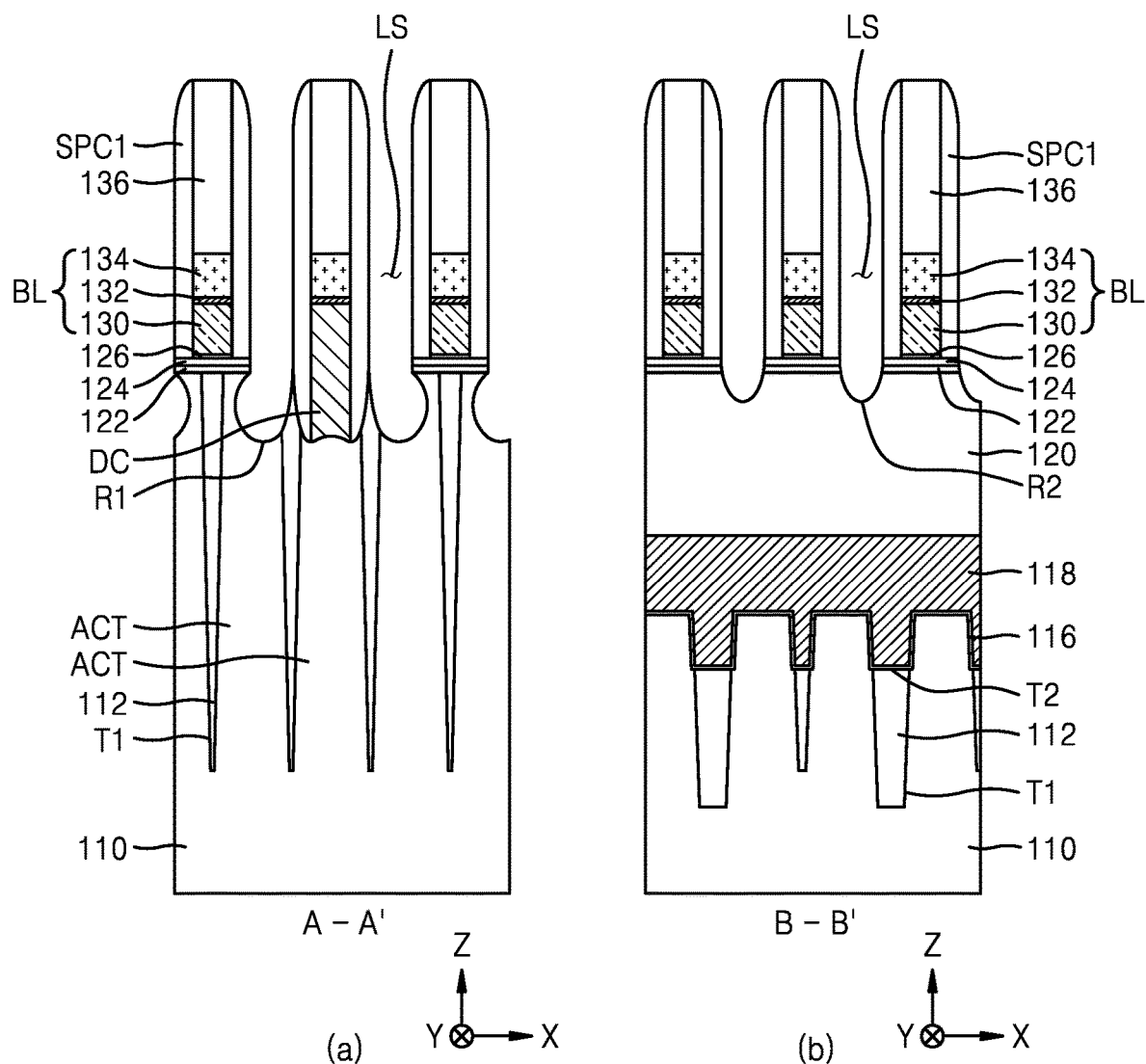
Figure 4I:
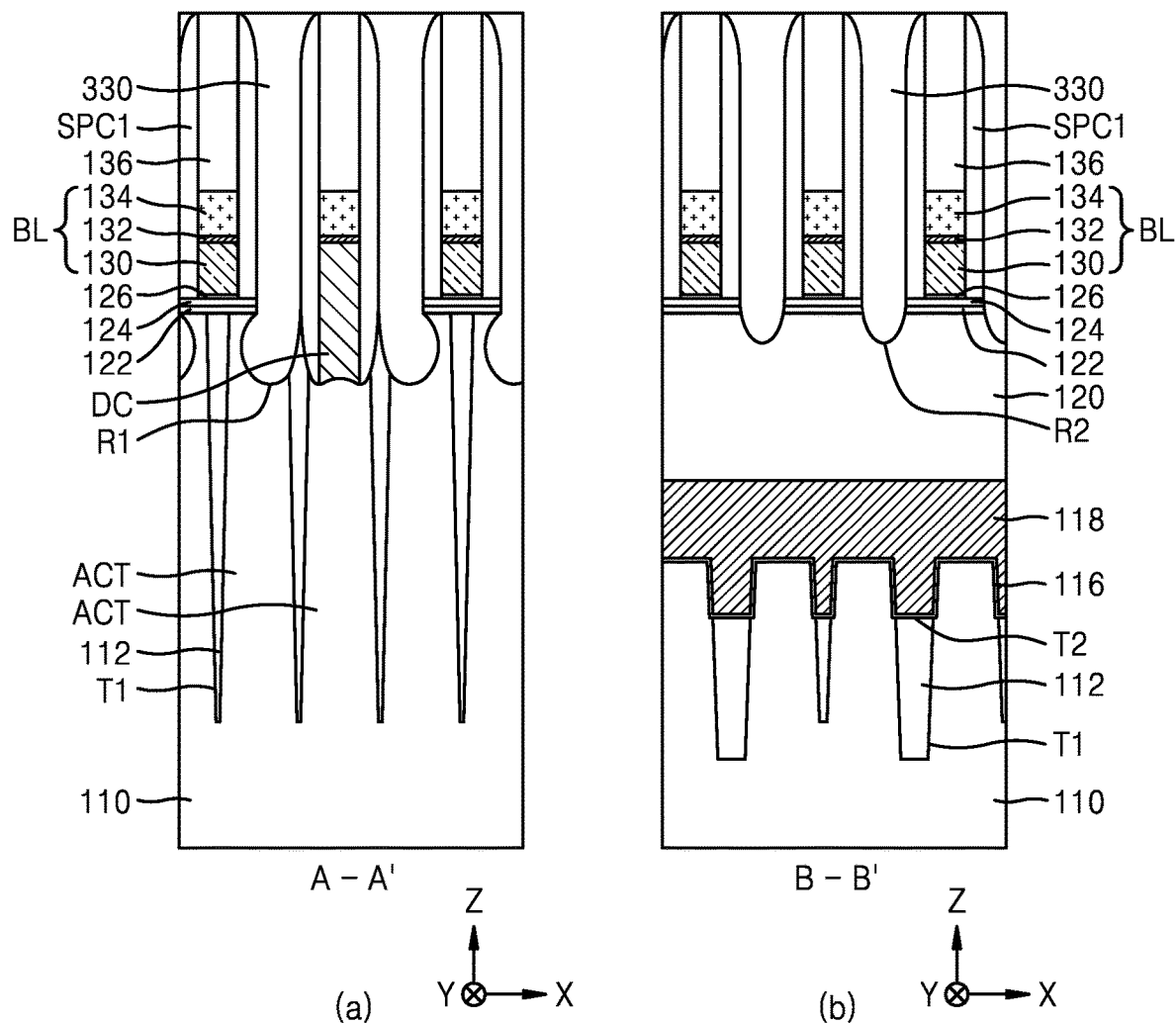
Figure 4J:
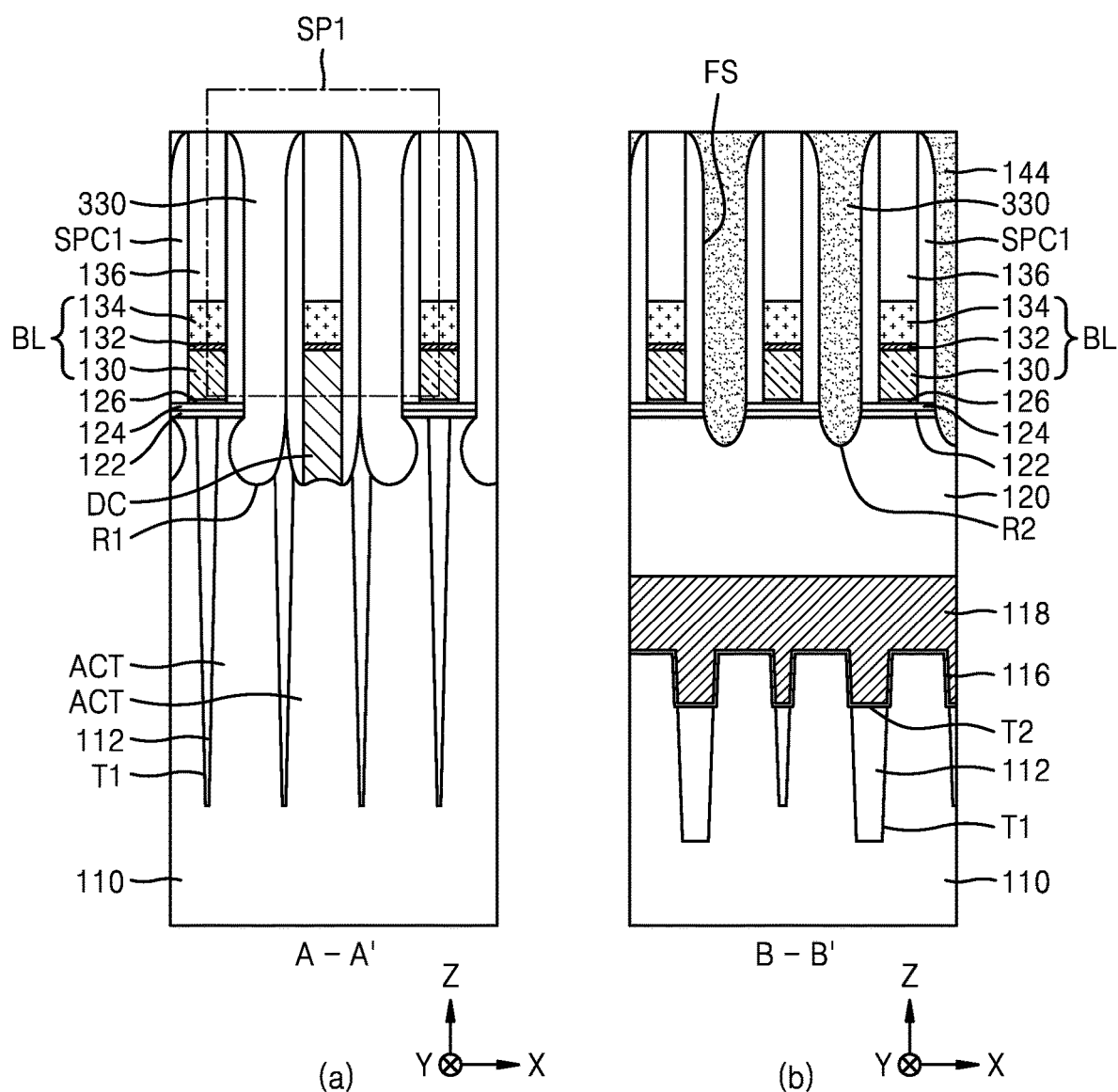
Figure 4L:
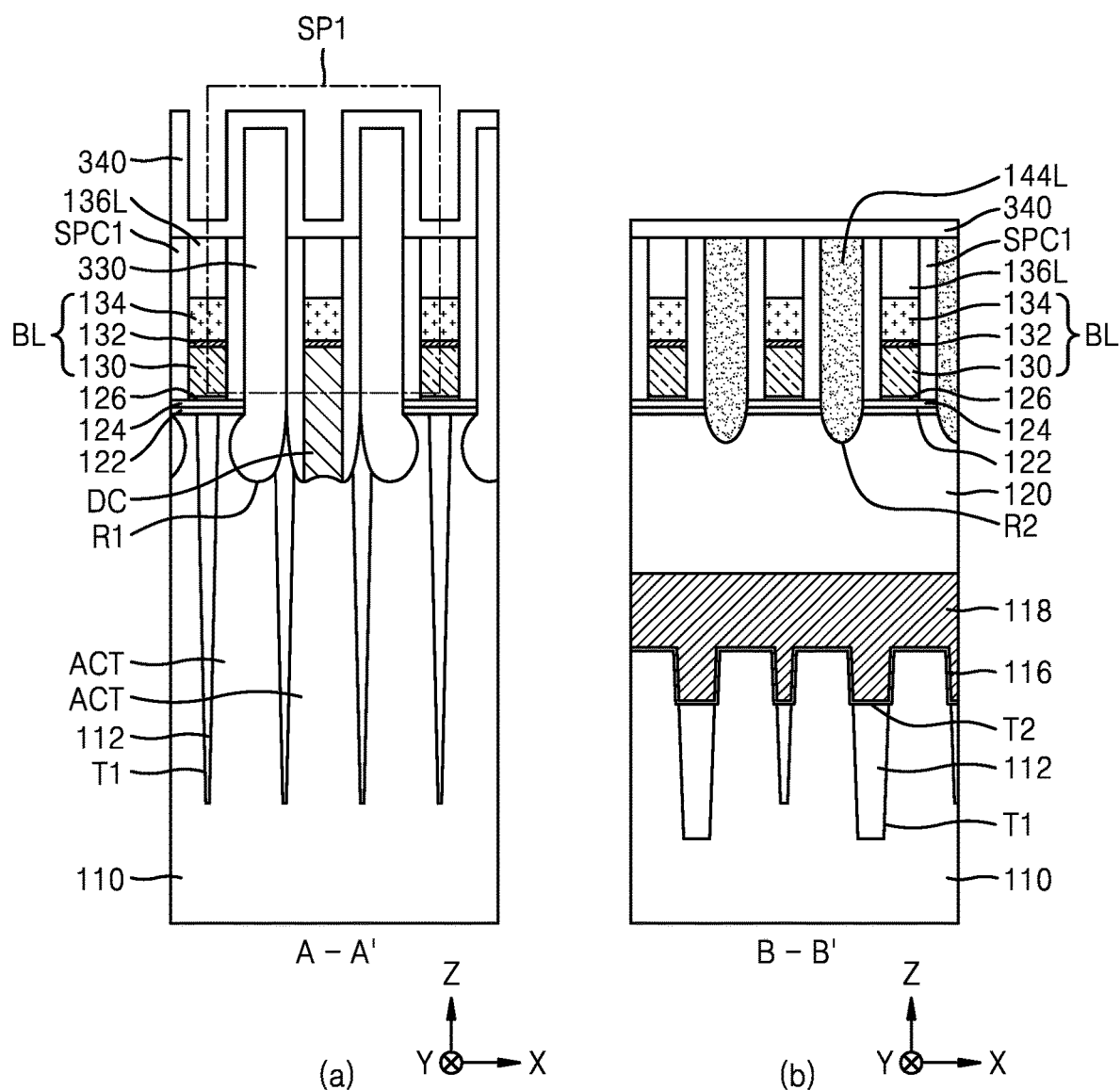
Figure 4M:
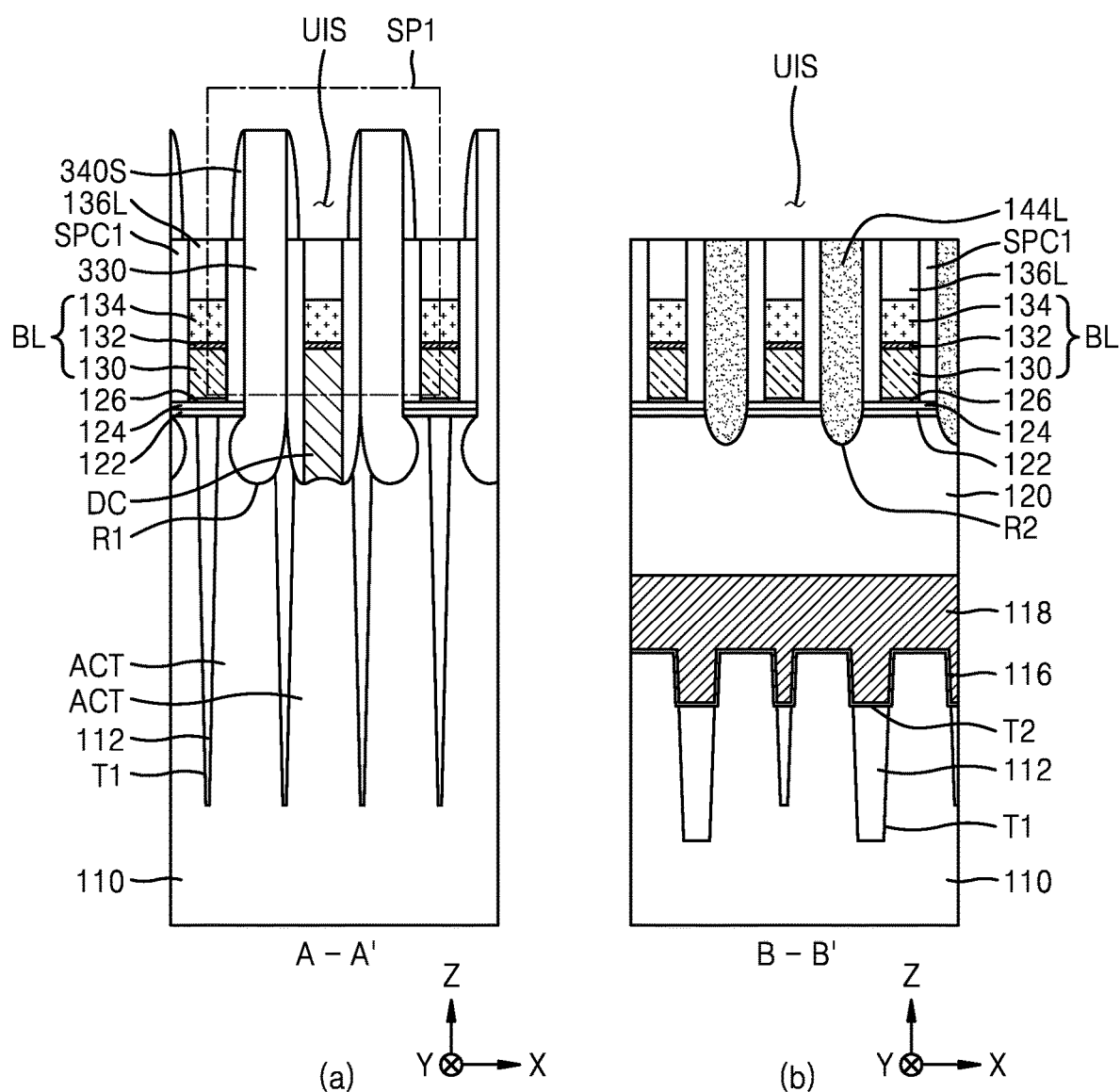
Figure 4N:
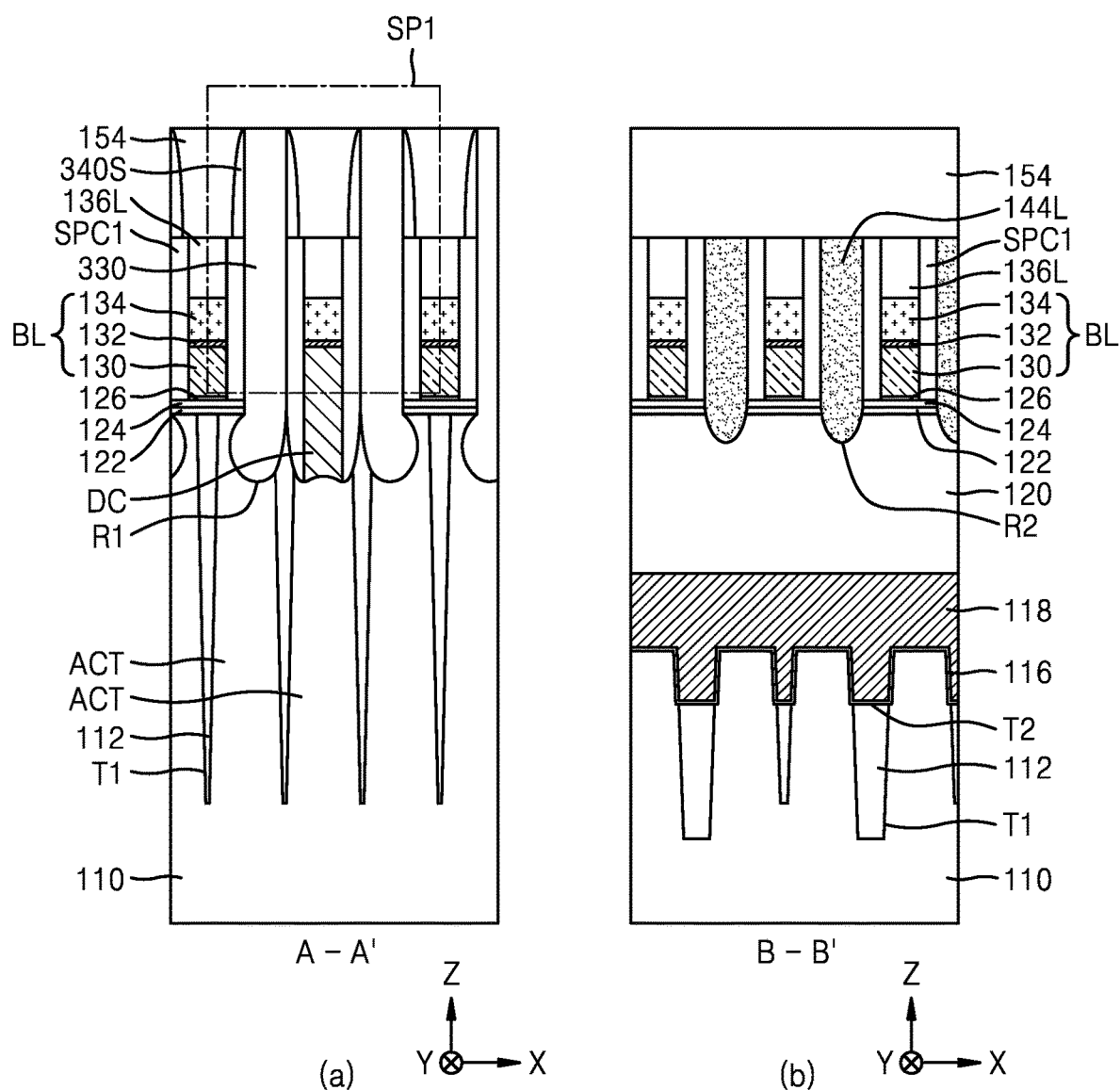
Figure 40:
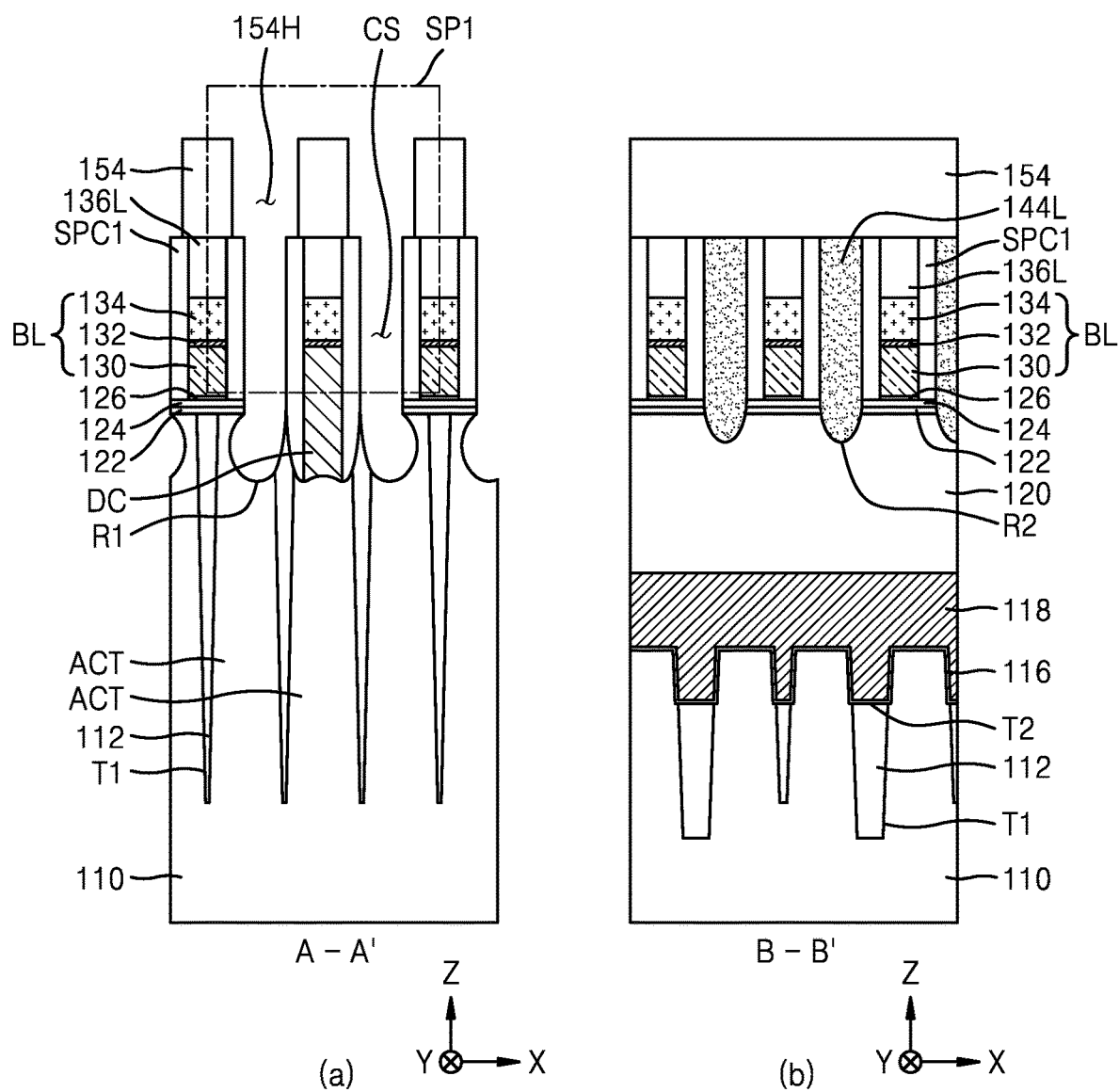
Figure 4P:
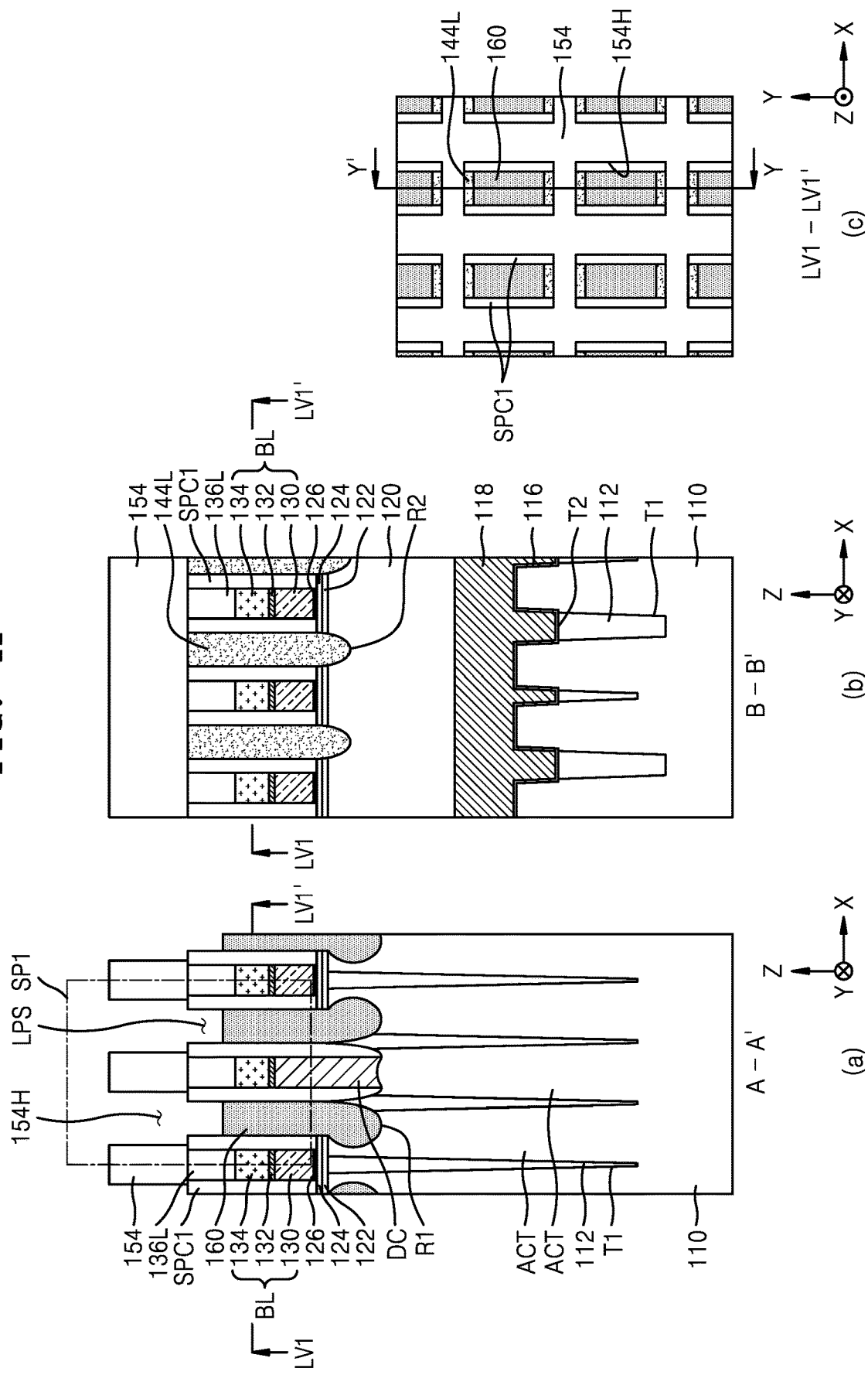
Figure 4Q:
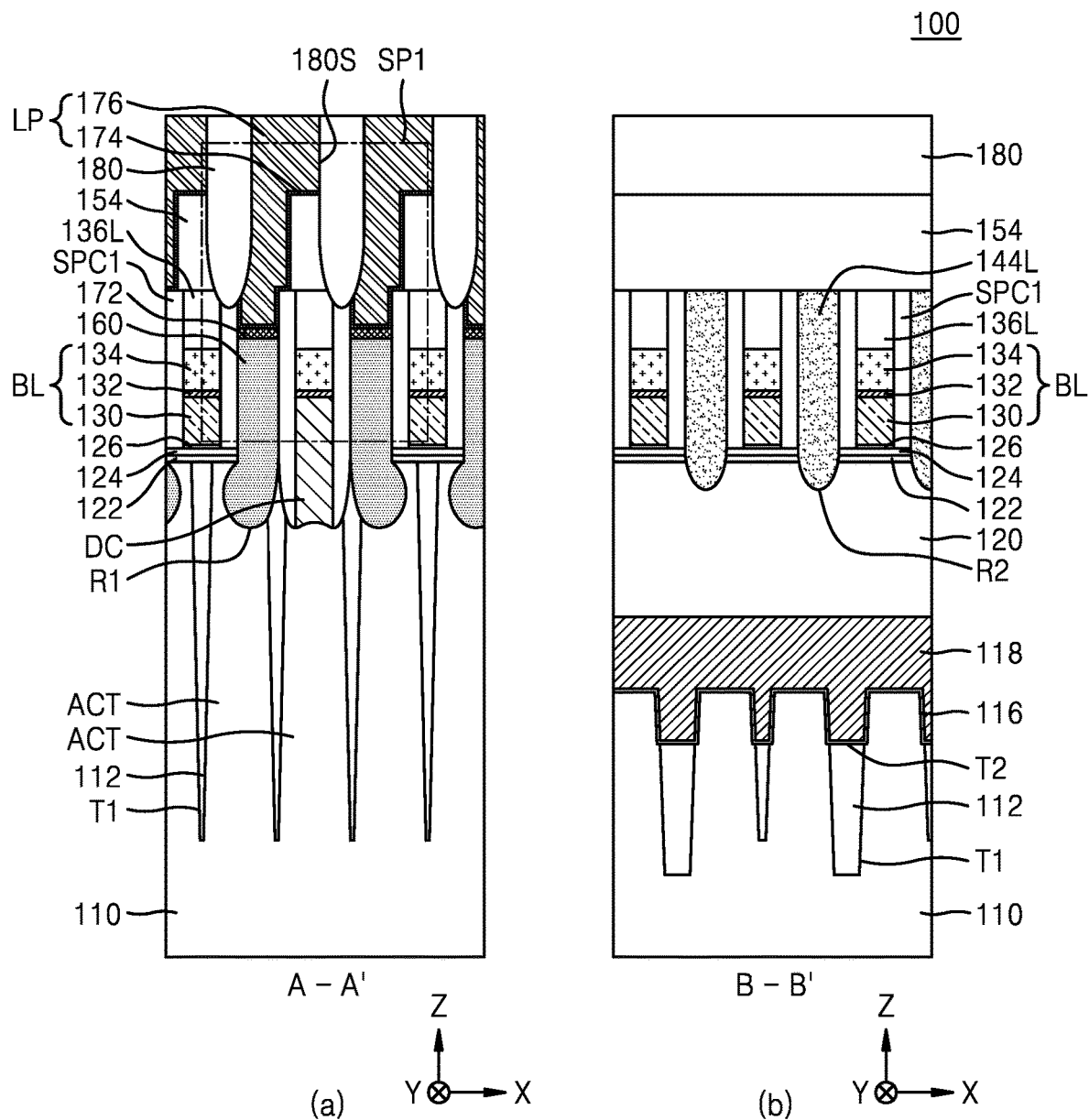

FIGS. 4A through 4Q are cross-sectional views for explaining a method of manufacturing an IC device, according to example embodiments of the inventive concept. In FIGS. 4A through 4Q, (a) is a cross-sectional view of some components of a portion corresponding to the cross-section taken along line A-A' of FIG. 1, and (b) is a cross-sectional view of some components of a portion corresponding to the cross-section taken along line B-B' of FIG. 1. In FIGS. 4G, 4K, and 4P, (c) is a plan view illustrating a planar configuration of some components of a resultant structure obtained in a corresponding process, and may correspond to a planar configuration taken along line LV1-LV1' of (a) and (b).

Cross-sections taken along the line Y-Y' in (c) of FIGS. 4G, 4K, and 4P may correspond to the cross-section taken along the line Y-Y' of FIG. 1.

FIGS. 6A through 6H are cross-sectional views of enlargements of some regions of FIGS. 4J through 4Q, respectively. In FIGS. 6A through 6H, (a-1) is a magnified cross-sectional view of a dashed-dotted line region SP1 in (a) of FIGS. 4J through 4Q, and (a-2) is a magnified cross-sectional view of some components of a portion in the Y direction of the dashed-dotted line region SP1 in (a) of FIGS. 4J through 4Q, for example, a portion corresponding to the cross-section taken along line Y-Y' of FIG. 1.

A method of manufacturing the IC device 100 of FIGS. 2A and 2B will now be described with reference to FIGS. 4A through 4Q and FIGS. 6A through 6H.

Referring to FIG. 4A, an isolation trench T1 is formed in the substrate 110, and an isolation layer 112 is formed in the isolation trench T1. An active region ACT may be defined in the substrate 110 by the isolation layer 112. The isolation layer 112 may include an oxide layer, a nitride layer, or a combination thereof.

A plurality of word line trenches T2 may be formed in the substrate 110. The plurality of word line trenches T2 may extend parallel to each other in the X direction and may have line shapes that extend across the active region ACT. As shown in the cross-sectional view (b) in FIG. 4A, to form the plurality of word line trenches T2 each having a step at a bottom surface thereof, the isolation layer 112 and the substrate 110 may be respectively etched by separate etching processes, and thus have different etch depths. A resultant structure in which the plurality of word line trenches T2 are formed may be cleaned, and then a gate dielectric layer 116, a word line 118, and a buried insulation layer 120 may be formed in this stated order in each of the plurality of word line trenches T2. According to some embodiments, before or after a plurality of word lines 118 are formed, impurity ions may be injected into the substrate 110 at both sides of each of the plurality of word lines 118, thereby forming a plurality of source/drain regions 114 in upper portions of a plurality of active regions ACT.

The gate dielectric layer 116 may include at least one selected from a silicon oxide layer, a silicon nitride layer, a silicon oxynitride layer, oxide/nitride/oxide (ONO), or a high-k dielectric layer having a higher dielectric constant than a silicon oxide layer. For example, the gate dielectric layer 116 may have a dielectric constant of about 10 to about 25. According to some embodiments, the gate dielectric layer 116 may be $HfO_2$, $Al_2O_3$, $HfAlO_3$, $Ta_2O_3$, $TiO_2$, or a combination thereof. Each of the plurality of word lines 118 may be Ti, TiN, Ta, TaN, W, WN, TiSiN, WSiN, or a combination thereof. Each of the plurality of buried insulation layers 120 may be a silicon oxide layer, a silicon nitride layer, a silicon oxynitride layer, or a combination thereof.

A first insulation layer 122, a second insulation layer 124, and a third insulation layer 126 are formed on the plurality of buried insulation layers 120 and the substrate 110 in this stated order.

Referring to FIG. 4B, a lower conductive layer 130 is formed on the third insulation layer 126. The lower conductive layer 130 may include doped polysilicon.

Referring to FIG. 4C, a mask pattern MP1 is formed on the lower conductive layer 130, followed by etching the lower conductive layer 130 exposed via an opening MH of the mask pattern MP1, and then, a portion of the substrate 110 and a portion of the isolation layer 112, which are exposed as a result, are etched, thereby forming a direct contact hole DCH exposing the active region ACT of the substrate 110. The mask pattern MP1 may include an oxide layer, a nitride layer, or a combination thereof. A photolithography process may be used to form the mask pattern MP1.

Referring to FIG. 4D, the mask pattern MP1 (see FIG. 4C) is removed, and a direct contact DC is formed in the direct contact hole DCH.

In an example of a process of forming the direct contact DC, a conductive layer, which has a sufficient thickness to fill the direct contact hole DCH, may be formed in the direct contact hole DCH and on the lower conductive layer 130, and the conductive layer may be etched back such that the conductive layer remains only in the direct contact hole DCH. The conductive layer for forming the direct contact DC may include doped polysilicon, without being limited thereto.

Referring to FIG. 4E, an intermediate conductive layer 132, an upper conductive layer 134, and an insulation capping layer 136A are formed on the lower conductive layer 130 and the direct contact DC in this stated order.

Each of the intermediate conductive layer 132 and the upper conductive layer 134 may be TiN, TiSiN, W, W silicide, or a combination thereof. According to some embodiments, the intermediate conductive layer 132 may be TiSiN, and the upper conductive layer 134 may be W. The insulation capping layer 136A may be a silicon nitride layer.

Referring to FIG. 4F, each of the insulation capping layer 136A, the upper conductive layer 134, the intermediate conductive layer 132, the lower conductive layer 130, and the direct contact DC in a resultant structure of FIG. 4E is partially etched using an etch mask (not shown), thereby forming the plurality of bit lines BL and a plurality of preliminary insulation capping patterns 136 covering the plurality of bit lines BL. The plurality of bit lines BL may include respective remaining portions of the lower conductive layer 130, the intermediate conductive layer 132, and the upper conductive layer 134. Each of the plurality of bit lines BL and the plurality of preliminary insulation capping patterns 136 may be formed in a line pattern extending lengthwise in the Y direction. After the plurality of bit lines BL are formed, the direct contact hole DCH may be partially exposed again around the direct contact DC.

When the lower conductive layer 130 is etched to form the plurality of bit lines BL, the third insulation layer 126 right below the lower conductive layer 130 may also be etched due to excessive etching, and thus only a portion of the third insulation layer 126 covered by the plurality of bit lines BL may remain and an upper surface of the second insulation layer 124 may be exposed at the periphery of the plurality of bit lines BL.

Referring to FIG. 4G, a plurality of insulation spacers SPC1 are formed to cover sidewalls of the plurality of bit lines BL, sidewalls of the plurality of preliminary insulation capping patterns 136, and sidewalls of a plurality of direct contacts DC. The plurality of insulation spacers SPC1 may be formed to fill empty spaces of a plurality of direct contact holes DCH.

Each of the plurality of insulation spacers SPC1 may extend parallel to the plurality of bit lines BL in the Y direction to cover both sidewalls of each of the plurality of bit lines BL. In the plan view (c) of FIG. 4G, the plurality of word lines 118 are marked by dashed lines for better understanding.

FIGS. 5A through 5D are cross-sectional views illustrating sequential processes of a method of forming the plurality of insulation spacers SPC1 shown in FIG. 4G. In FIGS. 5A through 5D, a region corresponding to a dashed-dotted-line region SP in FIG. 4G is enlarged and illustrated.

Figure 5A:
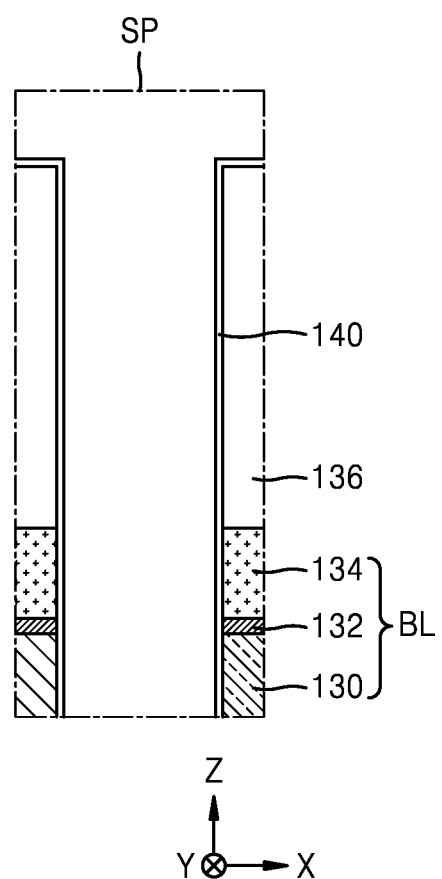
FIGS. 5A through 5D are cross-sectional views illustrating sequential processes of a method of forming a plurality of insulation spacers shown in FIG. 4G.

Referring to FIGS. 4G and 5A, an insulation liner 140 is formed on the entire surface of a resultant structure of FIG. 4F to conformally cover exposed surfaces of the plurality of bit lines BL, exposed surfaces of the plurality of preliminary insulation capping patterns 136, exposed surfaces of the plurality of direct contacts DC, and an exposed surface of the second insulation layer 124 in the resultant structure of FIG. 4F. The insulation liner 140 may be a silicon nitride layer.

Figure 5B:
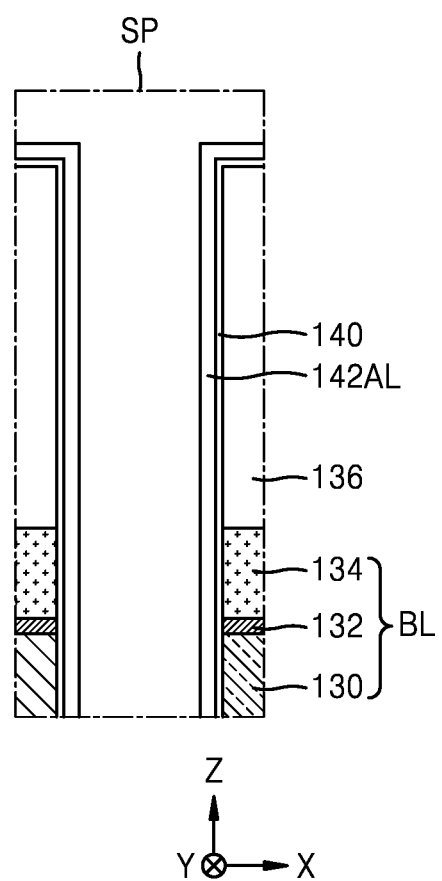

Referring to FIG. 5B, a lower insulation buried pattern (not shown) is formed on the insulation liner 140 to fill remaining spaces of the direct contact holes DCH and at the same time cover respective sidewalls of the plurality of direct contacts DC, and then a first insulation spacer layer 142AL covering the lower insulation buried pattern and a sidewall of the insulation liner 140 is formed. The first insulation spacer layer 142AL may cover the plurality of bit lines BL, the plurality of preliminary insulation capping patterns 136, the plurality of direct contacts DC, and the second insulation layer 124 with the insulating liner 140 therebetween. The first insulation spacer layer 142AL may be a silicon oxide layer.

Figure 5C:
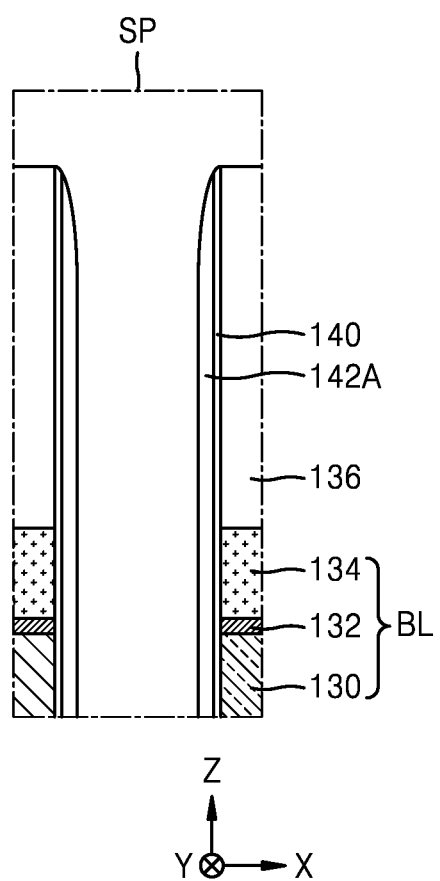

Referring to FIG. 5C, a plurality of first insulation spacers 142A covering respective both sidewalls of the plurality of bit lines BL are formed by etching back the first insulation spacer layer 142AL in a resultant structure of FIG. 5B. While the first insulation spacer layer 142AL is being etched back, the insulation liner 140 may also be partially removed on the second insulation layer 124 (see FIG. 4G) due to excessive etching. The insulation liner 140 may remain between each bit line BL and each first insulation spacer 142A, and between each preliminary insulation capping pattern 136 and the first insulation spacers 142A.

Figure 5D:
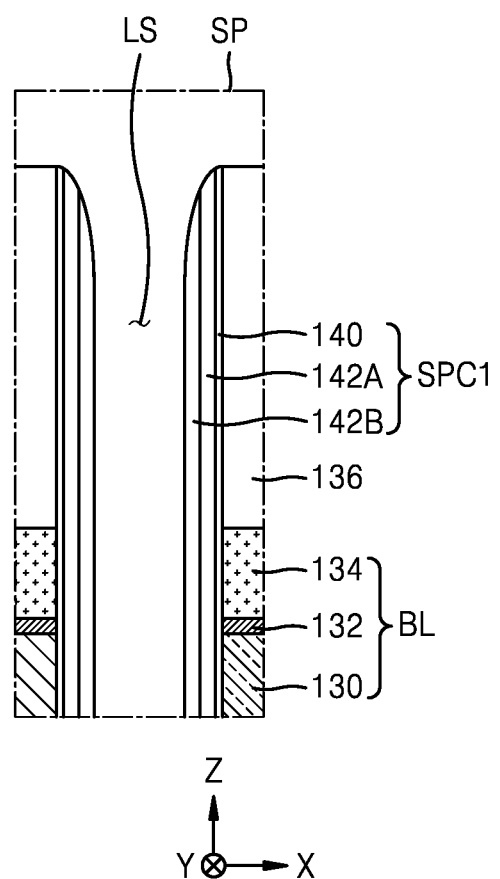

Referring to FIG. 5D, a plurality of second insulation spacers 142B are formed on the plurality of first insulation spacers 142A by using a process similar to the process of forming the plurality of first insulation spacers 142A, thereby obtaining the plurality of insulation spacers SPC1. Each of the plurality of second insulation spacers 142B may be a silicon nitride layer.

Referring back to FIG. 4G, after the plurality of insulation spacers SPC1 are formed, each line space LS extending in the Y direction may be defined on the second insulation layer 124 between a plurality of line structures including the plurality of bit lines BL and the plurality of preliminary insulation capping patterns 136.

Referring to FIG. 4H, structures exposed via the plurality of insulation spacers SPC1 within the plurality of line spaces LS are partially removed, thereby forming a plurality of first recess spaces R1 exposing active regions ACT of the substrate 110 between the plurality of bit lines BL and a plurality of second recess spaces R2 exposing the plurality of buried insulation layers 120 between the plurality of bit lines BL.

According to some embodiments, the plurality of first recess spaces R1 and the plurality of second recess spaces R2 may be formed via anisotropic etching, isotropic etching, or a combination thereof. The active regions ACT may be exposed via lower surfaces of the plurality of first recess spaces R1, and the buried insulation layers 120 may be exposed via lower surfaces of the plurality of second recess spaces R2.

Referring to FIG. 4I, a plurality of sacrificial layers 330 are formed between the plurality of bit lines BL to fill the plurality of line spaces LS.

The plurality of sacrificial layers 330 may include a material having a different etch selectivity from the plurality of preliminary insulation capping patterns 136. For example, the plurality of preliminary insulation capping patterns 136 may be a silicon nitride layer, and the plurality of sacrificial layers 330 may be a silicon oxide layer. However, the inventive concept is not limited thereto.

Referring to FIG. 4J, a plurality of insulation fence spaces FS are formed between the plurality of bit lines BL by removing respective portions of the plurality of sacrificial layers 330 that cover the plurality of buried insulation layers 120. As a result, the buried insulation layers 120 may be exposed at the lower surfaces of the plurality of second recess spaces R2 via the plurality of the insulation fence spaces FS. Thereafter, a plurality of preliminary insulation fences 144 are formed to fill the plurality of second recess spaces R2 and the plurality of insulation fence spaces FS.

Figure 6A:
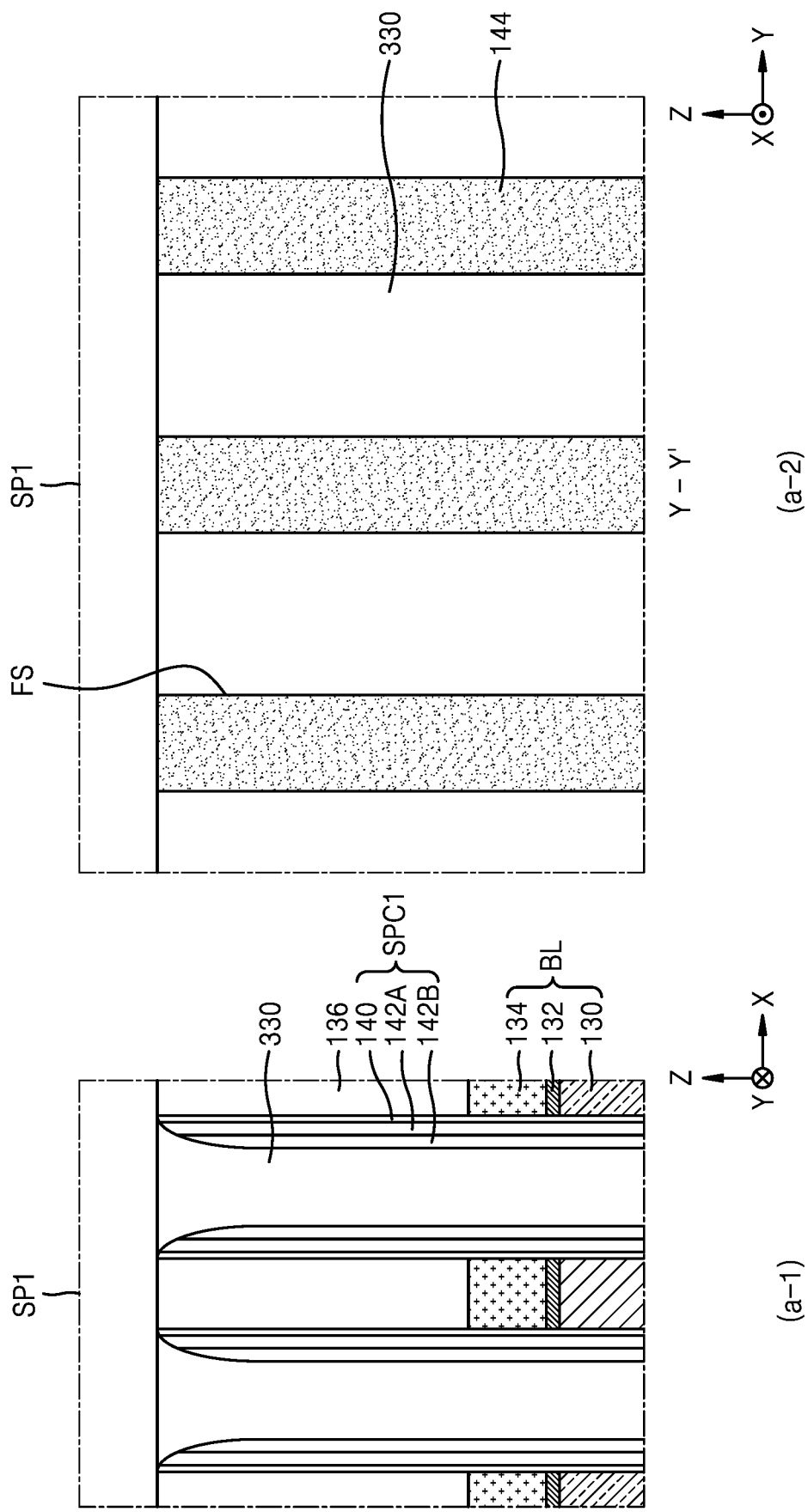

FIG. 6A is a cross-sectional view of an enlargement of some regions of a resultant structure of FIG. 4J.

Referring to FIGS. 4J and 6A, upper surfaces of the plurality of preliminary insulation capping patterns 136, upper surfaces of the plurality of sacrificial layers 330, and upper surfaces of the plurality of preliminary insulation fences 144 may each extend on substantially the same level. A material used to form the plurality of preliminary insulation fences 144 may have the same or similar etch selectivity as or to a material used to form the plurality of preliminary insulation capping patterns 136 and may have a different etch selectivity from a material used to form the plurality of sacrificial layers 330. For example, the plurality of sacrificial layers 330 may be a silicon oxide layer and the plurality of preliminary insulation fences 144 and the plurality of preliminary insulation capping patterns 136 may be silicon nitride layers. However, the inventive concept is not limited thereto.

Referring to FIG. 4K, a plurality of lower insulation capping patterns 136L and a plurality of lower insulation fences 144L are formed by removing the upper surfaces of the plurality of preliminary insulation capping patterns 136 and the upper surfaces of the plurality of preliminary insulation fences 144 around the plurality of sacrificial layers 330 by a certain thickness. To this end, an etch process using a difference between the etch selectivity of the plurality of sacrificial layers 330 and that of the plurality of preliminary insulation capping patterns 136 and the plurality of preliminary insulation fences 144 may be performed.

Figure 6B:
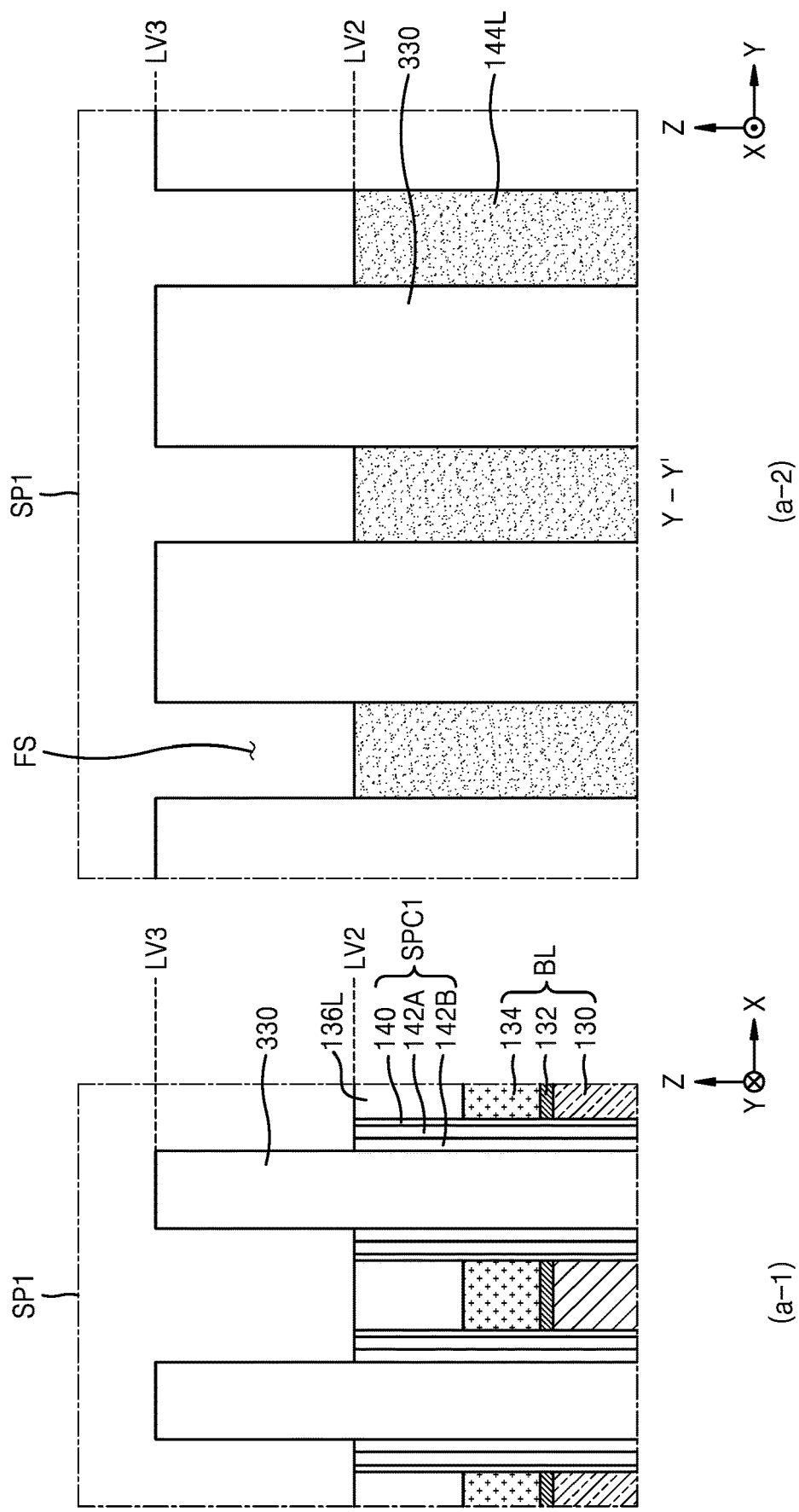

FIG. 6B is a cross-sectional view of an enlargement of some regions of a resultant structure of FIG. 4K.

Referring to FIGS. 4K and 6B, an upper surface level LV2 of each of the plurality of lower insulation capping patterns 136L and the plurality of lower insulation fences 144L may be lower than an upper surface level LV3 of the plurality of sacrificial layers 330.

According to some example embodiments, during an etch process for removing each of the plurality of preliminary insulation capping patterns 136 and the plurality of preliminary insulation fences 144 by a certain thickness in order to form the plurality of lower insulation capping patterns 136L and the plurality of lower insulation fences 144L, the plurality of insulation spacers SPC1 may also be removed by a certain thickness from each of their upper surfaces, and thus may have reduced heights. According to some example embodiments, after each of the plurality of insulation spacers SPC1 is removed by a certain thickness, an upper surface level of the plurality of insulation spacers SPC1 may be almost the same as or similar to the upper surface level LV2 of the plurality of lower insulation capping patterns 136L.

According to some example embodiments, when each of the plurality of insulation spacers SPC1 includes the insulation liner 140, the first insulation spacer 142A, and the second insulation spacer 142B as illustrated in FIG. 5D, the insulation liner 140 and the second insulation spacer 142B may include the same or similar material as or to the plurality of preliminary insulation capping patterns 136, and the first insulation spacer 142A may include the same or similar material as or to the plurality of sacrificial layers 330. In this case, because the first insulation spacer 142A has a relatively small thickness, while an upper portion of each of the insulation liner 140 and the second insulation spacer 142B is partially being removed together with respective upper portions of the plurality of preliminary insulation capping patterns 136, an upper portion of the first insulation spacer 142A may also be partially removed and thus have a reduced height.

While an etch process for forming the plurality of lower insulation capping patterns 136L and the plurality of lower insulation fences 144L is being performed, upper protrusions of the plurality of sacrificial layers 330 that are exposed under the etching atmosphere may be partially consumed. Accordingly, after the plurality of lower insulation capping patterns 136L and the plurality of lower insulation fences 144L are formed, a cross-section profile of each of the plurality of sacrificial layers 330 may have a different shape from that of each of the plurality of sacrificial layers 330 before the plurality of lower insulation capping patterns 136L and the plurality of lower insulation fences 144L are formed. After the plurality of lower insulation capping patterns 136L and the plurality of lower insulation fences 144L are formed, an obtained resultant structure may be cleaned.

Referring to FIG. 4L, a sacrificial spacer layer 340 is formed on the entire surface of a resultant structure on which the plurality of lower insulation capping patterns 136L and the plurality of lower insulation fences 144L are formed.

Figure 6C:
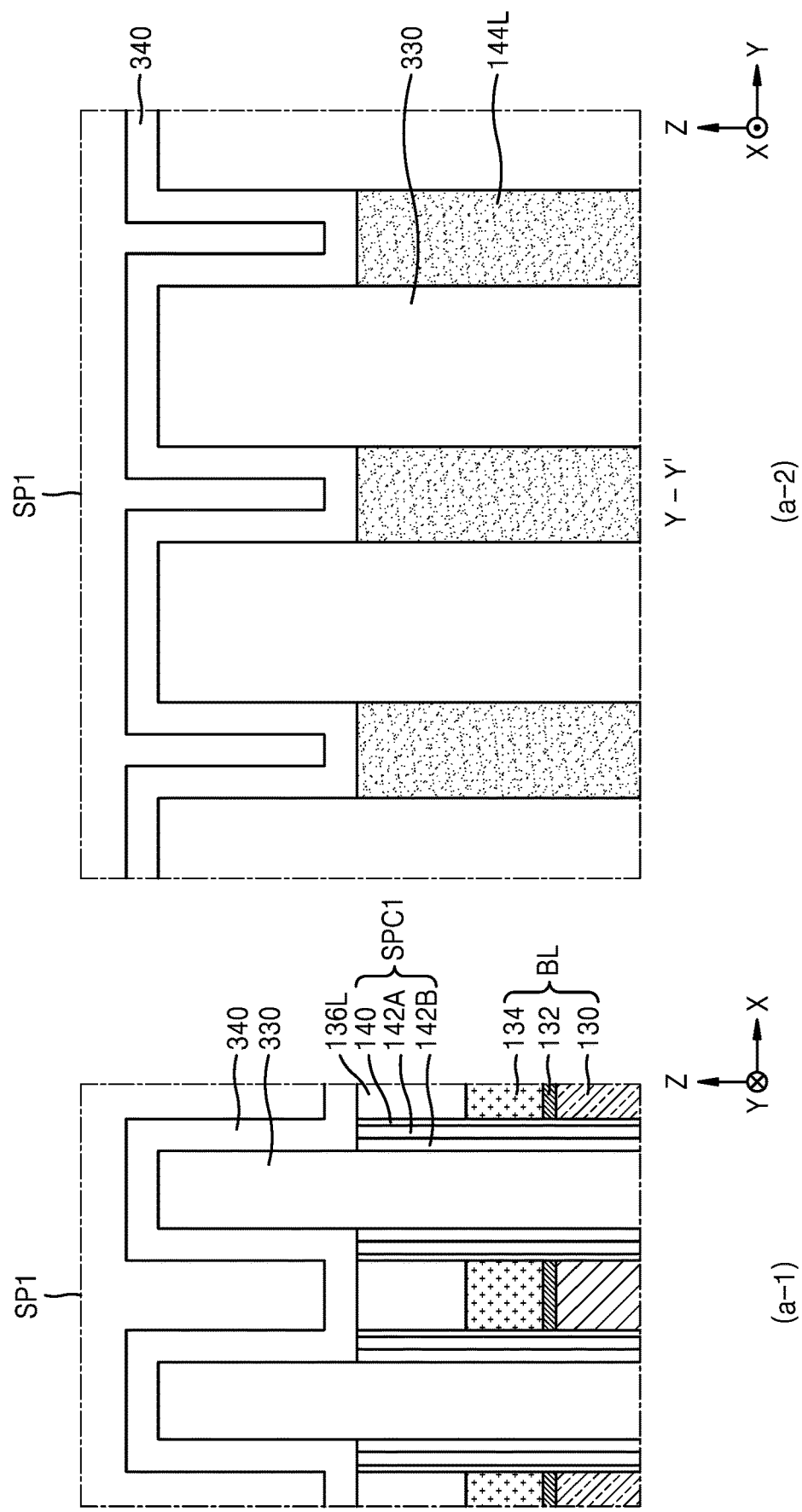

FIG. 6C is a cross-sectional view of an enlargement of some regions of a resultant structure of FIG. 4L.

Referring to FIGS. 4L and 6C, the sacrificial spacer layer 340 may extend to conformally cover exposed surfaces of the plurality of lower insulation capping patterns 136L, exposed surfaces of the plurality of lower insulation fences 144L, and exposed surfaces of the plurality of insulation spacers SPC1 in the result structure of FIG. 4K. The sacrificial spacer layer 340 may include the same or similar material as or to the plurality of sacrificial layers 330, for example, silicon oxide.

Referring to FIG. 4M, the sacrificial spacer layer 340 is etched back to form a plurality of sacrificial spacers 340S covering upper sidewalls of the plurality of sacrificial layers 330.

Figure 6D:
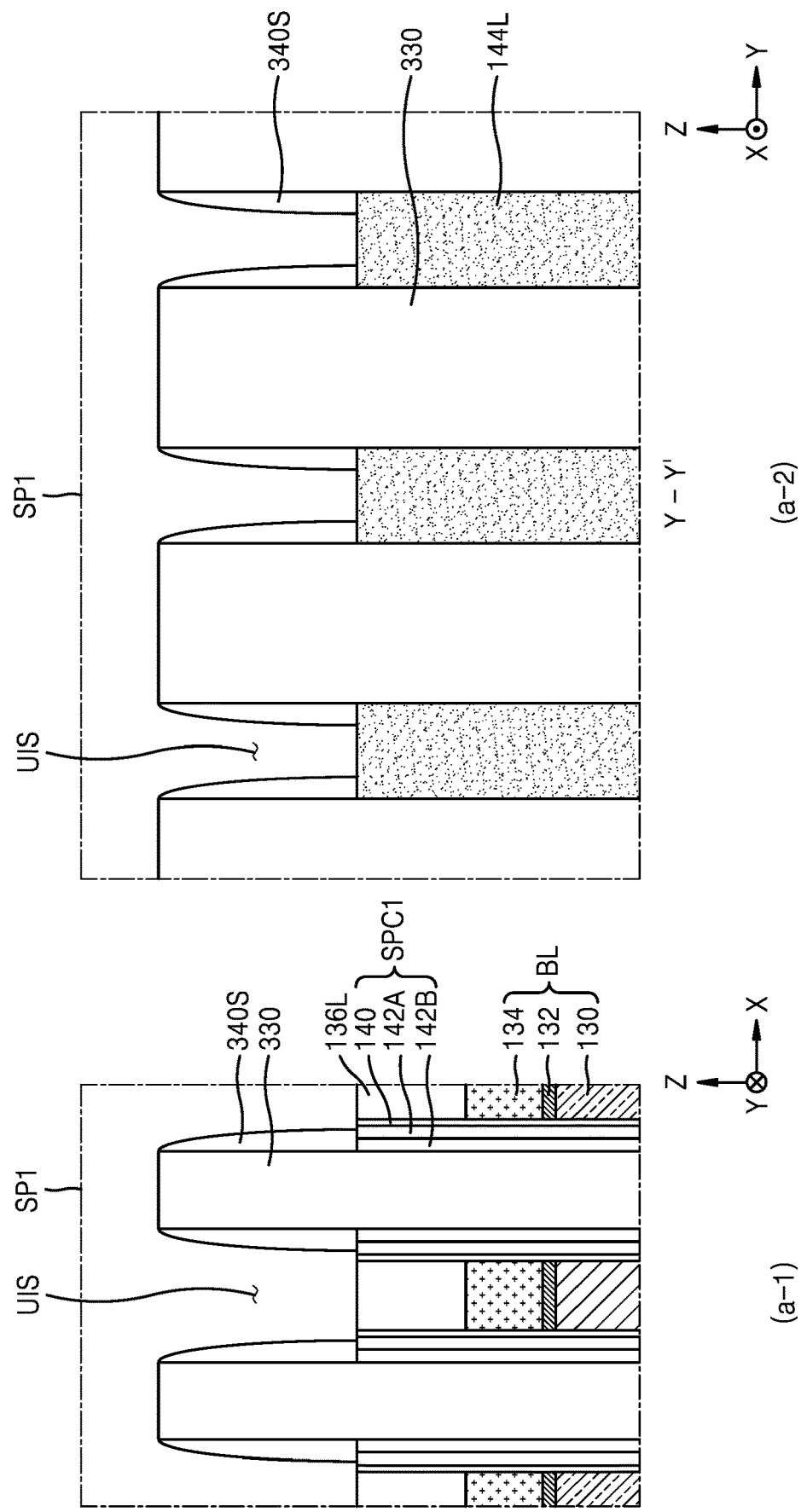

FIG. 6D is a cross-sectional view of an enlargement of some regions of a resultant structure of FIG. 4M.

Referring to FIGS. 4M and 6D, after the plurality of sacrificial spacers 340S are formed, an upper insulation space UIS that exposes upper surfaces of the plurality of lower insulation capping patterns 136L and upper surfaces of the plurality of lower insulation fences 144L may be defined by the plurality of sacrificial spacers 340S. The upper insulation space UIS may have a mesh structure along a plane (for example, an X-Y plane).

Referring to FIG. 4N, the upper insulation fence 154 is formed to fill the upper insulation space UIS of FIG. 4M.

Figure 6E:
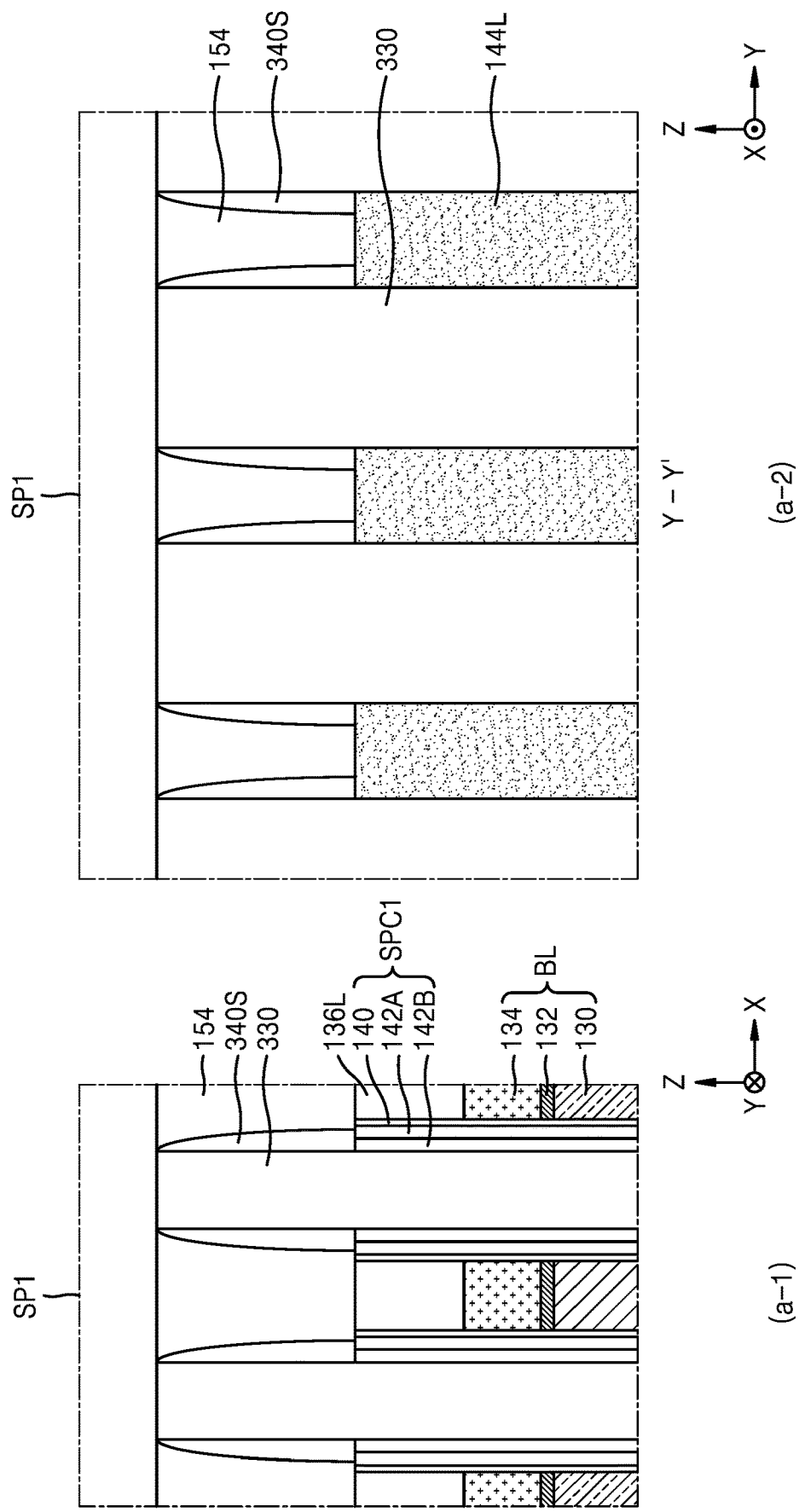

FIG. 6E is a cross-sectional view of an enlargement of some regions of a resultant structure of FIG. 4N.

Referring to FIGS. 4N and 6E, the upper insulation fence 154 may cover the upper surfaces of the plurality of lower insulation capping patterns 136L, the upper surfaces of the plurality of lower insulation fences 144L, and the upper surfaces of the plurality of insulation spacers SPC1. The upper insulation fence 154 may have a mesh structure along a plane (for example, an X-Y plane).

The upper insulation fence 154 may be a different material from materials used to form the plurality of sacrificial layers 330 and the plurality of sacrificial spacers 340S. The upper insulation fence 154 may be a material having the same or similar etch selectivity as or to the material used to form the plurality of lower insulation fences 144L. For example, the upper insulation fence 154 may be silicon nitride, SiCN, SiBN, or a combination thereof.

To form the upper insulation fence 154, an insulation layer with a thickness sufficient to fill the upper insulation space UIS may be formed on the result structure of FIG. 4M, and then an upper portion of the insulation layer may be removed a certain thickness to expose the respective upper surfaces of the plurality of sacrificial layers 330. The upper insulation fence 154 may have a planarized upper surface.

Referring to FIG. 4O, a plurality of contact spaces CS are formed by selectively removing the plurality of sacrificial layers 330 and the plurality of sacrificial spacers 340S from a resultant structure of FIG. 4N.

Figure 6F:
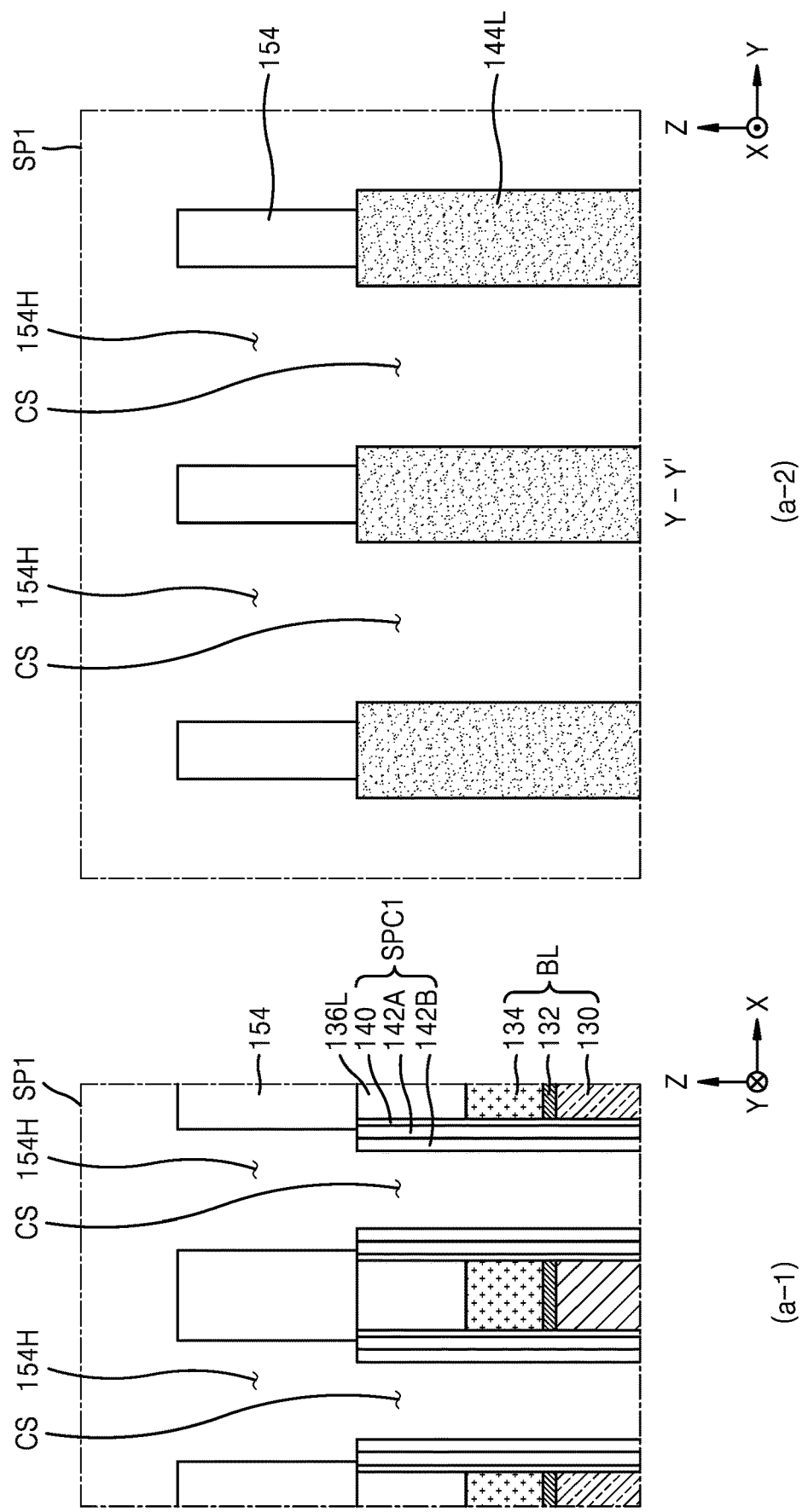

FIG. 6F is a cross-sectional view of an enlargement of some regions of a resultant structure of FIG. 4O.

Referring to FIGS. 4O and 6F, a wet etch process may be used to selectively remove the plurality of sacrificial layers 330 and the plurality of sacrificial spacers 340S. While the plurality of sacrificial layers 330 and the plurality of sacrificial spacers 340S are being selectively removed, upper protrusions of the upper insulation fence 154 that are exposed under the wet etching atmosphere may be partially consumed. Accordingly, a cross-section profile of the upper insulation fence 154 after the plurality of contact spaces CS are formed may have a different shape from that before the plurality of sacrificial layers 330 and the plurality of sacrificial spacers 340S are removed. The upper insulation fence 154 may include a plurality of holes 154H that communicate with the plurality of contact spaces CS. For example, the plurality of holes 154H may be connected with or open to the plurality of contact spaces CS.

Referring to FIG. 4P, the plurality of conductive plugs 160 are formed to fill the plurality of first recess spaces R1 and also fill portions of the plurality of contact spaces CS between the plurality of bit lines BL.

Figure 6G:
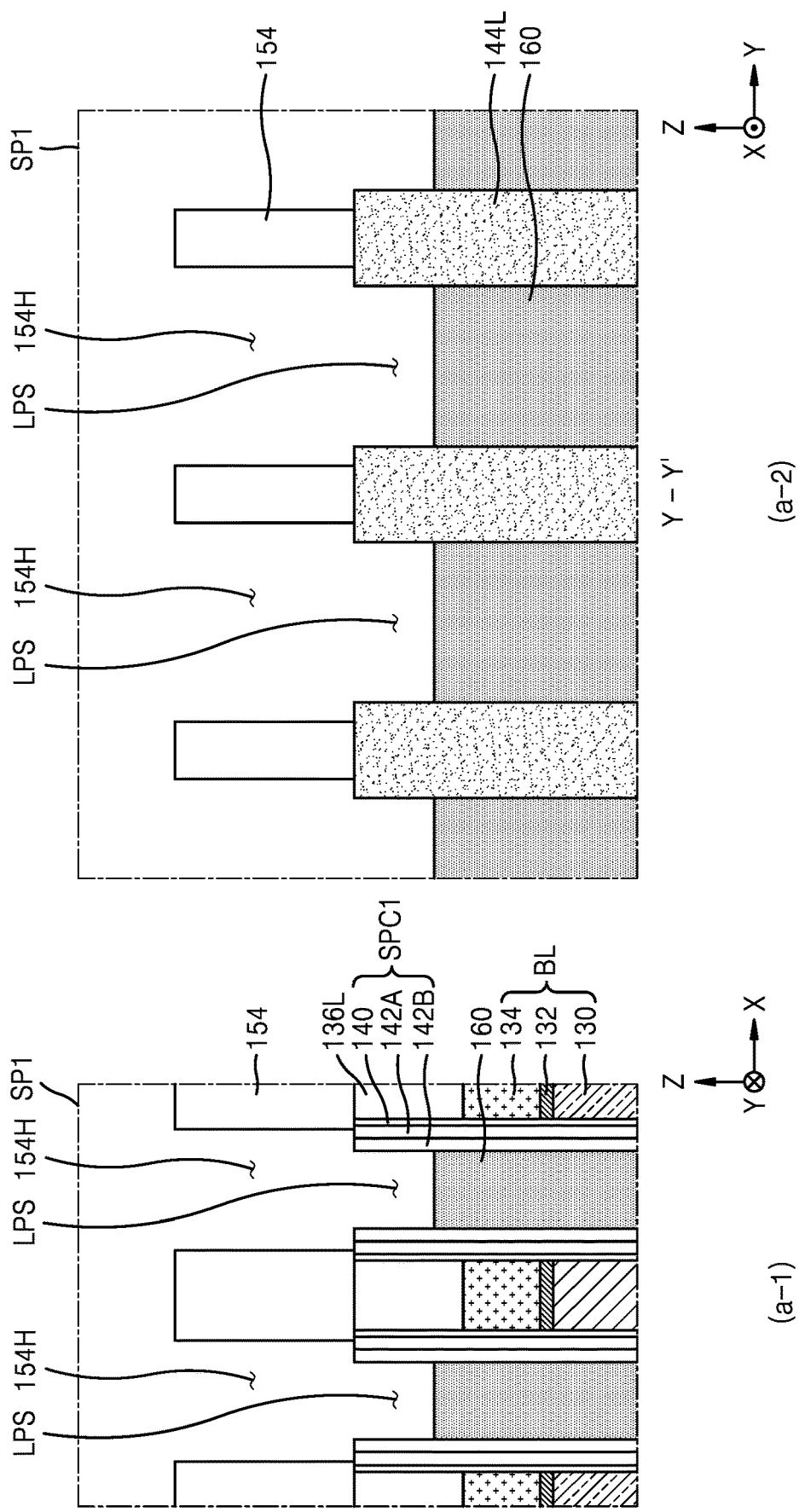

FIG. 6G is a cross-sectional view of an enlargement of some regions of a resultant structure of FIG. 4P.

Referring to FIGS. 4P and 6G, to form the plurality of conductive plugs 160, a conductive layer filling the plurality of first recess spaces R1 and the plurality of contact spaces CS and covering the upper surface of the upper insulation fence 154 in a resultant structure of FIG. 4O is formed, and then an upper portion of the conductive layer is partially removed via etch back, and thus the upper insulation fence 154 may be exposed and respective upper spaces of the plurality of contact spaces CS on the entrance side may be emptied again. Because a width in the horizontal direction of each of the plurality of holes 154H formed in the upper insulation fence 154 is greater than that of each of the plurality of contact spaces CS, deposition for forming a plurality of conductive plugs 160 within the plurality of contact spaces CS may be relatively smoothly performed, and a plurality of conductive plugs 160 having an excellent buried structure may be obtained. The plurality of conductive plugs 160 may include doped polysilicon. A landing pad space LPS may remain on an upper surface of each of the plurality of conductive plugs 160. The plurality of holes 154H formed in the upper insulation fence 154 may communicate with the plurality of landing pad spaces LPS. For example, the plurality of holes 154H may be connected with or open to the plurality of landing pad spaces LPS.

Referring to FIG. 4Q, a plurality of metal silicide layers 172 are formed on the plurality of conductive plugs 160 exposed via the plurality of holes 154H (see FIG. 4P) formed in the upper insulation fence 154, and the plurality of conductive landing pads LP are formed on the plurality of metal silicide layers 172 to fill the plurality of landing pad spaces LPS and the plurality of holes 154H formed in the upper insulation fences 154.

FIG. 6H is a cross-sectional view of an enlargement of some regions of a resultant structure of FIG. 4Q.

Referring to FIGS. 4Q and 6H, the plurality of conductive landing pads LP may extend over the plurality of bit lines BL and the upper insulation fence 154 such as to vertically overlap portions of the plurality of bit lines BL and a portion of the upper insulation fence 154. Each of the plurality of conductive landing pads LP may include a conductive barrier layer 174 and a conductive layer 176.

To form the plurality of conductive landing pads LP, after the conductive barrier layers 174 and the conductive layers 176 are sequentially formed to cover a resultant structure on which the metal silicide layers 172 are formed, a mask pattern (not shown) exposing respective portions of the conductive layers 176 may be formed on the conductive layers 176, and the conductive layers 176, the conductive barrier layers 174, and insulation layers around the conductive barrier layers 174 and the conductive layers 176 may be etched using the mask pattern as an etch mask. The plurality of conductive landing pads LP include remaining portions of the conductive barrier layers 174 and the conductive layers 176. The mask pattern may include, but is not limited to, a hard mask including a nitride layer, an oxide layer, a polysilicon layer, or a combination thereof.

The plurality of conductive landing pads LP may be formed as a plurality of island patterns. When the conductive barrier layers 174, the conductive layers 176, and the insulation layers around the conductive barrier layers 174 and the conductive layers 176 are etched to form the plurality of conductive landing pads LP, a portion of the upper insulation fence 154, a portion of the plurality of lower insulation capping patterns 136L, a portion of the plurality of lower insulation fences 144L, and a portion of each of the plurality of insulation spacers SPC1 may also be removed around the plurality of conductive landing pads LP, and thus the insulation spaces 180S exposing the sidewalls of the plurality of conductive landing pad LP may be provided around the plurality of conductive landing pads LP. According to some example embodiments, a distance D1 between two conductive landing pads LP adjacent to each other in the Y direction from among the plurality of conductive landing pads LP may be less than a distance D2 between two conductive landing pads LP adjacent to each other in the X direction from among the plurality of conductive landing pads LP. Accordingly, a depth (see (a-2) of FIG. 6H) of an insulation space 180S between the two conductive landing pads LP adjacent to each other in the Y direction may be less than a depth (see (a) of FIG. 4Q) of an insulation space 180S between the two conductive landing pads LP adjacent to each other in the X direction.

The insulation spaces 180S around the plurality of conductive landing pads LP may be filled with the insulation layer 180 and electrically insulate the plurality of conductive landing pads LP from each other. A width of the insulation layer 180 in the Y direction may be smaller than a width of the insulation layer 180 in the X direction. The lower surface level of the insulation layer 180 may vary according to locations on the substrate 110. According to some embodiments, as illustrated in FIG. 6H, a level of a lower surface of portions of the insulation layer 180 that vertically overlap the plurality of lower insulation fences 144L may be higher than that of a lower surface of portions of the insulation layer 180 that vertically overlap the plurality of conductive plugs 160.

Thereafter, a plurality of capacitor lower electrodes capable of being electrically connected to the plurality of conductive landing pads LP may be formed on the insulation layer 180.

According to some example embodiments, after the plurality of conductive landing pads LP are formed and before the insulation spaces 180S are filled with the insulation layer 180, respective portions of the plurality of insulation spacers SPC1, for example, the plurality of first insulation spacers 142A, may be removed via wet etching, and thus at least a portion of each of the plurality of first insulation spacers 142A may be substituted with an air spacer. Thereafter, the insulation spaces 180S may be filled with the insulation layer 180 to define respective upper limits of the air spacers.

According to the method of manufacturing the IC device 100 described above with reference to FIGS. 4A through 4Q, 5A through 5D, and 6A through 6H, before the plurality of conductive plugs 160 are formed, the plurality of lower insulation capping patterns 136L and the plurality of lower insulation fences 144L are formed by removing the upper surface of each of the plurality of preliminary insulation capping patterns 136 and the plurality of preliminary insulation fences 144 by a certain thickness as described above with reference to FIGS. 4K and 6B, and the upper insulation fence 154 having an integrated mesh structure covering the plurality of lower insulation capping patterns 136L and the plurality of lower insulation fences 144L is formed as described above with reference to FIGS. 4O and 6F. Because the upper insulation fence 154 includes the plurality of holes 154H each having a greater width in the horizontal direction than each of the plurality of contact spaces CS, a forming process of the plurality of conductive plugs 160, a forming process of the plurality of metal silicide layers 172, and a forming process of the plurality of conductive landing pads LP may be smoothly performed, and conductive layers having an excellent buried structure may be formed. Accordingly, the plurality of conductive plugs 160, the plurality of metal silicide layers 172, and the plurality of conductive landing pads LP may contribute to lowering contact resistance.

FIGS. 7A through 7D are cross-sectional views for explaining a method of manufacturing an IC device according to other example embodiments of the inventive concept. FIGS. 7A through 7D illustrate some components of portions corresponding to the cross-sections (a-1) and (a-2) of FIGS. 6A through 6H according to sequential processes. The same reference characters and numerals in FIGS. 7A through 7D as those in FIGS. 6A through 6H denote the same elements, and thus their description will be omitted herein.

Referring to FIG. 7A, processes as described above with reference to FIGS. 4A through 4J are performed. However, in the present embodiment, when a plurality of holes are formed by etching the plurality of sacrificial layers 330 according to a similar method to that described above with reference to FIG. 4J, the inclined sidewalls 330W may be formed on the plurality of sacrificial layers 330. Thereafter, a plurality of preliminary insulation fences 444 may be formed within the plurality of holes defined by the inclined sidewalls 330W of the sacrificial layers 330. The plurality of preliminary insulation fences 444 may have inclined sidewalls 444SW that face the inclined sidewalls 330W of the plurality of sacrificial layers 330. The plurality of preliminary insulation fences 444 may each have a shape in which a width in the Y direction gradually increases in a direction away from the substrate 110 in the Z direction. A detailed structure of the plurality of preliminary insulation fences 444 is mostly the same as that the above-described detailed structure of the plurality of preliminary insulation fences 144.

Figure 7B:
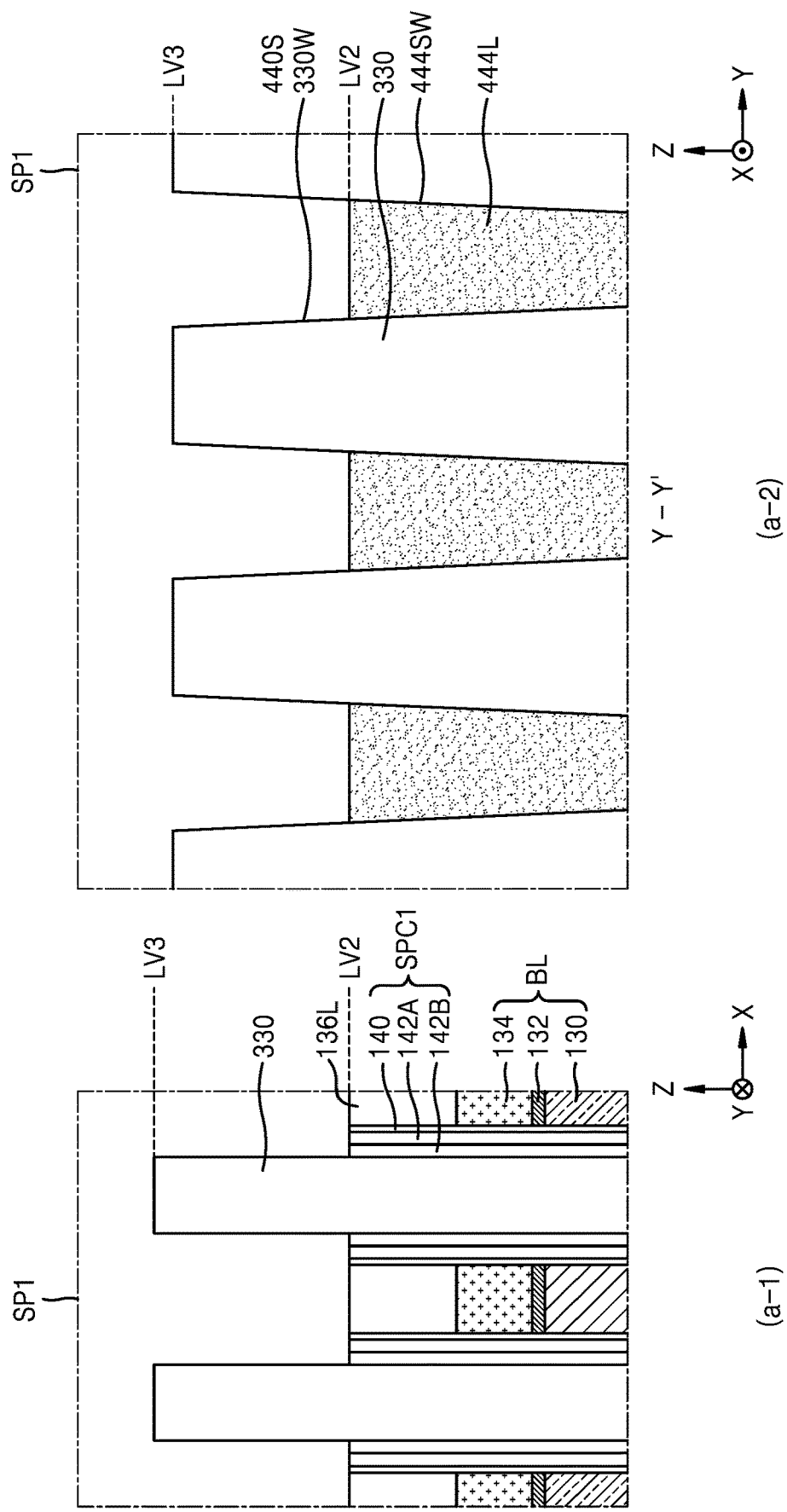

Referring to FIG. 7B, according to a similar method to that described above with reference to FIG. 4K, the plurality of preliminary insulation capping patterns 136, the plurality of insulation spacers SPC1, and the plurality of preliminary insulation fences 444 around the plurality of sacrificial layers 330 are removed by a certain thickness from respective upper surfaces thereof to thereby form the plurality of lower insulation capping patterns 136L and a plurality of lower insulation fences 444L. At this time, an upper portion having a relatively greater width in the Y direction from each of the plurality of preliminary insulation fences 444 of FIG. 7A may be partially removed, and a lower portion having a relatively smaller width in the Y direction from each of the plurality of preliminary insulation fences 444 of FIG. 7A may remain to serve as each of the plurality of lower insulation fences 444L.

Figure 7C:
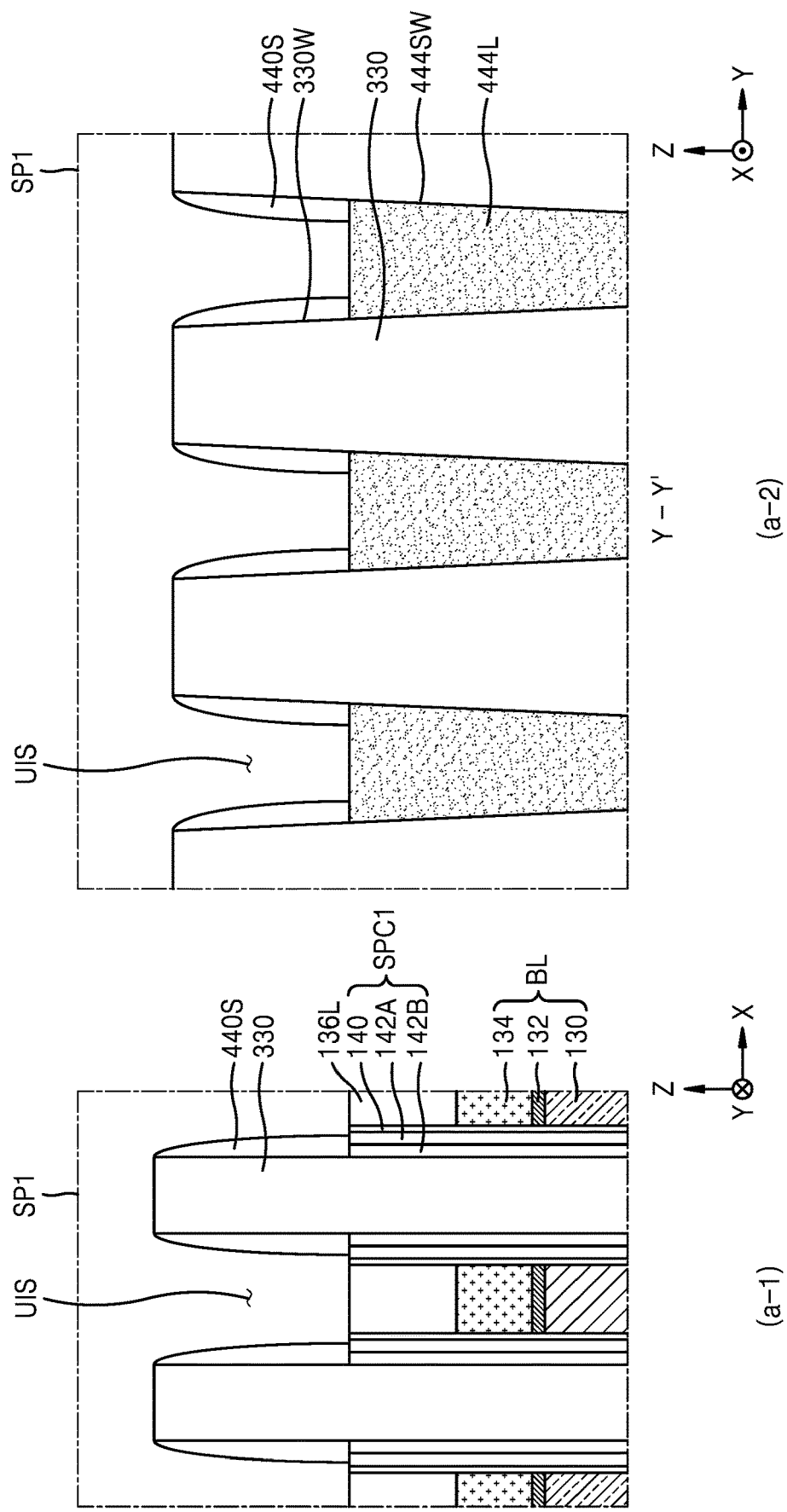

Referring to FIG. 7C, a plurality of sacrificial spacers 440S covering respective upper sidewalls of the plurality of sacrificial layers 330 are formed by performing similar processes to those described above with reference to FIGS. 4L and 4M with respect to a resultant structure of FIG. 7B. The plurality of sacrificial spacers 440S may have mostly the same structure as that of the plurality of sacrificial spacers 340S described above with reference to FIG. 3M.

Figure 7D:
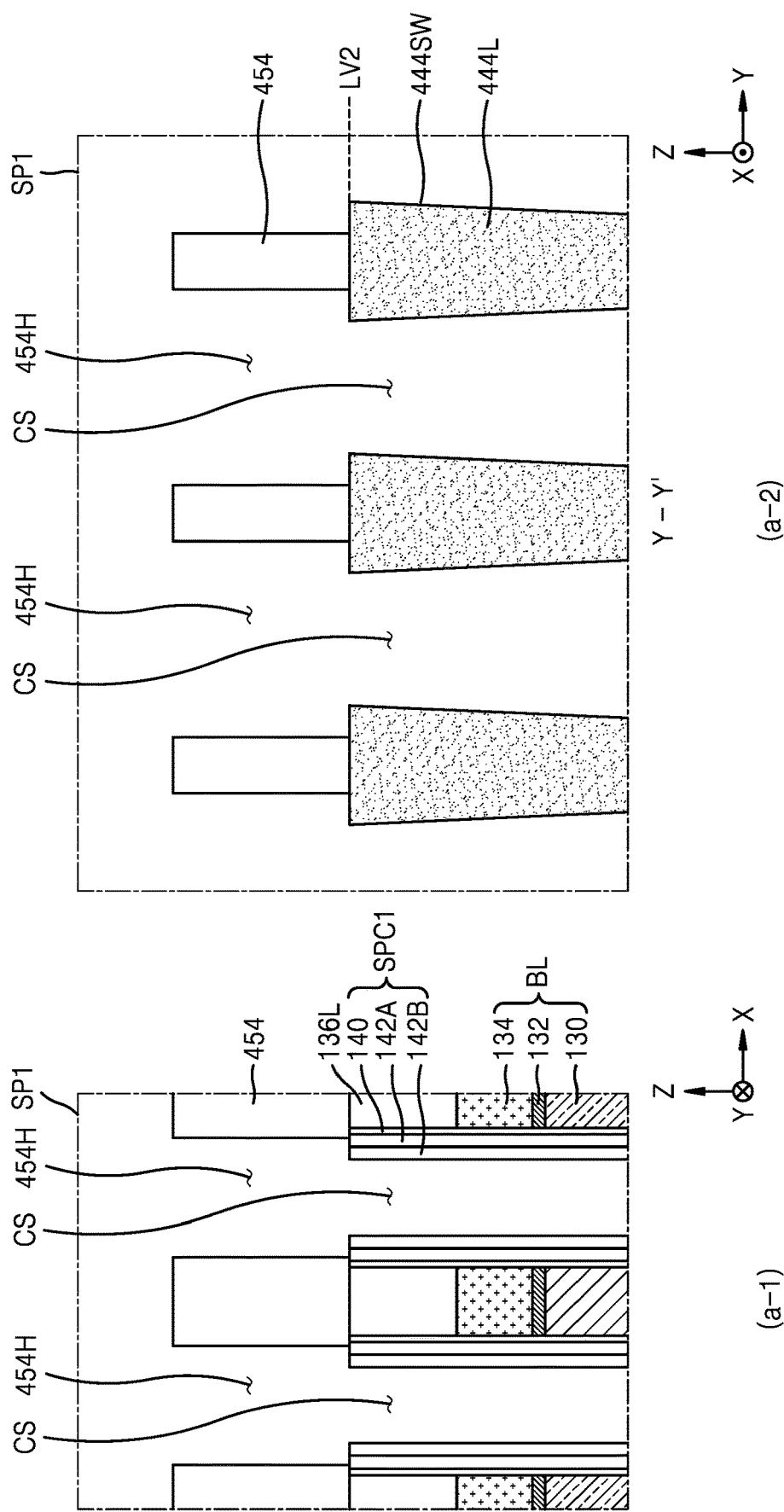

Referring to FIG. 7D, similar to the description given above with reference to FIGS. 4N and 4O, the plurality of contact spaces CS are formed on the substrate 110 by selectively removing the plurality of sacrificial layers 330 and the plurality of sacrificial spacers 440S, and an upper insulation fence 454 is formed to cover upper surfaces of the plurality of lower insulation capping patterns 136L and upper surfaces of the plurality of lower insulation fences 444L. The upper insulation fence 454 may have a mesh structure along a plane (for example, an X-Y plane). A detailed structure of the upper insulation fence 454 is mostly the same as that of the upper insulation fence 154 described above with reference to FIG. 4N.

Figure 9:
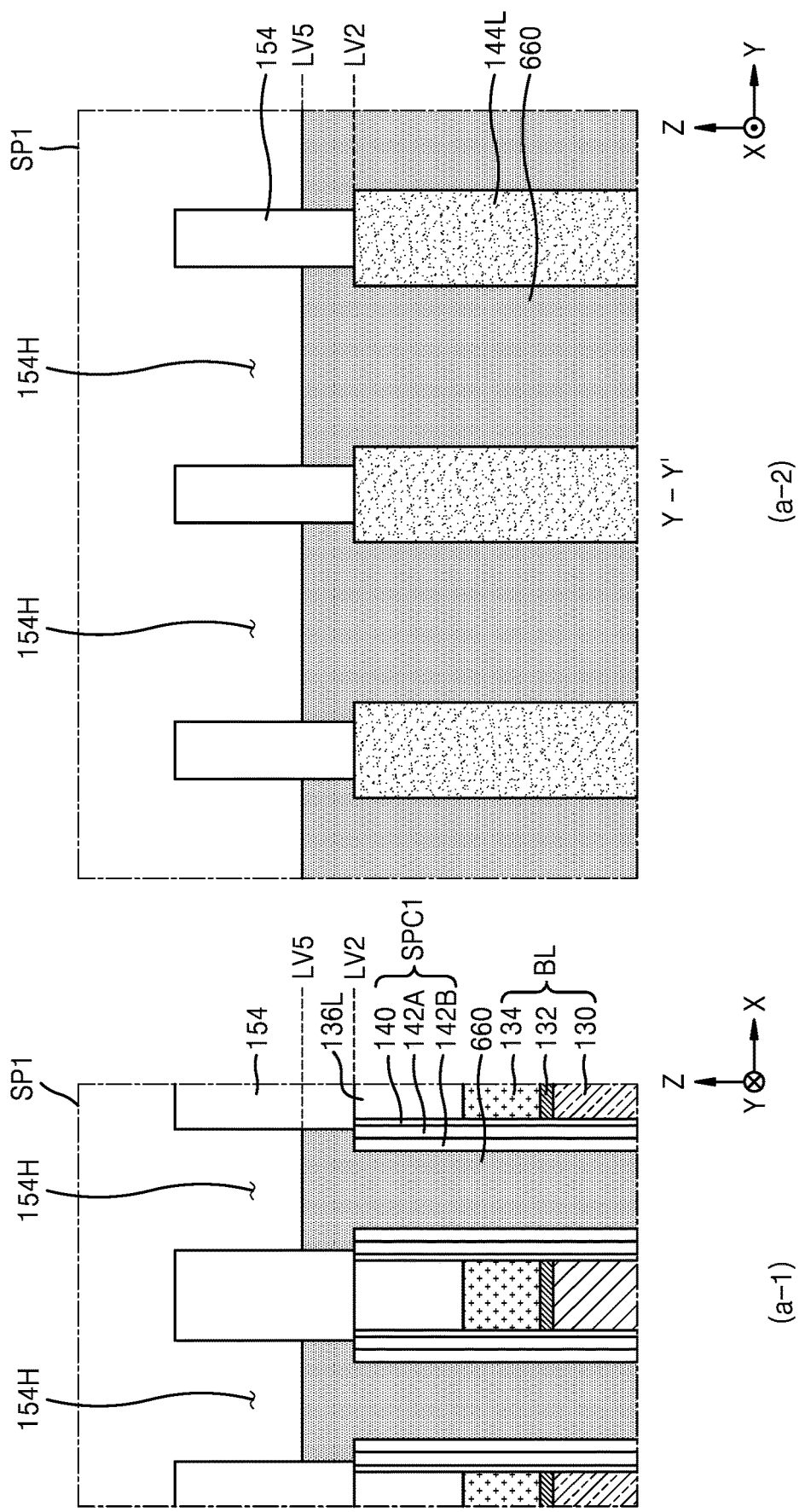

FIGS. 8 and 9 are cross-sectional views for explaining methods of manufacturing IC devices according to other example embodiments of the inventive concept. FIGS. 8 and 9 illustrate some components of portions corresponding to the cross-sections (a-1) and (a-2) of FIGS. 6A through 6H. The same reference characters and numerals in FIGS. 8 and 9 as those in FIGS. 6A through 6H denote the same elements, and thus their description will be omitted herein.

Referring to FIG. 8, the plurality of conductive plugs 560 may be formed instead of the plurality of conductive plugs 160 described above with reference to FIGS. 4P and 6G. An upper surface level LV4 of each of the plurality of conductive plugs 560 may approach an upper surface level LV2 of each of the plurality of lower insulation capping patterns 136L and the plurality of lower insulation fences 144L. For example, the upper surface level LV4 may be the same as or similar as or to the upper surface level LV2 or may be slightly lower than the upper surface level LV2. Accordingly, when the plurality of metal silicide layers 172 are formed on the plurality of conductive plugs 560 as described above with reference to FIGS. 4Q and 6H, the plurality of metal silicide layers 172 may be formed on a level close to the upper surface level LV2.

Because the respective upper surfaces of the plurality of conductive plugs 560 are adjacent to the holes 154H of the upper insulation fence 154 each having a relatively large width in the horizontal direction, a process of forming the plurality of metal silicide layers 172 and a process of forming the plurality of conductive landing pads LP as described above with reference to FIGS. 4Q and 6H may be smoothly performed.

Referring to FIG. 9, the plurality of conductive plugs 660 may be formed instead of the plurality of conductive plugs 160 described above with reference to FIGS. 4P and 6G. An upper surface level LV5 of each of the plurality of conductive plugs 660 may be higher than the upper surface level LV2 of each of the plurality of lower insulation capping patterns 136L and the plurality of lower insulation fences 144L. Accordingly, the respective upper surfaces of the plurality of conductive plugs 660 may be arranged within the holes 154H of the upper insulation fence 154 each having a relatively large width in the horizontal direction. Therefore, a process of forming the plurality of metal silicide layers 172 and a process of forming the plurality of conductive landing pads LP as described above with reference to FIGS. 4Q and 6H may be smoothly performed.

The inventive concept is not limited to the formation of the plurality of conductive plugs 160 illustrated in FIGS. 4P and 6Q, the formation of the plurality of conductive plugs 560 illustrated in FIG. 8, or the formation of the plurality of conductive plugs 660 illustrated in FIG. 9. For example, an upper surface level of each of a plurality of conductive plugs may be selected variously within the plurality of contact spaces CS and the plurality of holes 154H, which communicate with the plurality of contact spaces CS, illustrated in FIGS. 4O and 6F.

FIGS. 10A through 10E are cross-sectional views for explaining a method of manufacturing an IC device according to other example embodiments of the inventive concept. FIGS. 10A through 10E illustrate some components of portions corresponding to the cross-sections (a-1) and (a-2) of FIGS. 6A through 6H. The same reference characters and numerals in FIGS. 10A through 10E as those in FIGS. 6A through 6H denote the same elements, and thus their description will be omitted herein.

Figure 10A:
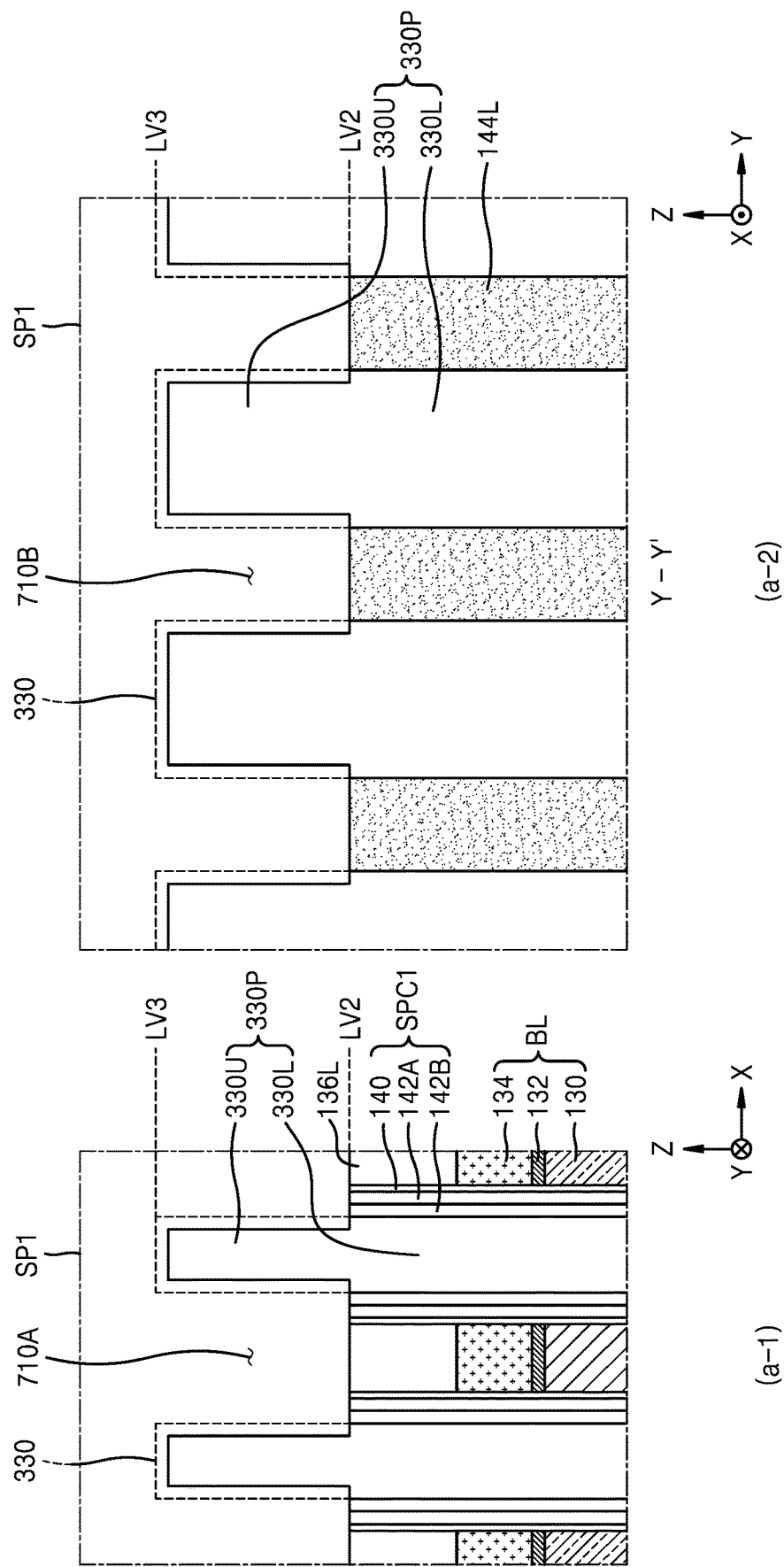

Referring to FIG. 10A, after a process of forming the plurality of preliminary insulation fences 144 is performed according to the same method as that described above with reference to FIGS. 4J and 6A, the plurality of preliminary insulation capping patterns 136 and the plurality of preliminary insulation fences 144 around the plurality of sacrificial layers 330 are removed by a certain thickness from respective upper surfaces thereof according to the same description given above with reference to FIGS. 4K and 6B, to thereby form the plurality of lower insulation capping patterns 136L and the plurality of lower insulation fences 144L.

Thereafter, a plurality of sacrificial patterns 330P are formed by reducing a width in the horizontal direction of an upper portion 330U of each of the plurality of sacrificial layers 330, the upper portion 330U protruding higher than the plurality of lower insulation capping patterns 136L and the plurality of lower insulation fences 144L. To reduce the width of the upper portion 330U of each of the plurality of sacrificial layers 330, a portion of a surface of the upper portion 330U may be selectively isotropically-etched. The width in the horizontal direction (e.g., the X and Y directions) of the upper portion 330U of each of the plurality of sacrificial patterns 330P is less than that of a lower portion 330L of each of the plurality of sacrificial patterns 330P. In FIG. 10A, the plurality of sacrificial patterns 330P are marked by dashed lines for better understanding.

After the plurality of sacrificial patterns 330P are formed, a first upper insulation space 710A may be defined on each of the plurality of lower insulation capping patterns 136L by the plurality of sacrificial patterns 330P, and a second upper insulation space 710B may be defined on each of the plurality of lower insulation fences 144L by the plurality of sacrificial patterns 330P. The plurality of first upper insulation spaces 710A may communicate with the plurality of second upper insulation space 710B. A width in the X direction of each first upper insulation space 710A may be greater than a width in the X direction of each lower insulation capping patterns 136L, and a width in the Y direction of each second upper insulation space 710B may be greater than a width in the Y direction of each lower insulation fence 144L.

Figure 10B:
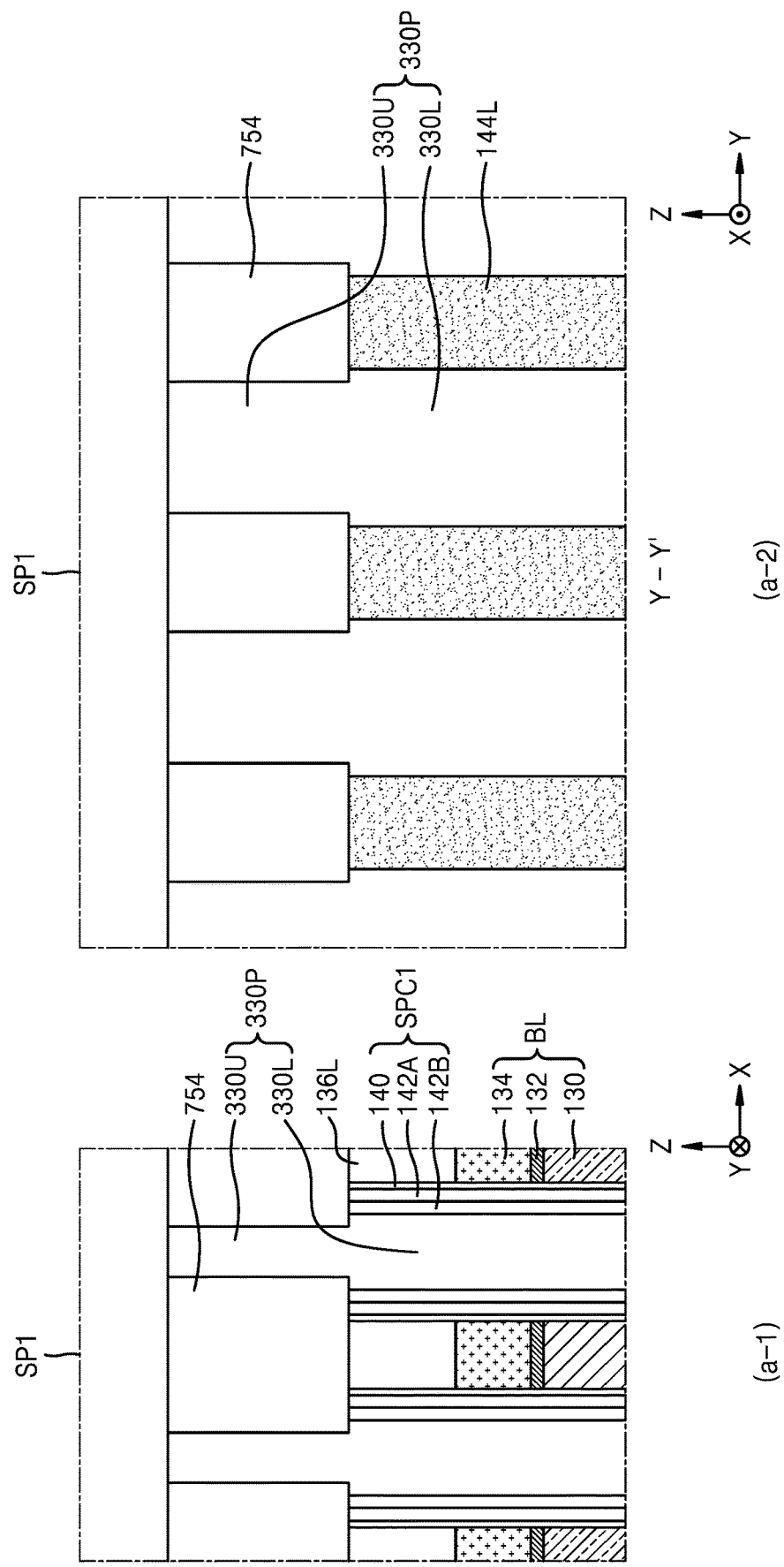

Referring to FIG. 10B, an upper insulation fence 754 is formed on a resultant structure of FIG. 10A to fill the plurality of first upper insulation spaces 710A and the plurality of second upper insulation spaces 710B.

The upper insulation fence 754 may be formed using a similar process to the process of forming the upper insulation fence 154 described above with reference to FIGS. 4N and 6E. A detailed structure of the upper insulation fence 754 is mostly the same as the above-described detailed structure of the upper insulation fence 154. However, the upper insulation fence 754 may have a larger width in the X direction than each of the lower insulation capping patterns 136L and a larger width in the Y direction than each of the lower insulation fences 144L.

Referring to FIG. 10C, a plurality of contact spaces CS2 are formed on the substrate 110 by selectively removing the plurality of sacrificial patterns 330P from a resultant structure of FIG. 10B by using a similar method to that described above with reference to FIGS. 4O and 6F. The upper insulation fence 754 may have a plurality of holes 754H communicating with the plurality of contact spaces CS2, and may form a mesh structure along a plane (for example, a X-Y plane). In the horizontal direction (for example, the X direction or the Y direction), a width of each of the plurality of holes 754H formed in the upper insulation fence 754 may be less than that of each of the plurality of conductive spaces CS2.

Figure 10D:
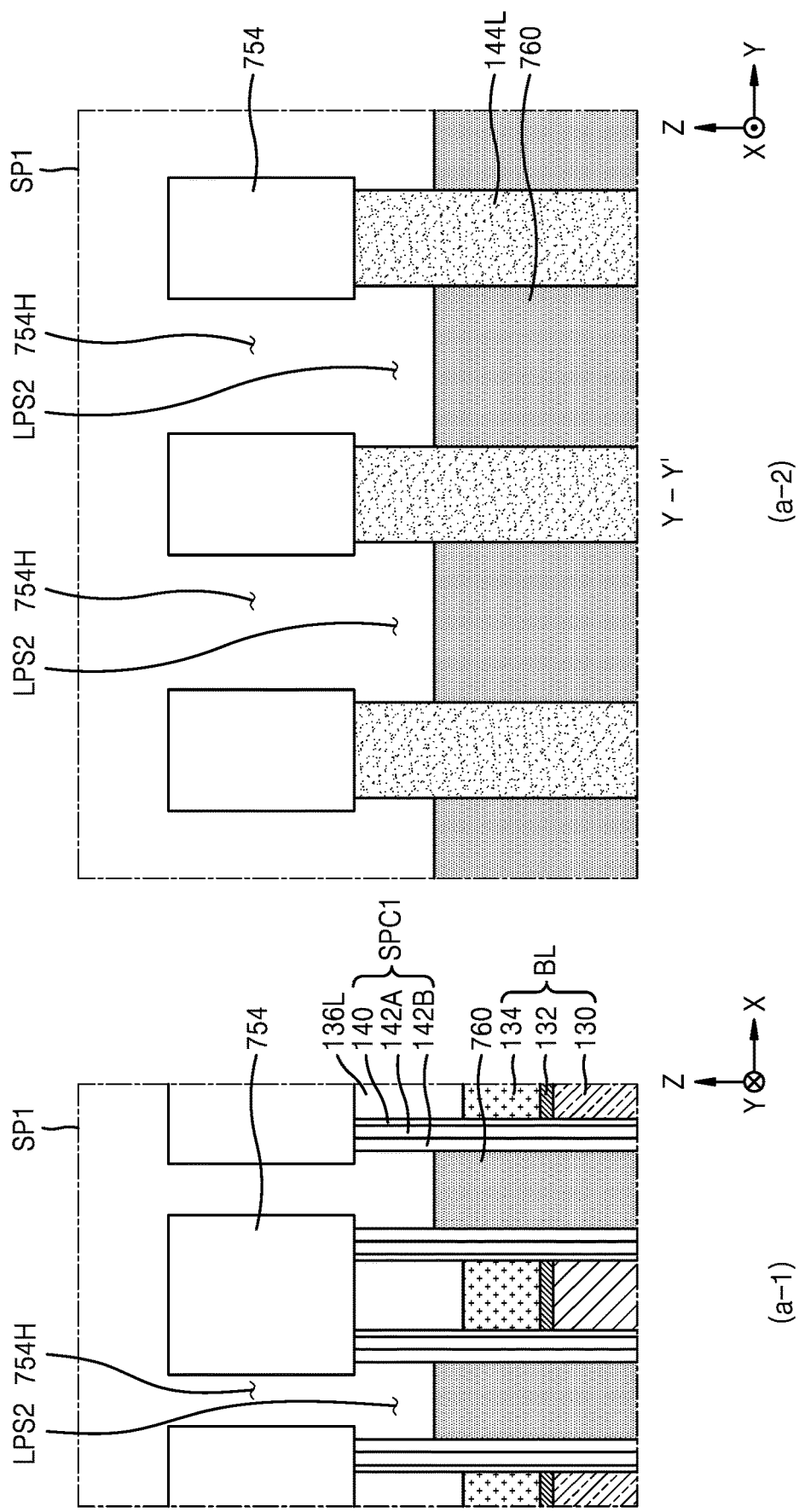

Referring to FIG. 10D, according to a similar method to the method of forming the plurality of conductive plugs 160 described above with reference to FIGS. 4P and 6G, the plurality of conductive plugs 760 are formed between the plurality of bit lines BL in a resultant structure of FIG. 10C.

After the plurality of conductive plugs 760 are formed, a landing pad space LPS2 may remain on an upper surface of each of the plurality of conductive plugs 760. The plurality of holes 754H formed in the upper insulation fence 754 may communicate with the plurality of landing pad spaces LPS2. The plurality of conductive plugs 760 may include doped polysilicon.

Although FIG. 10D illustrates a case where an upper surface level of each of the plurality of conductive plugs 760 is lower than an upper surface level of each of the plurality of lower insulation capping patterns 136L and the plurality of lower insulation fences 144L, the inventive concept is not limited thereto. For example, similar to the descriptions of the upper surface level of the plurality of conductive plugs 560 and the upper surface level of the plurality of conductive plugs 660 given above with reference to FIGS. 8 and 9, the upper surface level of the plurality of conductive plugs 760 may vary.

Referring to FIG. 10E, in a similar method to that described above with reference to FIGS. 4Q and 6H, a plurality of metal silicide layers 772 are formed on the plurality of conductive plugs 760 exposed via the plurality of holes 754H (see FIG. 10D) formed in the upper insulation fence 754, a plurality of conductive landing pads LP2 are formed on the plurality of metal silicide layers 772 to fill the plurality of landing pad spaces LPS2 and the plurality of holes 754H, and an insulation layer 780 is formed to fill insulation spaces 780S around the plurality of conductive landing pads LP2. Each of the plurality of conductive landing pads LP2 may include a conductive barrier layer 774 and a conductive layer 776.

Detailed structures of the plurality of metal silicide layers 772, the plurality of conductive landing pads LP2, and the insulation layer 780 are mostly the same as the above-described detailed structures of the plurality of metal silicide layers 172, the plurality of conductive landing pads LP, and the insulation layer 180. A lower surface level of the insulation layer 780 may vary according to locations on the substrate 110. According to some embodiments, a level of a lower surface of portions of the insulation layer 780 that vertically overlap the plurality of lower insulation fences 144L may be higher than that of a lower surface of portions of the insulation layer 780 that vertically overlap the plurality of conductive plugs 760.

Thereafter, a plurality of capacitor lower electrodes capable of being electrically connected to the plurality of conductive landing pads LP2 may be formed on the insulation layer 780.

According to the method of manufacturing the IC device 200 described above with reference to FIGS. 10A through 10E, when the plurality of conductive landing pads LP2 occupying a relatively large area are formed within a limited area due to high integration of IC devices, even when a distance between the plurality of conductive landing pads LP2 decreases, a sufficient insulation distance may be secured between the plurality of conductive landing pads LP2 by the upper insulation fence 754. Accordingly, the reliability of the IC device 200 may improve.

While the inventive concept has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit (IC) device comprising:
a line structure comprising a conductive line formed on a substrate and a lower insulation capping pattern that covers the conductive line;
an insulation spacer covering a sidewall of the line structure;
a conductive plug spaced apart from the conductive line in a first horizontal direction with the insulation spacer between the conductive plug and the conductive line;
a lower insulation fence spaced apart from the conductive line in the first horizontal direction with the insulation spacer between the lower insulation fence and the conductive line, the lower insulation fence having a sidewall that contacts the conductive plug; and
an upper insulation fence comprising a first portion covering an upper surface of the lower insulation capping pattern and a second portion covering an upper surface of the lower insulation fence, wherein a width of the second portion in a second horizontal direction perpendicular to the first horizontal direction is different from a width of the lower insulation fence in the second horizontal direction,
wherein the width of the second portion of the upper insulation fence in the second horizontal direction is less than the width of the lower insulation fence in the second horizontal direction.

2. The IC device of claim 1, wherein the width of the second portion of the upper insulation fence in the second horizontal direction is greater than the width of the lower insulation fence in the second horizontal direction.

3. The IC device of claim 1, wherein the lower insulation fence and the upper insulation fence are formed of a same material.

4. The IC device of claim 1, wherein the lower insulation fence and the upper insulation fence are formed of different materials.

5. The IC device of claim 1, wherein a level of an upper surface of the conductive plug is lower than a level of an interface between the lower insulation fence and the upper insulation fence.

6. The IC device of claim 1, wherein a level of an upper surface of the conductive plug is higher than a level of an interface between the lower insulation fence and the upper insulation fence.

7. The IC device of claim 1, further comprising:
a conductive landing pad arranged on the conductive plug to vertically overlap the conductive plug,
wherein the conductive landing pad comprises a portion that is surrounded by the upper insulation fence.

8. The IC device of claim 7, wherein the conductive landing pad comprises a portion that covers an upper surface of the upper insulation fence.

9. An integrated circuit (IC) device comprising:
a pair of line structures comprising a pair of conductive lines extending parallel to each other on a substrate and being adjacent to each other in a first horizontal direction and a pair of lower insulation capping patterns covering the pair of conductive lines;
a plurality of conductive plugs interposed between the pair of line structures;
a plurality of lower insulation fences alternating with the plurality of conductive plugs between the pair of conductive lines such that one lower insulation fence is between two adjacent conductive plugs; and
an upper insulation fence having a mesh structure that contacts an upper surface of each of the pair of lower insulation capping patterns and an upper surface of each of the plurality of lower insulation fences.

10. The IC device of claim 9, wherein a width of portions of the upper insulation fence that contact the plurality of lower insulation fences is smaller than a width of the lower insulation fence in a second horizontal direction perpendicular to the first horizontal direction.

11. The IC device of claim 9,
wherein the upper insulation fence comprises a plurality of holes formed at locations respectively corresponding to the plurality of conductive plugs, and
wherein a width of each of the plurality of holes in a second horizontal direction perpendicular to the first horizontal direction is greater than a width of each of the plurality of conductive plugs in the second horizontal direction.

12. The IC device of claim 11, further comprising:
a plurality of metal silicide layers covering respective upper surfaces of the plurality of conductive plugs; and
a plurality of conductive landing pads contacting the plurality of metal silicide layers and each extending in a vertical direction through the plurality of holes.

13. The IC device of claim 12,
wherein each of the plurality of conductive landing pads comprises a first portion interposed between two adjacent lower insulation fences from among the plurality of lower insulation fences, and a second portion that penetrates through one hole selected from among the plurality of holes, and
wherein a width of the second portion in the second horizontal direction is greater than a width of the first portion in the second horizontal direction.

14. The IC device of claim 9, wherein interfaces between the pair of lower insulation capping patterns and the upper insulation fence, and interfaces between the plurality of lower insulation fences and the upper insulation fence each extend on substantially the same horizontal level.

15. An integrated circuit (IC) device comprising:
a plurality of conductive lines extending parallel to each other on a substrate;
a plurality of lower insulation capping patterns covering the plurality of conductive lines;
a plurality of conductive plugs interposed between the plurality of conductive lines such that one conductive plug is between two adjacent conductive lines;
a plurality of conductive landing pads formed on the plurality of conductive plugs;
a plurality of lower insulation fences interposed between the plurality of conductive lines such that one lower insulation fence is between two adjacent conductive lines, the plurality of lower insulation fences comprising sidewalls that contact respective sidewalls of the plurality of conductive plugs; and
an upper insulation fence having a mesh structure that covers the plurality of lower insulation capping patterns and the plurality of lower insulation fences, and comprising a plurality of holes through which the plurality of conductive landing pads penetrate.

16. The IC device of claim 15, wherein, in a direction parallel to a direction in which each of the plurality of conductive lines extends lengthwise, a width of portions of the upper insulation fence that cover the plurality of lower insulation fences is less than a width of each of the plurality of lower insulation fences.

17. The IC device of claim 15, wherein, in a direction parallel to a direction in which each of the plurality of conductive lines extends, a width of portions of the upper insulation fence that cover the plurality of lower insulation fences is greater than a width of each of the plurality of lower insulation fences.

18. The IC device of claim 15, wherein the upper insulation fence is formed of the same material as a material included in at least one of the plurality of lower insulation capping patterns and the plurality of lower insulation fences.

19. The IC device of claim 15, wherein the upper insulation fence is formed of a material different from a material that forms at least one of the plurality of lower insulation capping patterns and the plurality of lower insulation fences.

* * * * *